US010756110B1

(12) United States Patent
Sharangpani et al.

(10) Patent No.: US 10,756,110 B1
(45) Date of Patent: Aug. 25, 2020

(54) METHOD OF FORMING SEAMLESS DRAIN-SELECT-LEVEL ELECTRODES FOR A THREE-DIMENSIONAL MEMORY DEVICE AND STRUCTURES FORMED BY THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Adarsh Rajashekhar, Santa Clara, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/380,362

(22) Filed: Apr. 10, 2019

(51) Int. Cl.
*H01L 27/11582* (2017.01)
*H01L 27/11524* (2017.01)
(Continued)

(52) U.S. Cl.
CPC .. *H01L 27/11582* (2013.01); *H01L 21/76802* (2013.01); *H01L 21/76843* (2013.01); *H01L 21/76865* (2013.01); *H01L 21/76876* (2013.01); *H01L 21/76879* (2013.01); *H01L 23/5226* (2013.01); *H01L 27/1157* (2013.01); *H01L 27/11524* (2013.01); *H01L 27/11556* (2013.01)

(58) Field of Classification Search
CPC ................................................ H01L 27/11582
See application file for complete search history.

(56) References Cited

U.S. PATENT DOCUMENTS 5,422,302 A * 6/1995 Yonehara ............ H01L 21/8221
117/913
5,915,167 A 6/1999 Leedy
(Continued)

FOREIGN PATENT DOCUMENTS

WO WO2019018050 A1 1/2019

OTHER PUBLICATIONS

U.S. Appl. No. 15/888,714, filed Feb. 5, 2018, SanDisk Technologies LLC.
(Continued)

*Primary Examiner* — Peniel M Gumedzoe
*Assistant Examiner* — Christopher A Johnson
(74) *Attorney, Agent, or Firm* — The Marbury Law Group PLLC

(57) ABSTRACT

Memory pillar structures extending through an alternating stack of insulating layers and word-line-level electrically conductive layers are formed over a substrate. Each of the memory pillar structures includes a vertical semiconductor channel and a memory film. Each of the memory pillar structures protrudes above an insulating cap layer located above the alternating stack to provide an inter-pillar gap region that laterally extends between laterally-neighboring pairs of the memory pillar structures. A metal-nucleating material having a physically exposed metal-nucleating surface is formed at a bottom of the inter-pillar gap region without covering upper portions of sidewalls of the memory pillar structures. A metal may be selectively grown upward from the physically exposed metal-nucleating surface while suppressing growth of the metal from physically exposed vertical surfaces around the memory pillar structures. A metal layer without a seam may be provided, which may be used for a drain-select-level electrically conductive layer.

15 Claims, 59 Drawing Sheets

(51) Int. Cl.
    *H01L 27/11556*   (2017.01)
    *H01L 27/1157*   (2017.01)
    *H01L 23/522*   (2006.01)
    *H01L 21/768*   (2006.01)

(56) References Cited

U.S. PATENT DOCUMENTS

| | | |
|---|---|---|
| 10,050,054 B2 | 8/2018 | Zhang et al. |
| 10,083,982 B2 | 9/2018 | Shigemura et al. |
| 2014/0252363 A1* | 9/2014 | Liu .................. H01L 27/11556 257/66 |

OTHER PUBLICATIONS

U.S. Appl. No. 15/906,109, filed Feb. 27, 2018, SanDisk Technologies LLC.
U.S. Appl. No. 16/019,821, filed Jun. 27, 2018, SanDisk Technologies LLC.
U.S. Appl. No. 16/019,856, filed Jun. 27, 2018, SanDisk Technologies LLC.
U.S. Appl. No. 16/023,289, filed Jun. 29, 2018, SanDisk Technologies LLC.
U.S. Appl. No. 16/023,866, filed Jun. 29, 2018, SanDisk Technologies LLC.
U.S. Appl. No. 16/024,048, filed Jun. 29, 2018, SanDisk Technologies LLC.
U.S. Appl. No. 16/142,875, filed Sep. 26, 2018, SanDisk Technologies LLC.
U.S. Appl. No. 16/211,387, filed Dec. 6, 2018, SanDisk Technologies LLC.
U.S. Appl. No. 16/267,592, filed Feb. 5, 2019, SanDisk Technologies LLC.
U.S. Appl. No. 16/267,625, filed Feb. 5, 2019, SanDisk Technologies LLC.
U.S. Appl. No. 16/361,722, filed Mar. 22, 2019, SanDisk Technologies LLC.
Endoh et al., "Novel Ultra High Density Memory with a Stacked-Surrounding Gate Transistor (S-SGT) Structured Cell," IEDM Proc., (2001), 33-36.
Notification of Transmittal of the International Search Report and Written Opinion of the International Search Authority or International Patent Application No. PCT/US2019/068643, dated Apr. 21, 2020, 14 pages.

* cited by examiner

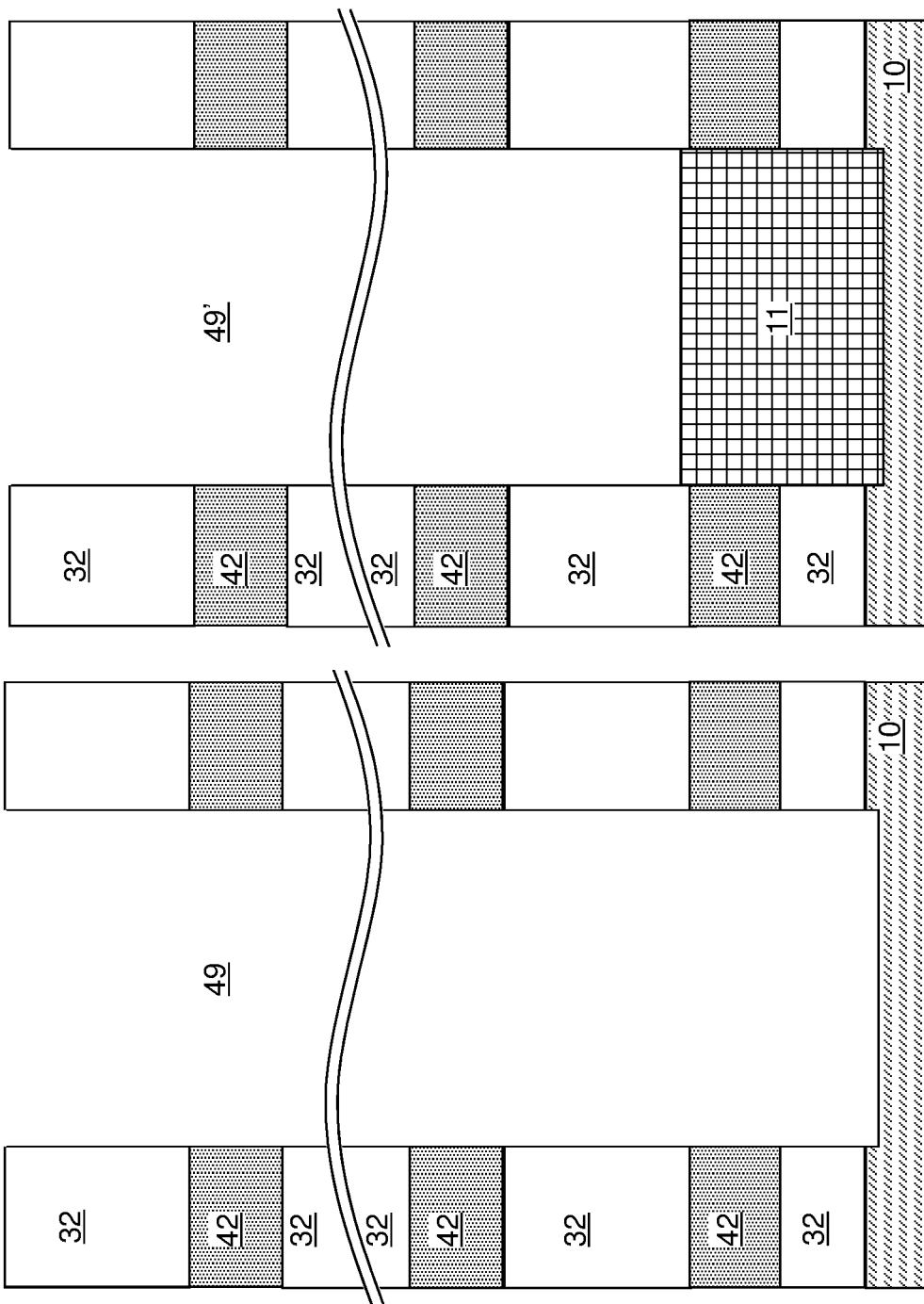

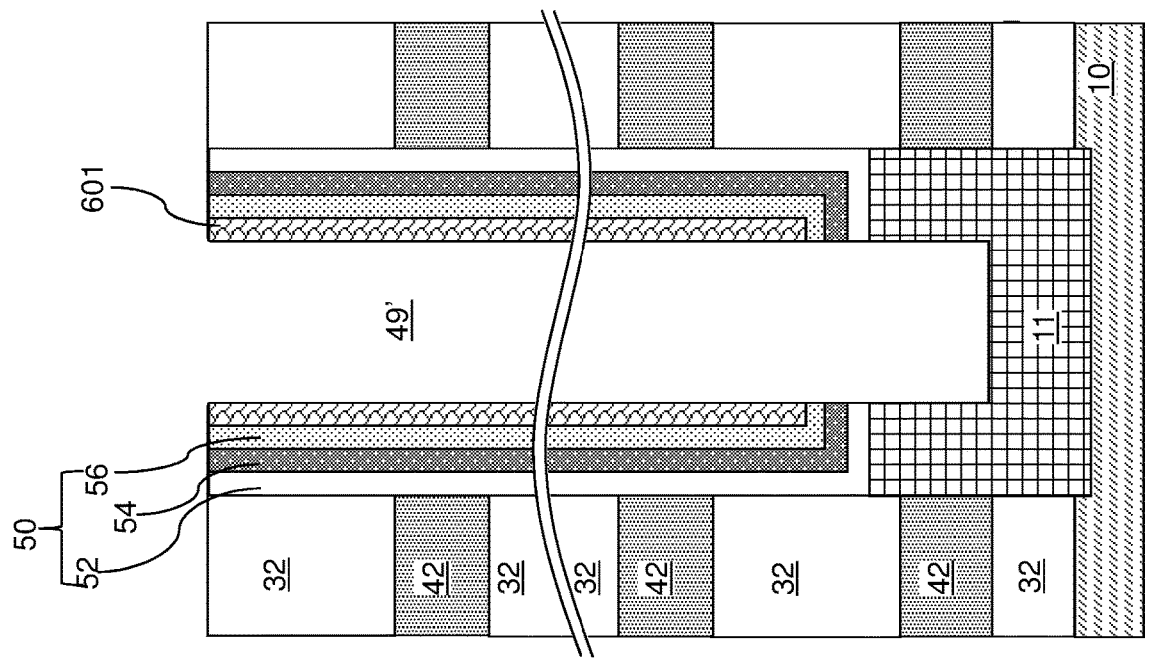
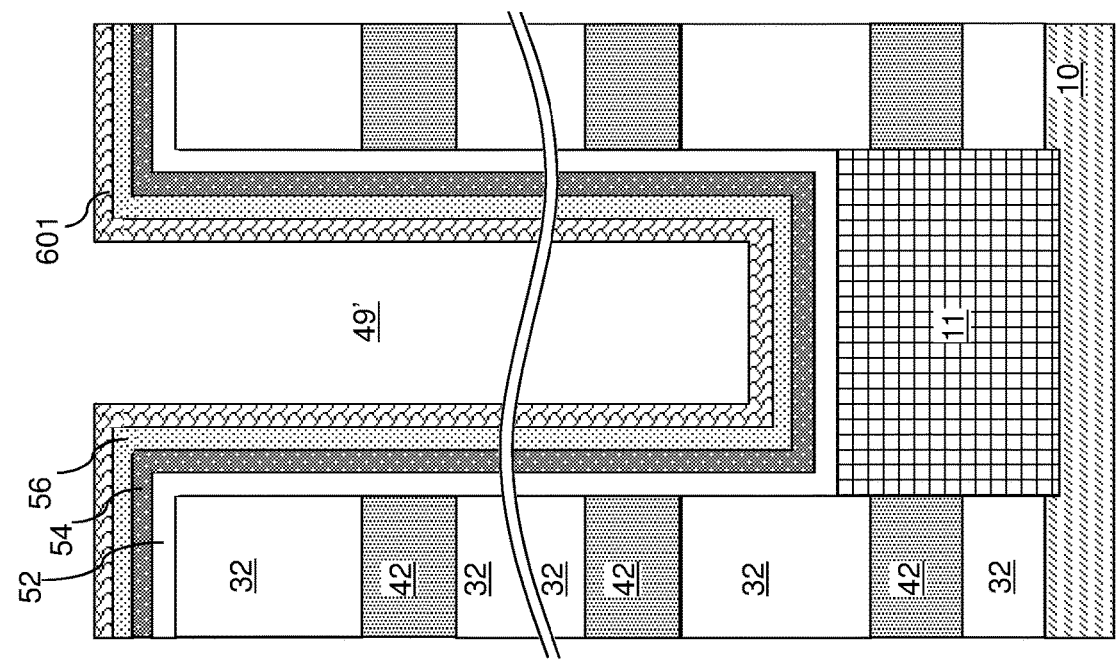
FIG. 5D
FIG. 5C

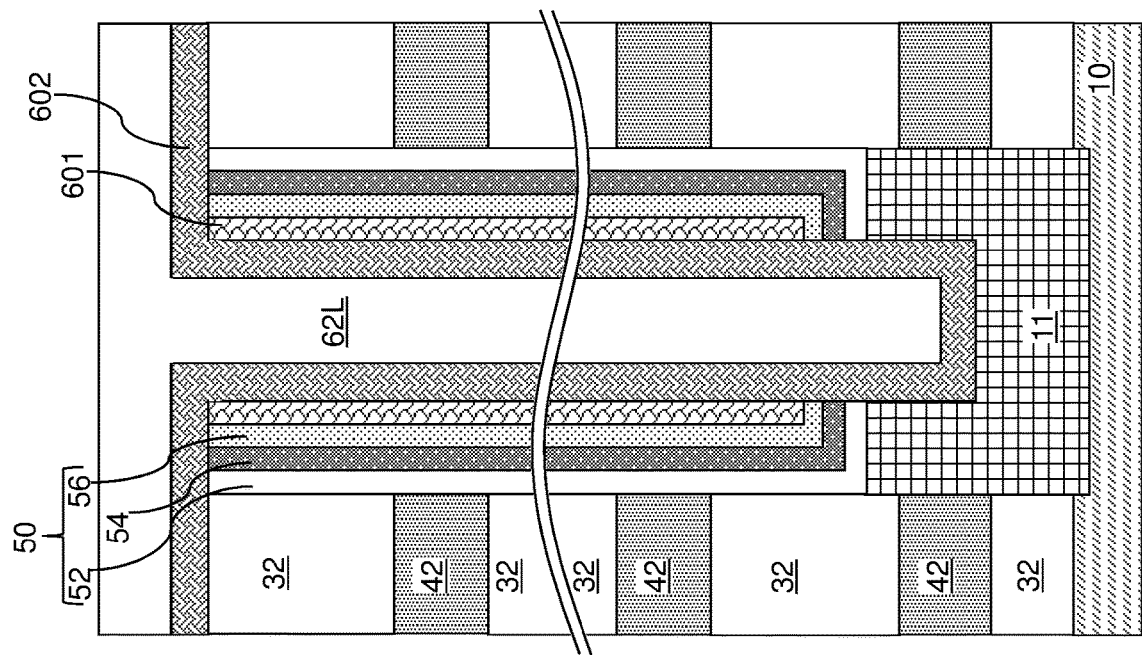
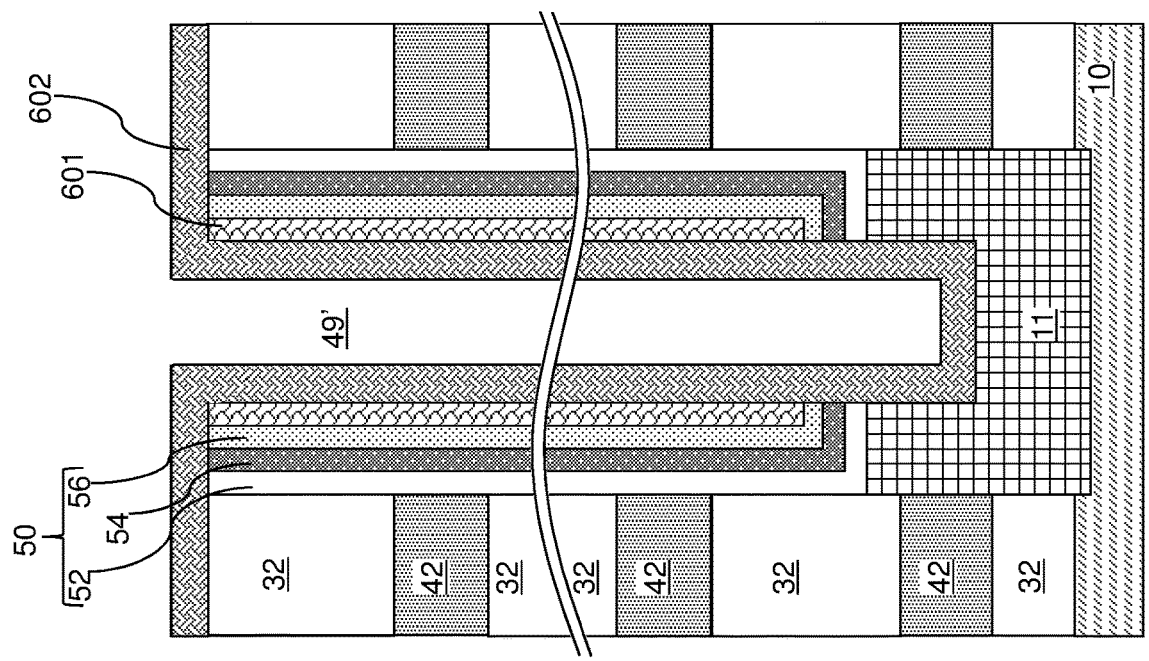

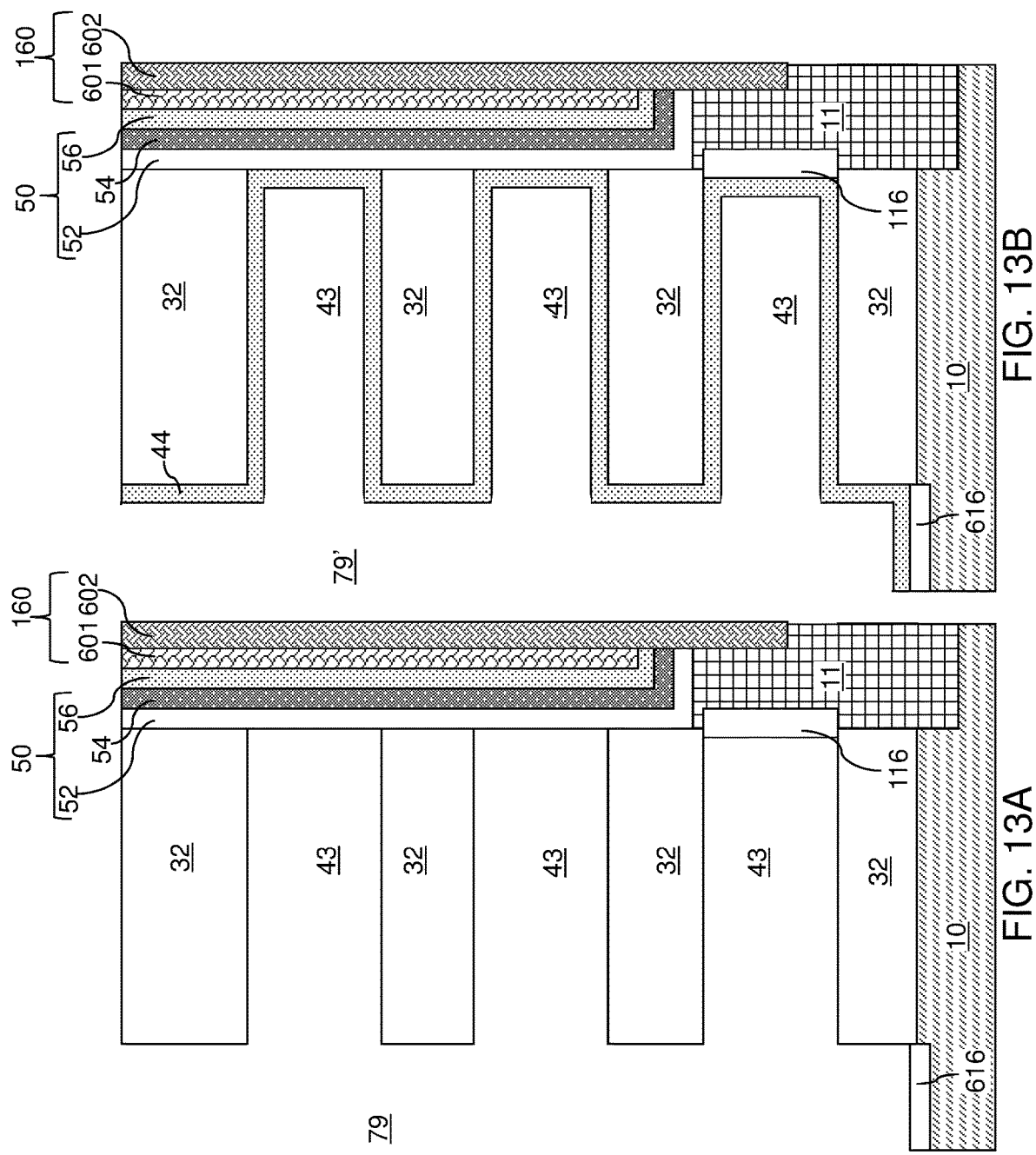

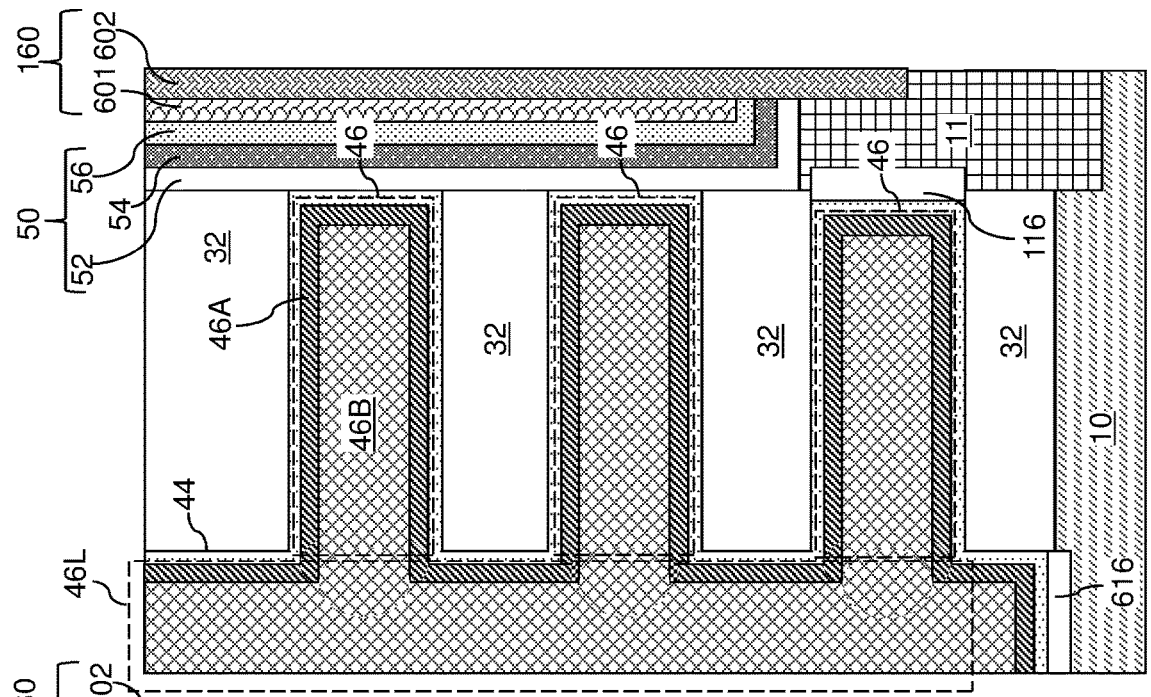
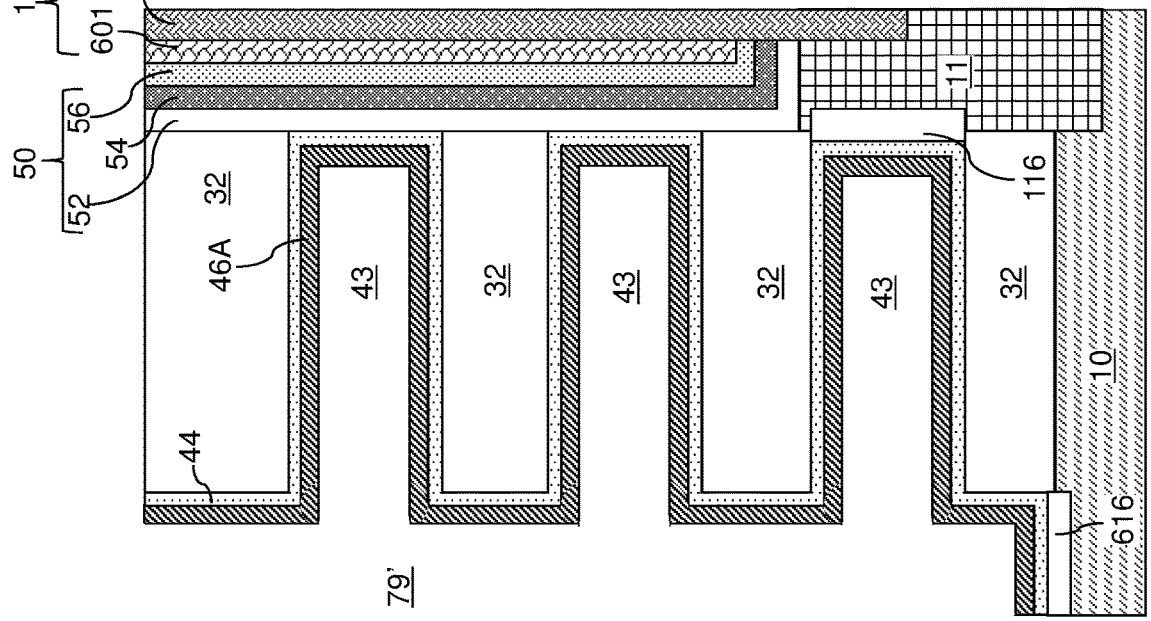
FIG. 13D
FIG. 13C

METHOD OF FORMING SEAMLESS DRAIN-SELECT-LEVEL ELECTRODES FOR A THREE-DIMENSIONAL MEMORY DEVICE AND STRUCTURES FORMED BY THE SAME

FIELD

The present disclosure relates generally to the field of semiconductor devices, and in particular, to a method of forming seamless drain-select-level electrodes for a three-dimensional memory device and structures formed by the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an embodiment of the present disclosure, a method of forming a three-dimensional memory device is provided, which comprises: forming memory pillar structures extending through an alternating stack of insulating layers and word-line-level electrically conductive layers over a substrate, wherein each of the memory pillar structures comprises a vertical semiconductor channel and a memory film in contact with the vertical semiconductor channel, and wherein each of the memory pillar structures protrudes above an insulating cap layer located above the alternating stack to provide an inter-pillar gap region that laterally extends between laterally-neighboring pairs of the memory pillar structures; providing a metal-nucleating material having a physically exposed metal-nucleating surface at a bottom of the inter-pillar gap region without covering upper portions of sidewalls of the memory pillar structures with the metal-nucleating material; and selectively growing a metal upward from the physically exposed metal-nucleating surface while suppressing growth of the metal from physically exposed vertical surfaces around the memory pillar structures.

According to another embodiment of the present disclosure, a method of forming a three-dimensional memory device is provided, which comprises: forming memory pillar structures extending through an alternating stack of insulating layers and word-line-level electrically conductive layers over a substrate, wherein each of the memory pillar structures comprises a vertical semiconductor channel and a memory film in contact with the vertical semiconductor channel, and wherein each of the memory pillar structures protrudes above an insulating cap layer located above the alternating stack to provide an inter-pillar gap region that laterally extends between laterally-neighboring pairs of the memory pillar structures; conformally depositing a metal over a bottom surface and sidewalls of the inter-pillar gap region and above top surfaces of the memory pillar structures; and forming a drain-select-level electrically conductive layer by inducing thermal migration of the metal at an elevated temperature that is lower than a melting temperature of the metal, wherein the metal is removed from above the top surfaces of the memory pillar structures, and thermally migrated portions of the metal fill a bottom portion of the inter-pillar gap region to provide a drain-select-level electrically conductive layer.

According to yet another embodiment of the present disclosure, a three-dimensional memory device is provided, which comprises: an alternating stack of insulating layers and word-line-level electrically conductive layers located over a substrate; a drain-select-level electrically conductive layer that overlies the alternating stack; and memory pillar structures extending through the alternating stack and the drain-select-level electrically conductive layer and comprising a vertical semiconductor channel and a memory film configured to store electrical charges at each level of the word-line-level electrically conductive layers, wherein the drain-select-level electrically conductive layer comprises a metal layer that is free of void, is free of any vertically-extending seam, and consists a solid phase metal within an entire volume thereof.

BRIEF DESCRIPTION OF THE DRAWINGS

FIGS. 5A-5H are sequential schematic vertical cross-sectional views of a memory opening within the exemplary structure during formation of a memory opening fill structure according to an embodiment of the present disclosure.

FIGS. 13A-13D are sequential vertical cross-sectional views of a region of the exemplary structure during formation of electrically conductive layers in the backside recesses according to an embodiment of the present disclosure.

DETAILED DESCRIPTION

Figure 1:
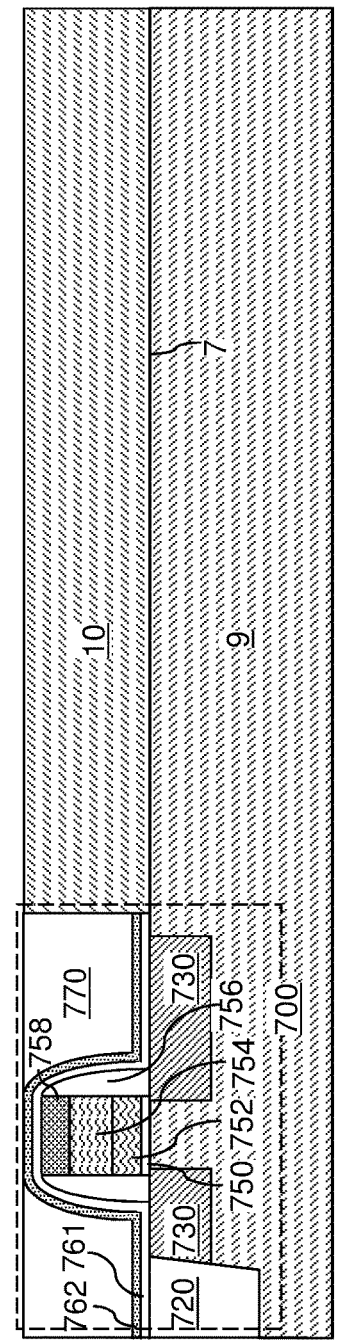
FIG. 1 is a schematic vertical cross-sectional view of an exemplary structure after formation of at least one peripheral device, and a semiconductor material layer according to an embodiment of the present disclosure.

Drain-select-level electrodes may be used to selectively activate a subset of memory stack structures without activating adjacent subsets of memory stack structures. The drain-select-level electrodes may be formed by depositing a metallic material in a recess region that surrounds protruding upper portions of the memory stack structures. A seam in the deposited metallic material during an etch-back process may cause the excessive removal of the metallic material, thereby causing electrical opens or high-resistivity regions and/or inducing reliability problems due to trapped impurities. Therefore, a method is desired for forming drain-select-level electrodes while preventing the formation of seams in the deposited metallic material.

As discussed above, the present disclosure is directed to a three-dimensional memory device including drain-select-level semiconductor channel portions directly contacting word-line-level semiconductor channel portions and methods of manufacturing the same, the various embodiments of which are described below. The multi-level self-aligned drain select level isolation structures may provide a compact device layout and reduce a chip size without the need to allocate an extra dedicated area to the drain-select-level isolation structure, as well as providing a simpler self-aligned fabrication process. Direct contact between the two channel portions reduces contact resistance and increases the cell current for the vertical field effect transistor. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The three-dimensional memory devices of various embodiments of the present disclosure include a monolithic three-dimensional NAND string memory device, and may be fabricated using the various embodiments described herein.

Generally, a semiconductor die, or a semiconductor package, may include a memory chip. Each semiconductor package contains one or more dies (for example one, two, or four). The die is the smallest unit that may independently execute commands or report status. Each die contains one or more planes (typically one or two). Identical, concurrent operations may take place on each plane, although with some restrictions. Each plane contains a number of blocks, which are the smallest unit that may be erased by in a single erase operation. Each block contains a number of pages, which are the smallest unit that may be programmed, i.e., a smallest unit on which a read operation may be performed.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device 700 for the peripheral circuitry may contain a driver circuit for memory devices to be subsequently formed, which may include at least one NAND device.

A dielectric material such as silicon oxide may be deposited over the at least one semiconductor device 700, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In such embodiments, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of word-line-level electrically conductive layers may be provided between the memory array region 100 and the peripheral device region 200.

Figure 2:
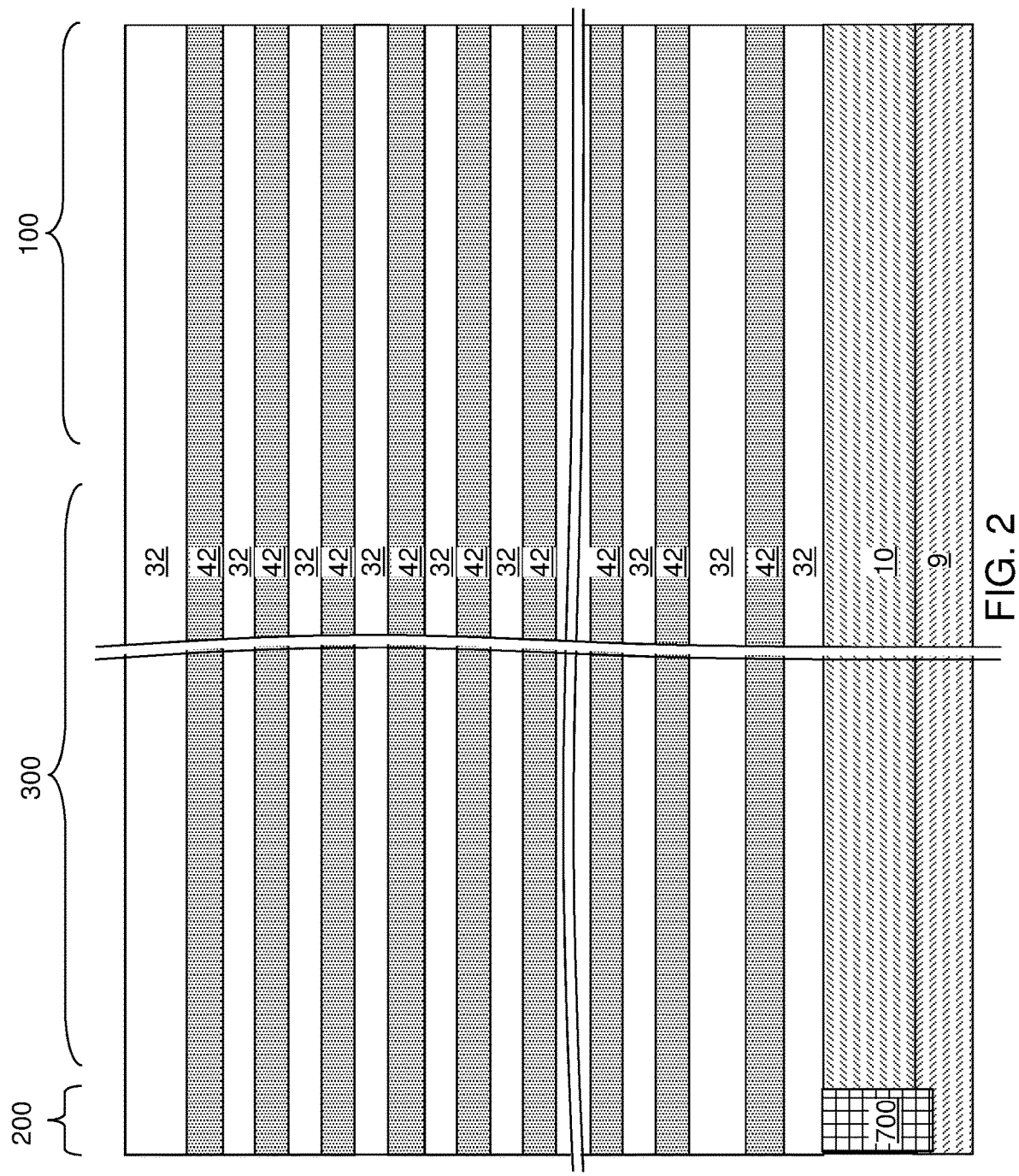
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layers) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer 42. In such embodiments, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 may be a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While embodiments of the present disclosure are described using an example embodiment in which the spacer material layers are sacrificial material layers 42 that are subsequently replaced with word-line-level electrically conductive layers, in other embodiments the sacrificial material layers are formed as electrically conductive layers, which include word-line-level electrically conductive layers that are formed at word line levels, i.e., at the levels of word lines. In such embodiments, steps for replacing the spacer material layers with electrically conductive layers may be omitted.

Figure 3:
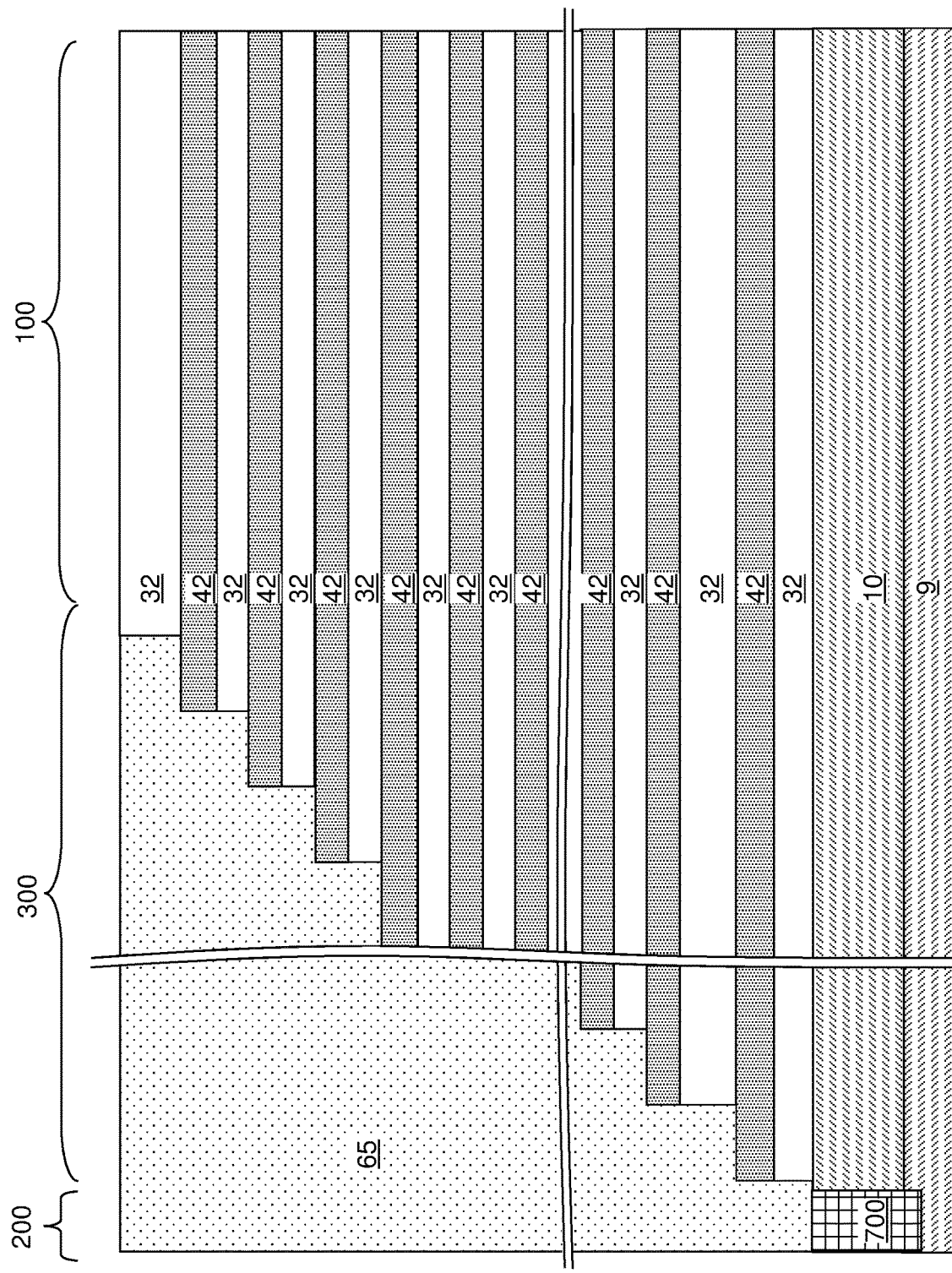
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces may be formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity may be formed within the volume from which portions of the alternating stack (32, 42) are removed through formation of the stepped surfaces. A "stepped cavity" refers to a cavity having stepped surfaces.

The terrace region may be formed in the contact region 300, which may be located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer 42. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases may be formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 may have a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
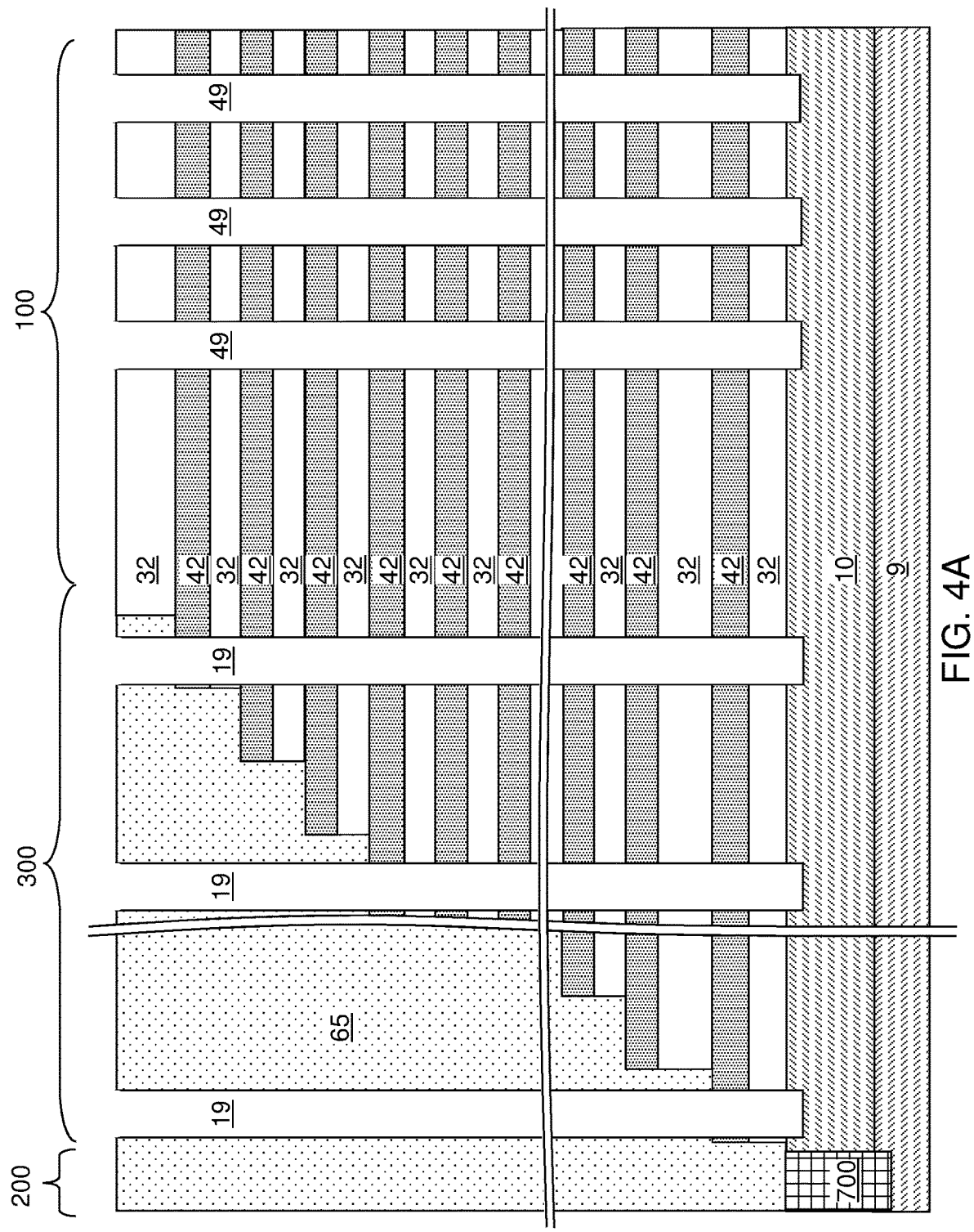
FIG. 4A is a schematic vertical cross-sectional view of the exemplary structure after formation of memory openings and support openings according to an embodiment of the present disclosure.
Figure 4B:
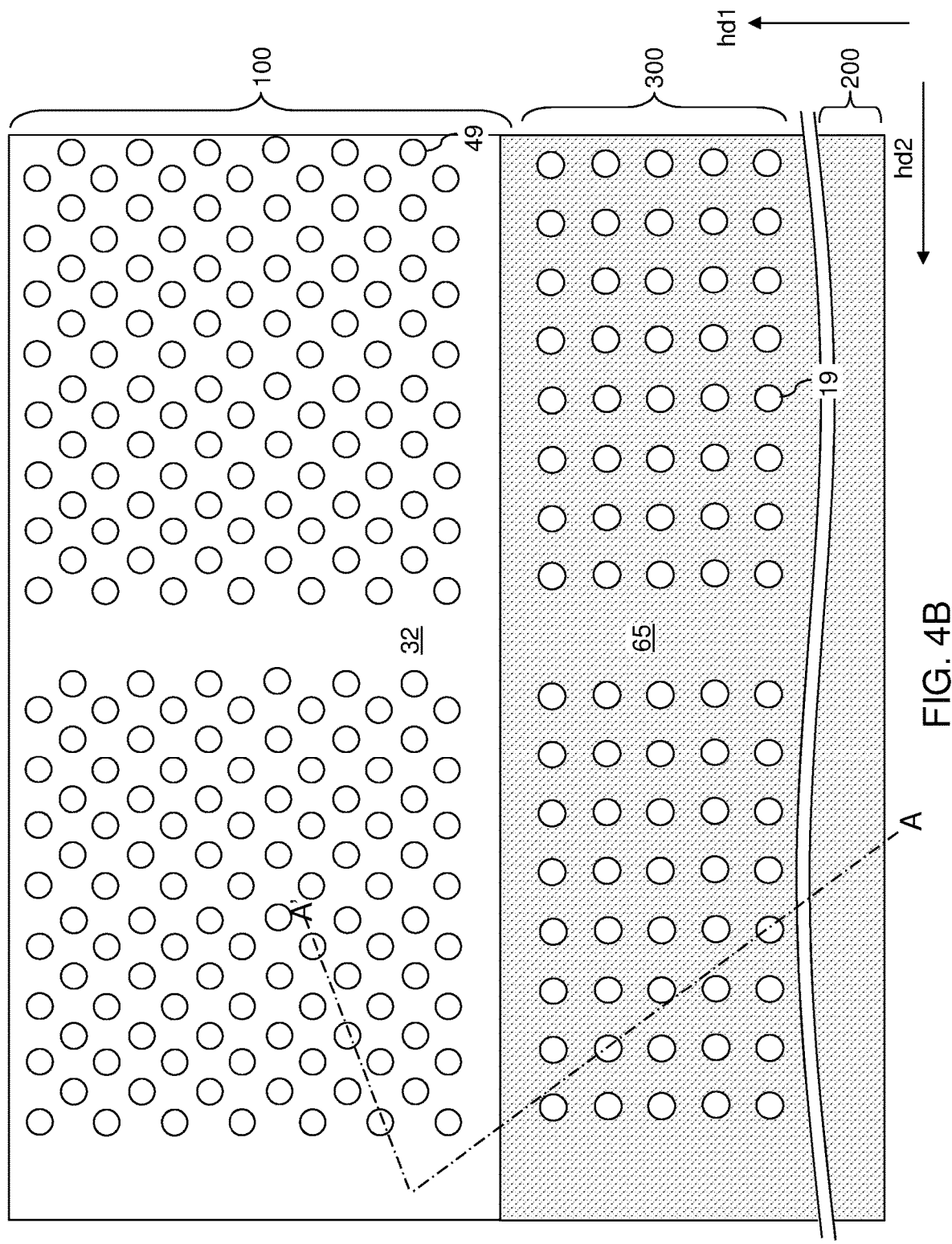
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the topmost insulating layer 32 and the retro-stepped dielectric material portion 65, and may be lithographically patterned to form openings therein. The openings may include a first set of openings formed over the memory array region 100 and a second set of openings formed over the contact region 300. The pattern in the lithographic material stack may be transferred through the topmost insulating layer 32 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack may be etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 may be formed through the entirety of the alternating stack (32, 42) in the memory array region 100. The support openings 19 may be formed through the retro-stepped dielectric material portion 65 and the portion of the alternating stack (32, 42) that underlie the stepped surfaces in the contact region 300.

The memory openings 49 may extend through the entirety of the alternating stack (32, 42). The support openings 19 may extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the contact region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 may extend through the alternating stack (32, 42) and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support opening 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In such an embodiment, at least one source select gate electrode may be subsequently formed by replacing each sacrificial material layer 42 located below the horizontal plane including the top surfaces of the pedestal channel portions 11 with a respective conductive material layer (see e.g., FIGS. 13D-17, 24A, 25A, below, conductive material layer 46). The pedestal channel portion 11 may be a portion of a transistor channel that extends between a source region to be subsequently formed in the substrate (9, 10) and a drain region to be subsequently formed in an upper portion of the memory opening 49. A memory cavity 49' may be present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In such embodiments, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While various embodiments of the present disclosure are described using an example embodiment in which the charge storage layer 54 is a single continuous layer, in other embodiments the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 may include amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' may be formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 may be sequentially anisotropically etched using at least one anisotropic etch process. The portions of the first semiconductor channel layer 601, the tunneling dielectric layer 56, the charge storage layer 54, and the blocking dielectric layer 52 located above the top surface of the topmost insulating layer 32 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in embodiments in which the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in embodiments in which pedestal channel portions 11 are not used) by a recess distance. A tunneling dielectric layer 56 may be located over the charge storage layer 54. A set of a blocking dielectric layer 52, a charge storage layer 54, and a tunneling dielectric layer 56 in a memory opening 49 may constitute a memory film 50, which includes a plurality of charge storage regions (e.g., the charge storage layer 54) that may be insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 5E, a second semiconductor channel layer 602 may be deposited directly on the semiconductor surface of the pedestal channel portion 11 or the semiconductor material layer 10 in embodiments in which the pedestal channel portion 11 is omitted, and directly on the first semiconductor channel layer 601. The second semiconductor channel layer 602 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 may include amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in embodiments in which the memory cavity 49' in each memory opening is not completely filled by the second semiconductor channel layer 602, a word-line-level dielectric core layer 62L may be deposited in the memory cavity 49' to fill any remaining portion of the memory cavity 49' within each memory opening. The word-line-level dielectric core layer 62L includes a dielectric material such as silicon oxide or organosilicate glass. The word-line-level dielectric core layer 62L may be deposited by a conformal deposition method such as low pressure chemical vapor deposition (LPCVD), or by a self-planarizing deposition process such as spin coating.

Figure 5G:
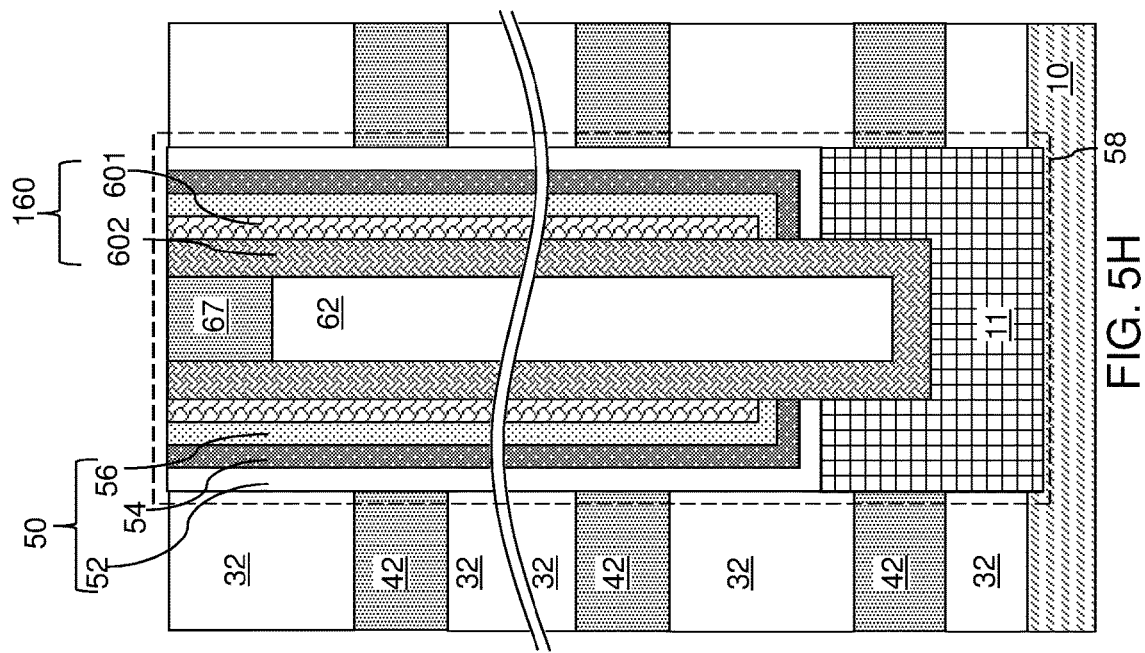

Referring to FIG. 5G, the horizontal portion of the word-line-level dielectric core layer 62L may be removed, for example, by a recess etch from above the top surface of the topmost insulating layer 32. Each remaining portion of the word-line-level dielectric core layer 62L constitutes a word-line-level dielectric core 62. Further, the horizontal portion of the second semiconductor channel layer 602 located above the top surface of the topmost insulating layer 32 may be removed by a planarization process, which may use a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a word-line-level semiconductor channel portion 160 through which electrical current may flow when a vertical NAND device including the word-line-level semiconductor channel portion 160 is turned on. A tunneling dielectric layer 56 may be surrounded by a charge storage layer 54, and may laterally surround a portion of the word-line-level semiconductor channel portion 160. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
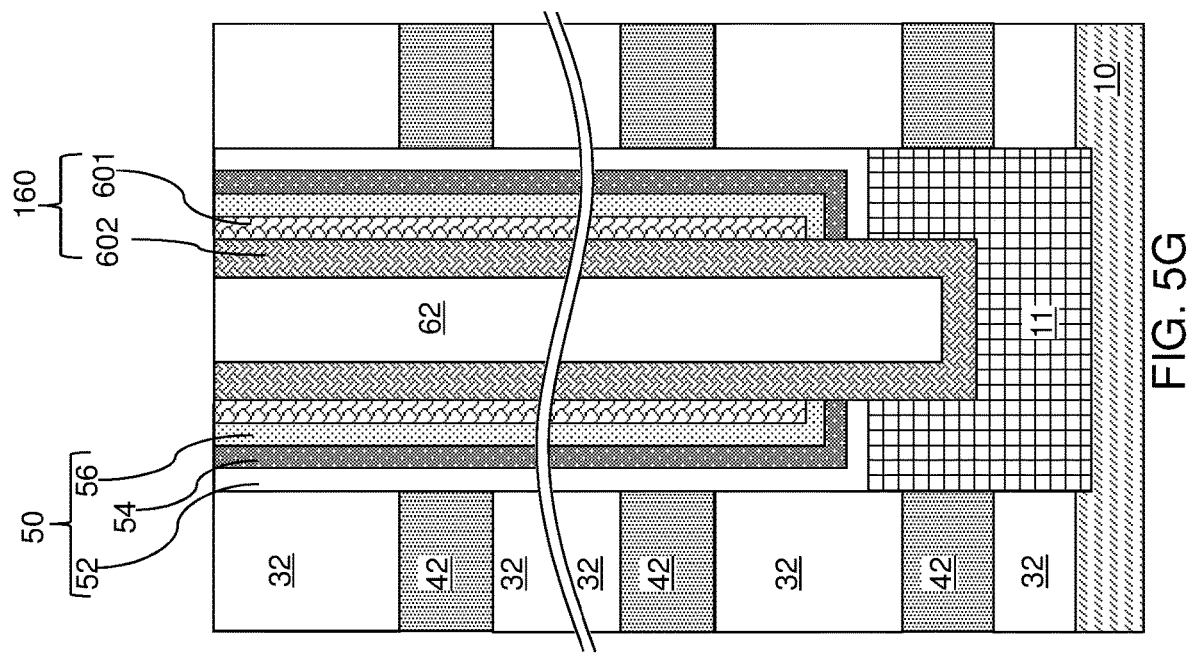

Referring to FIG. 5H, the top surface of each word-line-level dielectric core 62 may be further recessed within each memory opening, for example, by a recess etch to a depth that is located between the top surface of the topmost insulating layer 32 and the bottom surface of the topmost insulating layer 32. A sacrificial dielectric material layer may be deposited in the recesses overlying the word-line-level dielectric cores 62. The sacrificial dielectric material layer may include a dielectric material that is different from the dielectric material of the word-line-level dielectric cores 62. In one embodiment, the sacrificial dielectric material layer may include silicon nitride. The horizontal portion of the sacrificial dielectric material layer overlying horizontal portions of the memory film 50 may be removed by a planarization process. For example, a recess etch may be performed to remove the horizontal portion of the sacrificial dielectric material layer. Each remaining portions of the sacrificial dielectric material layer may constitute a sacrificial dielectric material portion 67. Each sacrificial dielectric material portion 67 may have a substantially cylindrical shape. The interface between a cylindrical sidewall of a sacrificial dielectric material portion 67 and a word-line-level semiconductor channel portion 160 may be vertically coincident with an interface between a word-line-level dielectric core 62 and the word-line-level semiconductor channel portion 160.

Each combination of a pedestal channel portion 11 (if present), a memory film 50, a word-line-level semiconductor channel portion 160, a word-line-level dielectric core 62, and a sacrificial dielectric material portion 67 within a memory opening 49 constitutes a memory opening fill structure 58. Each combination of a pedestal channel portion 11 (if present), a memory film 50, a word-line-level semiconductor channel portion 160, a word-line-level dielectric core 62, and a sacrificial dielectric material portion 67 within each support opening 19 fills the respective support openings 19, and constitutes a support pillar structure 20.

Figure 6:
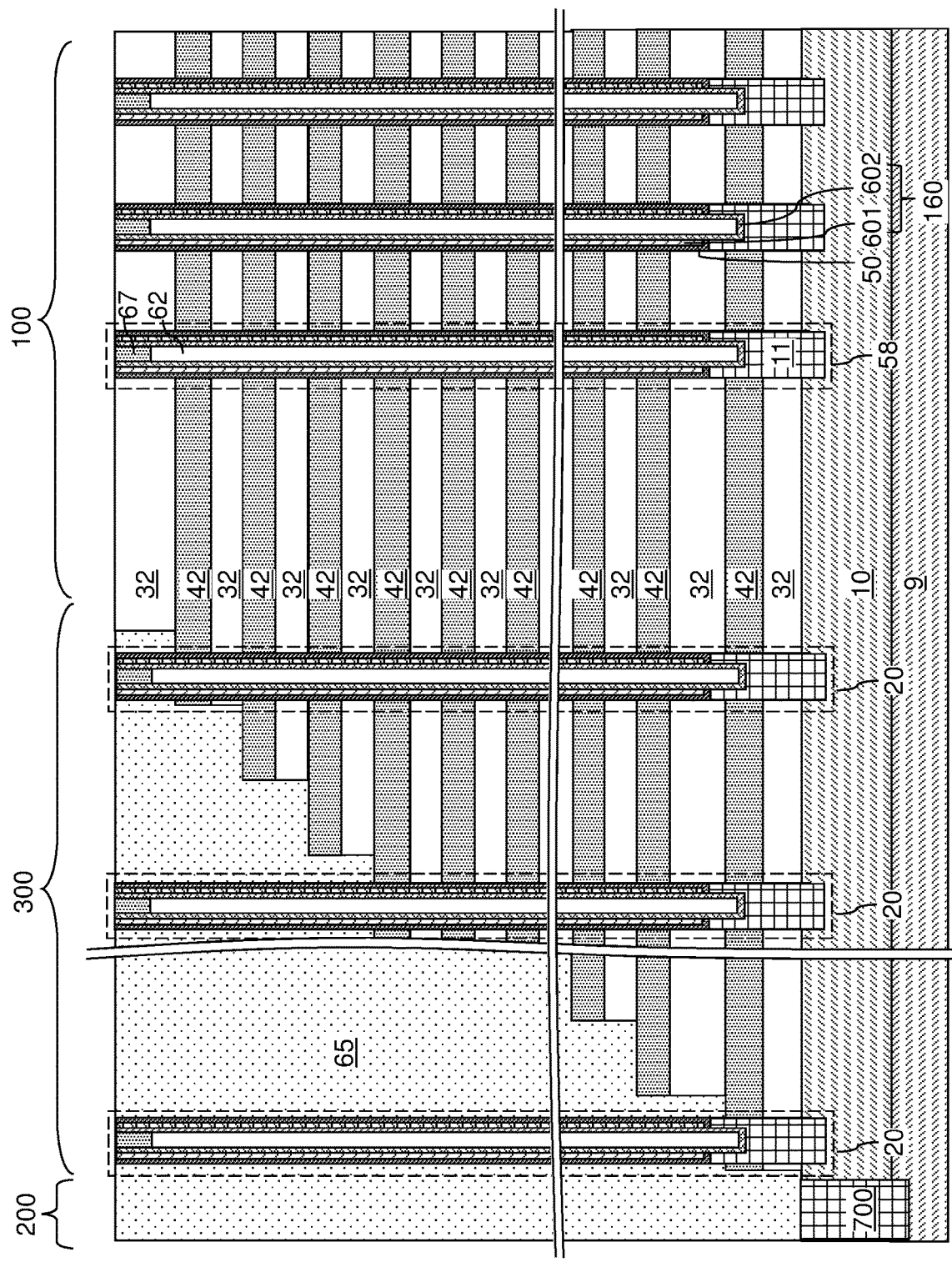
FIG. 6 is a schematic vertical cross-sectional view of the exemplary structure after formation of opening fill structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Figure 7:
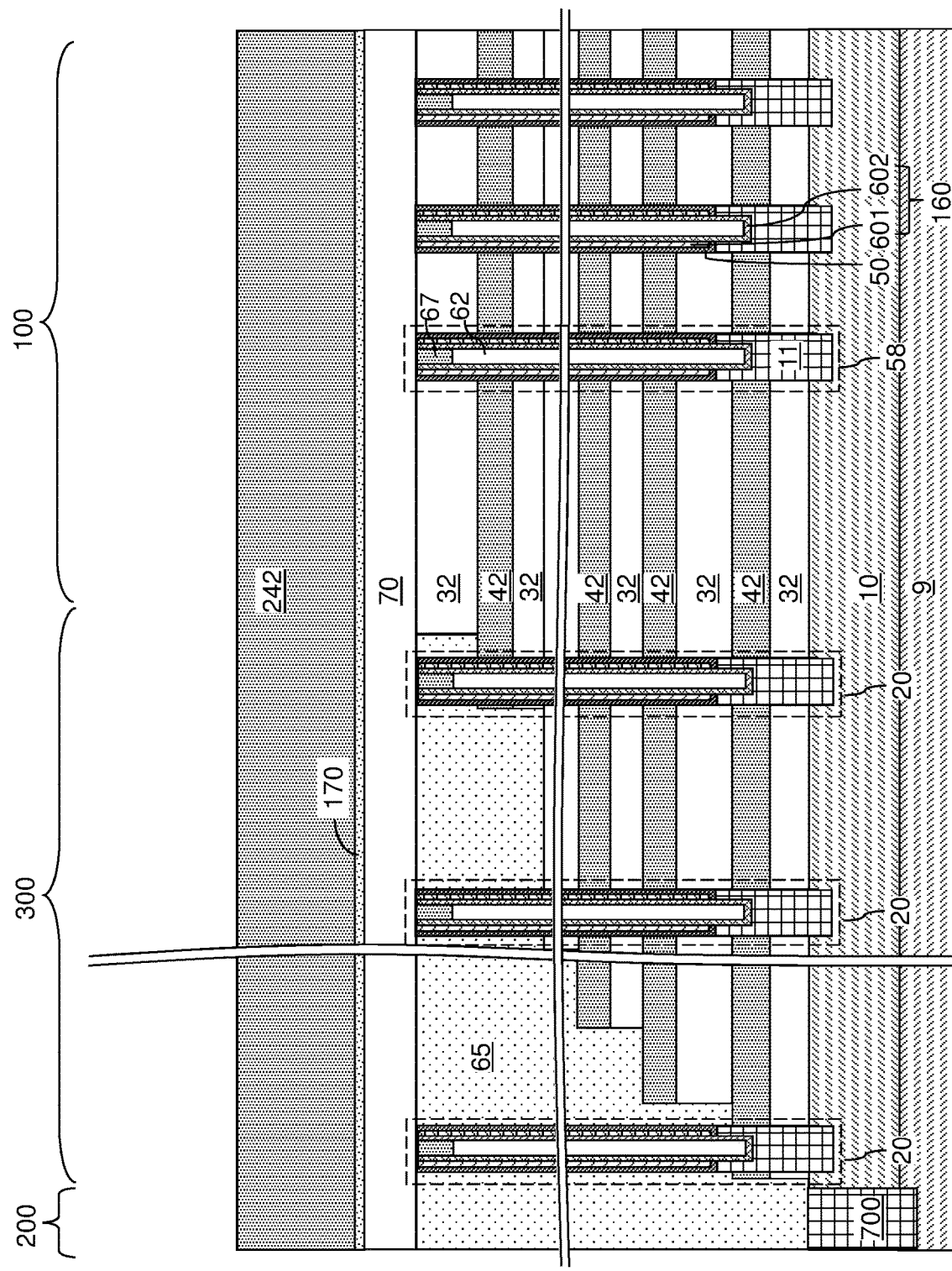
FIG. 7 is a schematic vertical cross-sectional view of the exemplary structure after formation of an insulating cap layer, an etch stop material layer, and a drain-select-level sacrificial material layer according to an embodiment of the present disclosure.

Referring to FIG. 7, an insulating cap layer 70, an etch stop material layer 170, and a drain-select-level sacrificial material layer 242 may be sequentially deposited over the topmost insulating layer 32. The insulating cap layer 70 may include a silicon oxide-based dielectric material, such as undoped silicate glass or a doped silicate glass. In one embodiment, the insulating cap layer 70 may include a dielectric material having a higher etch rate in dilute hydrofluoric acid than the dielectric material of the insulating layers 32. For example, the insulating cap layer 70 may include borosilicate glass. The thickness of the insulating cap layer 70 may be in a range from 30 nm to 200 nm, although lesser and greater thicknesses may also be used.

The etch stop material layer 170 may include a dielectric material that is selective to an anisotropic etch chemistry for silicon oxide. For example, the etch stop material layer 170 may include a dielectric metal oxide material, such as aluminum oxide. The thickness of the etch stop material layer 170 may be in a range from 5 nm to 30 nm, although lesser and greater thicknesses may also be used.

The drain-select-level sacrificial material layer 242 may include a sacrificial material layer that may be removed selective to the material of the etch stop material layer. The drain-select-level sacrificial material layer 242 may include a dielectric material such as silicon nitride, a semiconductor material such as amorphous silicon, or a polymer material. In one embodiment, the drain-select-level sacrificial material layer 242 may include the same dielectric material as the sacrificial material layers 42. For example, the drain-select-level sacrificial material layer 242 and the sacrificial material layers 42 may include silicon oxide. The thickness of the drain-select-level sacrificial material layer 242 may be in a range from 30 nm to 400 nm, such as from 60 nm to 200 nm, although lesser and greater thicknesses may also be used. The set of the insulating cap layer 70, the etch stop material layer 170, and the drain-select-level sacrificial material layer 242 is herein referred to as drain-select-level layers (70, 170, 242).

Figure 8A:
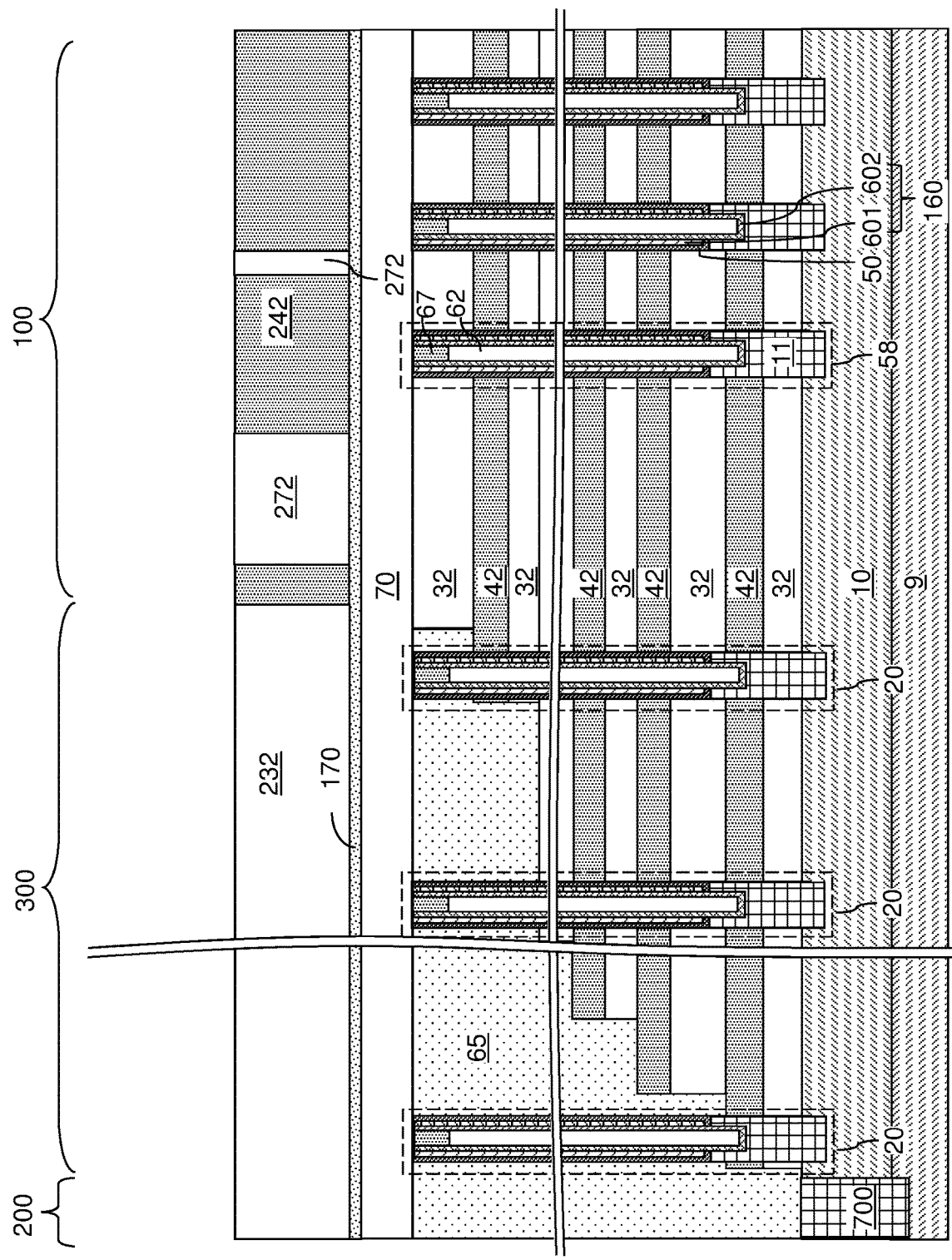
FIG. 8A is a schematic vertical cross-sectional view of the exemplary structure after formation of drain select level isolation structures according to an embodiment of the present disclosure.
Figure 8B:
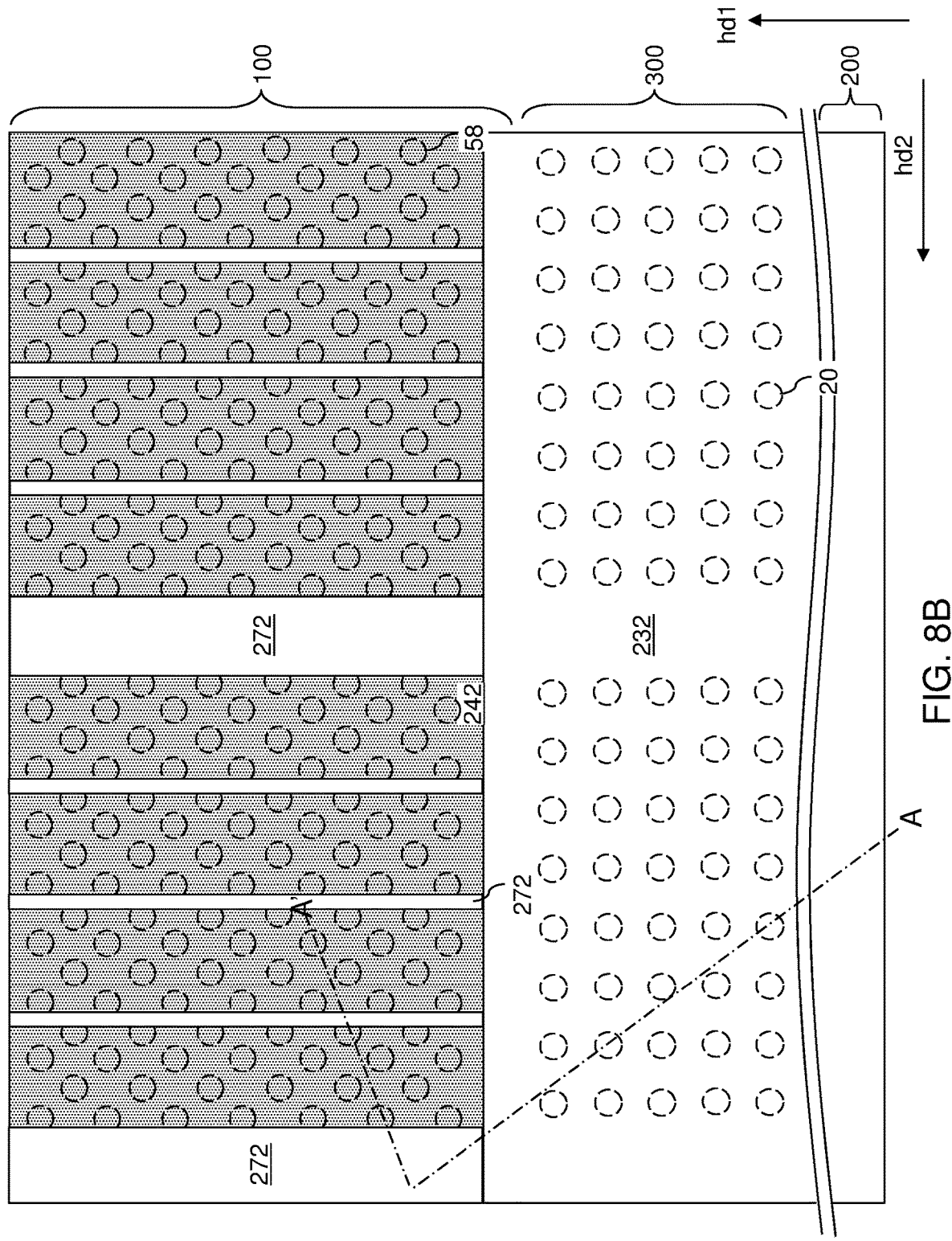
FIG. 8B is a top-down view of the exemplary structure of FIG. 8A. The hinged vertical plane A-A' is the plane of the schematic vertical cross-sectional view of FIG. 8A.

Referring to FIGS. 8A and 8B, a dielectric isolation layer 232 and drain-select-level isolation structures 272 may be formed through the drain-select-level sacrificial material layer 242 and optionally through the etch stop material layer 170. The dielectric isolation layer 232 may be formed within the contact region 300 and the peripheral device region 200 as a continuous material layer. The drain-select-level isolation structures 272 may laterally extend along the first horizontal direction hd1. A patterned photoresist layer including line-shaped opening may be formed over the drain-select-level sacrificial material layer 242. The drain-select-level sacrificial material layer 242 may be removed from the contact region 300 and the peripheral device region 200 to physically expose a top surface of the etch stop material layer 170 or a top surface of the insulating cap layer 70. Line trenches may be formed at least through the drain-select-level sacrificial material layer 242 using an anisotropic etch process. In one embodiment, the etch stop material layer 170 may be used as an etch stop layer during formation of the line trenches which vertically extend through remaining portions of the drain-select-level sacrificial material layer 242. The patterned photoresist layer may be subsequently removed, for example, by ashing. A dielectric material such as silicon oxide may be deposited in the line trenches, and excess portions of the dielectric material may be removed from above the drain-select-level sacrificial material layer 242 to form the drain-select-level isolation structures 272 and the dielectric isolation layer 232.

Each drain-select-level isolation structure 272 may have a uniform vertical cross-sectional profile along vertical planes that are perpendicular to the first horizontal direction hd1 that is invariant with translation along the first horizontal direction hd1. Multiple rows of memory opening fill structures 58 may underlie each area between a neighboring pair of drain-select-level isolation structures 272. Each row of memory opening fill structures 58 may laterally extend along the first horizontal direction hd1, and may be laterally spaced apart one from another along the second horizontal direction. In one embodiment, each drain-select-level isolation structure 272 may have an areal overlap with peripheral portions of memory opening fill structures 58 located within two neighboring rows of memory opening fill structures 58.

Figure 9A:
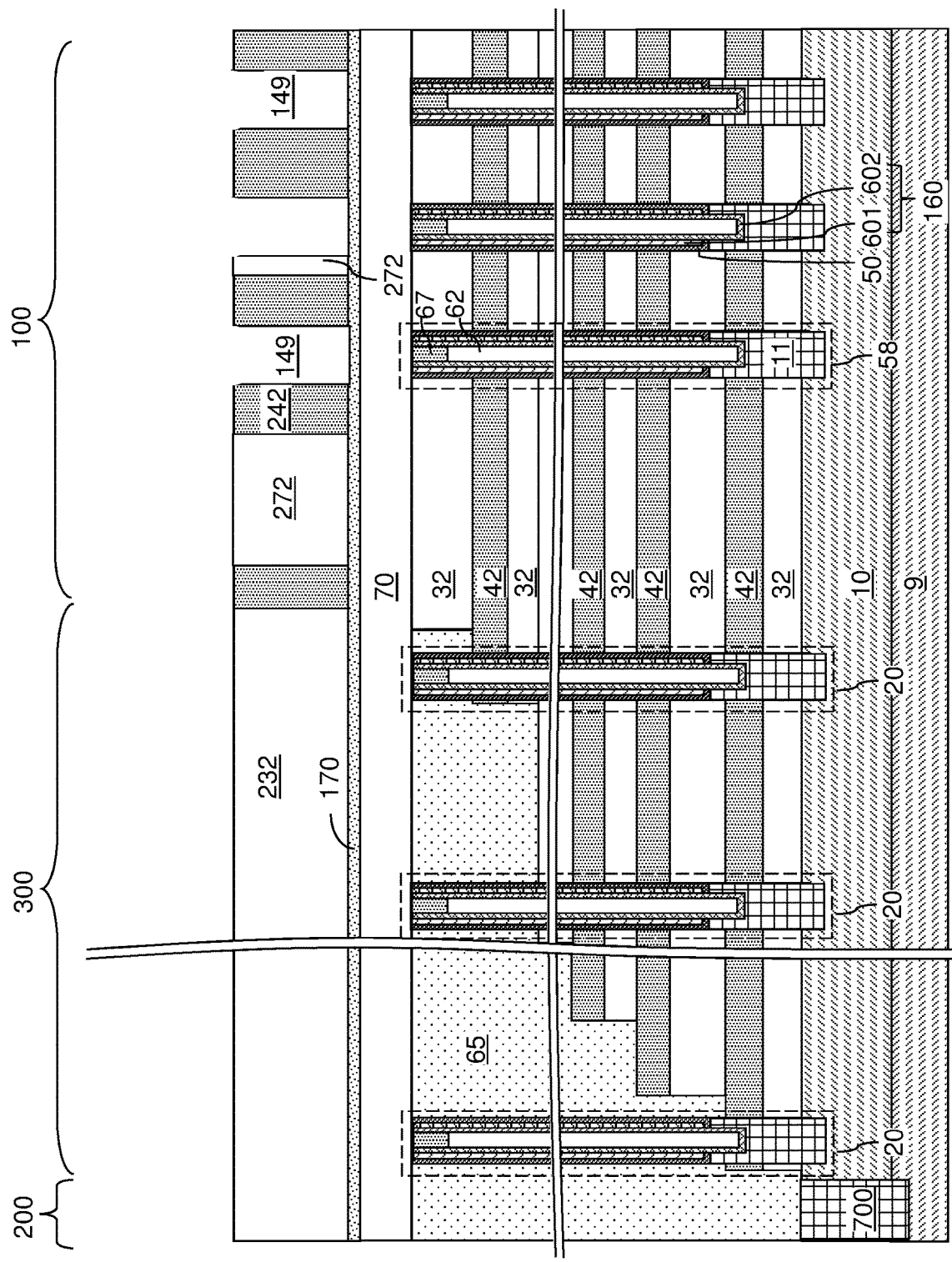
FIG. 9A is a schematic vertical cross-sectional view of the exemplary structure after formation of drain-select-level openings according to an embodiment of the present disclosure.
Figure 9B:
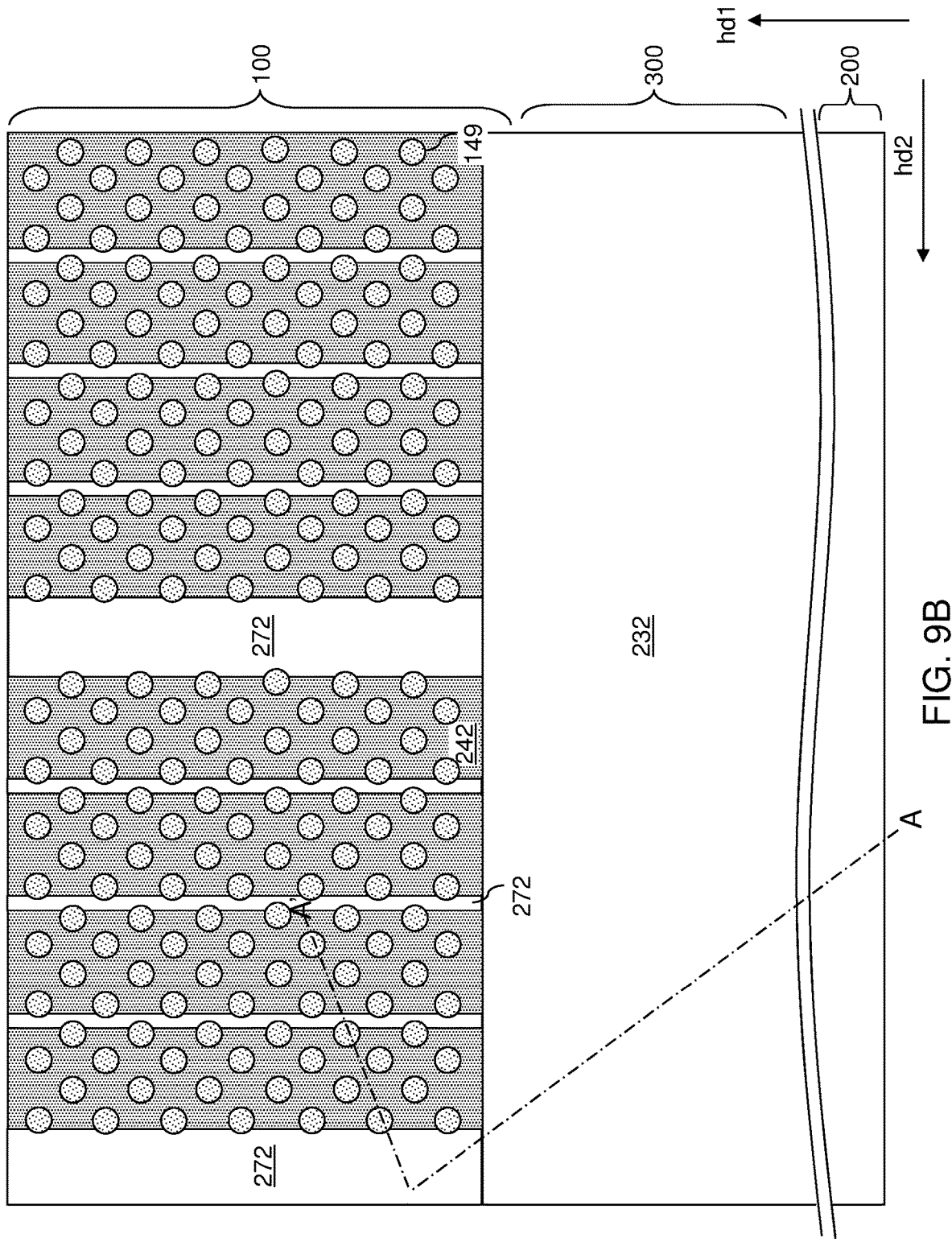
FIG. 9B is a top-down view of the exemplary structure of FIG. 9A. The hinged vertical plane A-A' is the plane of the schematic vertical cross-sectional view of FIG. 9A.
Figure 10A:
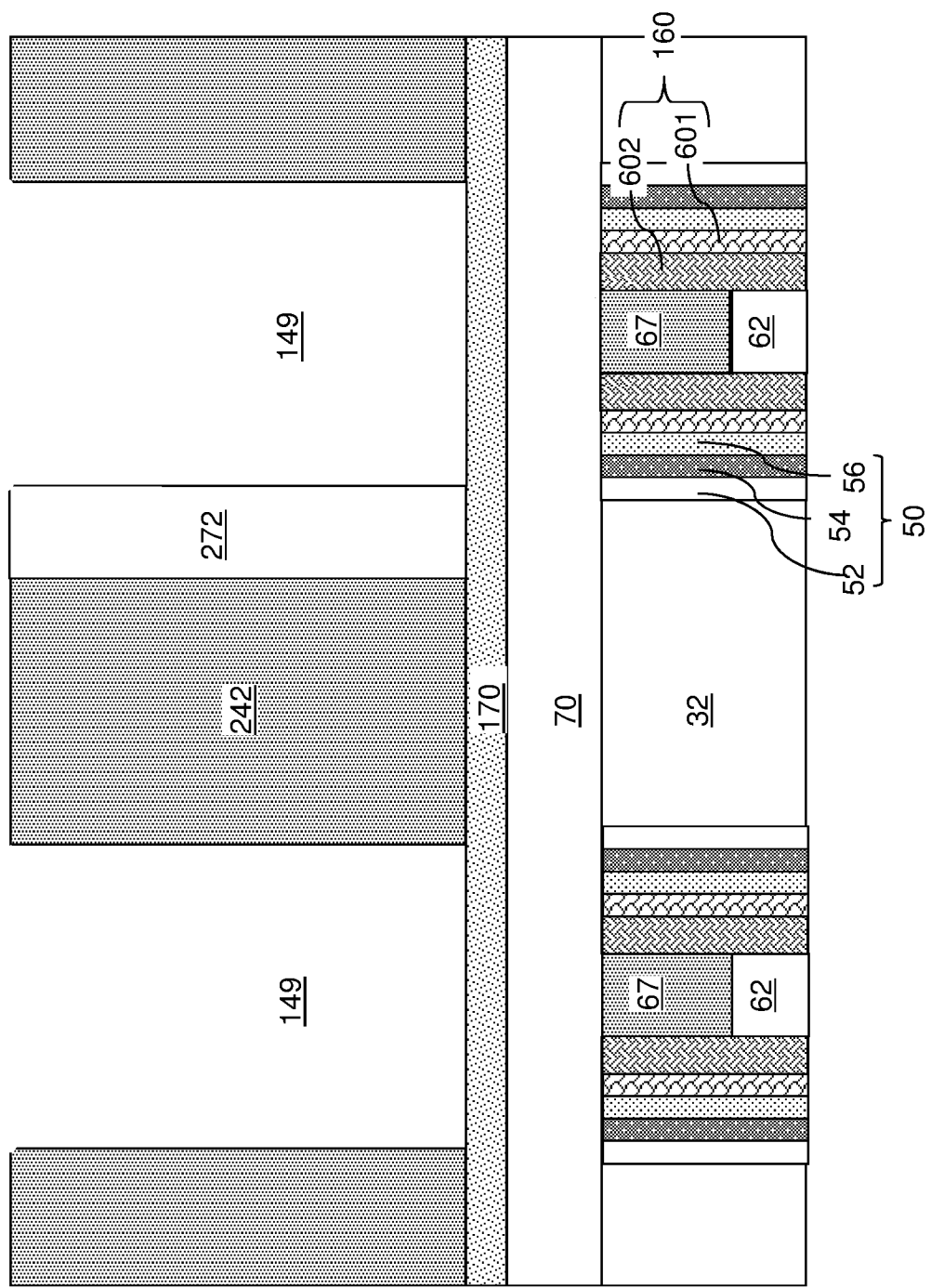
FIGS. 10A-10J are sequential vertical cross-sectional views of a region including a pair of drain-select-level openings during formation of drain-select-level pillar structures according to an embodiment of the present disclosure.

Referring to FIGS. 9A, 9B, and 10A, drain-select-level openings 149 may be formed at least through an upper portion of the drain-select-level layers (70, 170, 242). For example, a photoresist layer (not shown) may be applied over the drain-select-level sacrificial material layer 242 and the drain-select-level isolation structures 272, and may be lithographically patterned to form openings having the same pattern as the memory openings 49. The size of the openings in the photoresist layer may be the same as, larger than, or smaller than, the size of the underlying memory opening fill structures 58. An anisotropic etch process may be performed to transfer the pattern of the photoresist layer through the drain-select-level sacrificial material layer 242. In one embodiment, the etch stop material layer 170 may be used as an etch stop structure during the anisotropic etch process. In such embodiments, a bottom surface of each drain-select-level opening 149 may include a surface portion of the etch stop material layer 170. Drain-select-level openings 149 that replicate the pattern of the openings in the photoresist layer may be formed through the drain-select-level sacrificial material layer 242. Each drain-select-level opening 149 has an areal overlap with an underlying one of the memory opening fill structures 58. The photoresist layer may be subsequently removed, for example, by ashing.

Lengthwise edges of each drain-select-level isolation structure 272 that laterally extend along the first horizontal direction hd1 may be perforated by a pair of rows of drain-select-level openings 149 that laterally extend along the first horizontal direction hd1. Each drain-select-level isolation structure 272 may include a pair of lengthwise sidewalls such that each lengthwise sidewall includes a laterally alternating sequence of planar vertical sidewall segments and concave vertical sidewall segments. Multiple rows of drain-select-level openings 149 may be provided between each neighboring pair of drain-select-level isolation structures 272. For example, four rows of drain-select-level openings 149 may be provided between a pair of drain-select-level openings 149.

Each drain-select-level opening 149 laterally abutting a drain-select-level isolation structure 272 may be formed through a portion of the drain-select-level isolation structure 272 and through a portion of the drain-select-level sacrificial material layer 242. Each drain-select-level opening 149 that is laterally spaced from the drain-select-level isolation structures 272 may have a sidewall that includes a cylindrical surface of the drain-select-level sacrificial material layer 242.

Figure 10B:
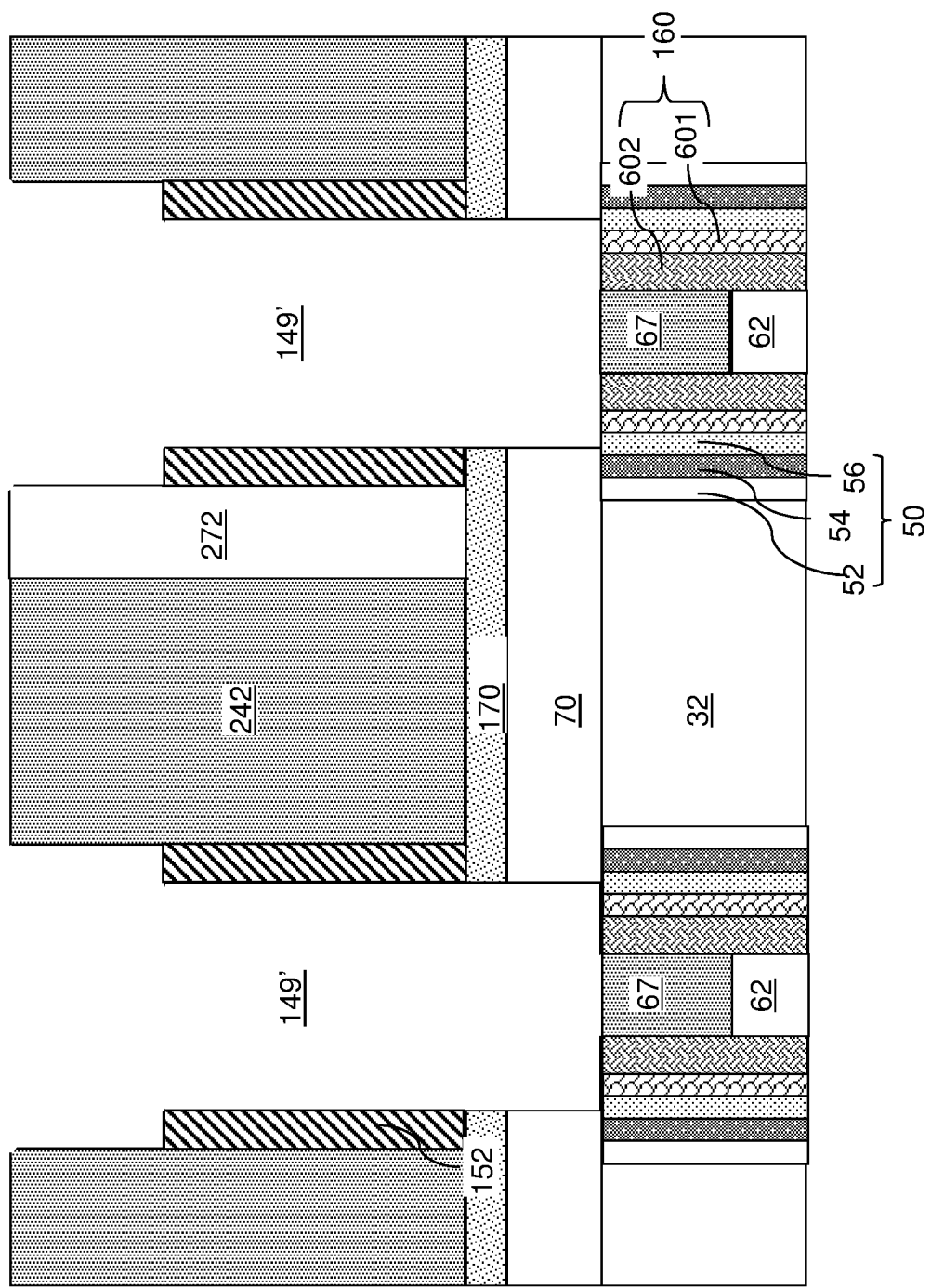

Referring to FIG. 10B, a cylindrical gate electrode 152 may be formed at a periphery of each drain-select-level opening 149 by conformal deposition of a heavily doped semiconductor material (such as heavily doped amorphous silicon or heavily doped polysilicon) or a metallic material (such as TiN), and an anisotropic etch process that removes horizontal portions of the heavily doped semiconductor material or the metallic material. As used herein, a "cylindrical" element is topologically homeomorphic to a torus, and has a vertical or substantially vertical inner sidewall, a vertical or substantially vertical outer sidewall, and an opening vertically extending through the vertical or substantially vertical inner sidewall. The top surface of each cylindrical gate electrode 152 may be vertically recessed from the top surface of the drain-select-level sacrificial material layer 242. The lateral thickness of each cylindrical gate electrode 152 (i.e., the lateral distance between the inner sidewall and the outer sidewall of each cylindrical gate electrode 152) may be in a range from 3 nm to 30 nm, such as from 4 nm to 12 nm, although lesser and greater lateral thicknesses may also be used.

Figure 10C:
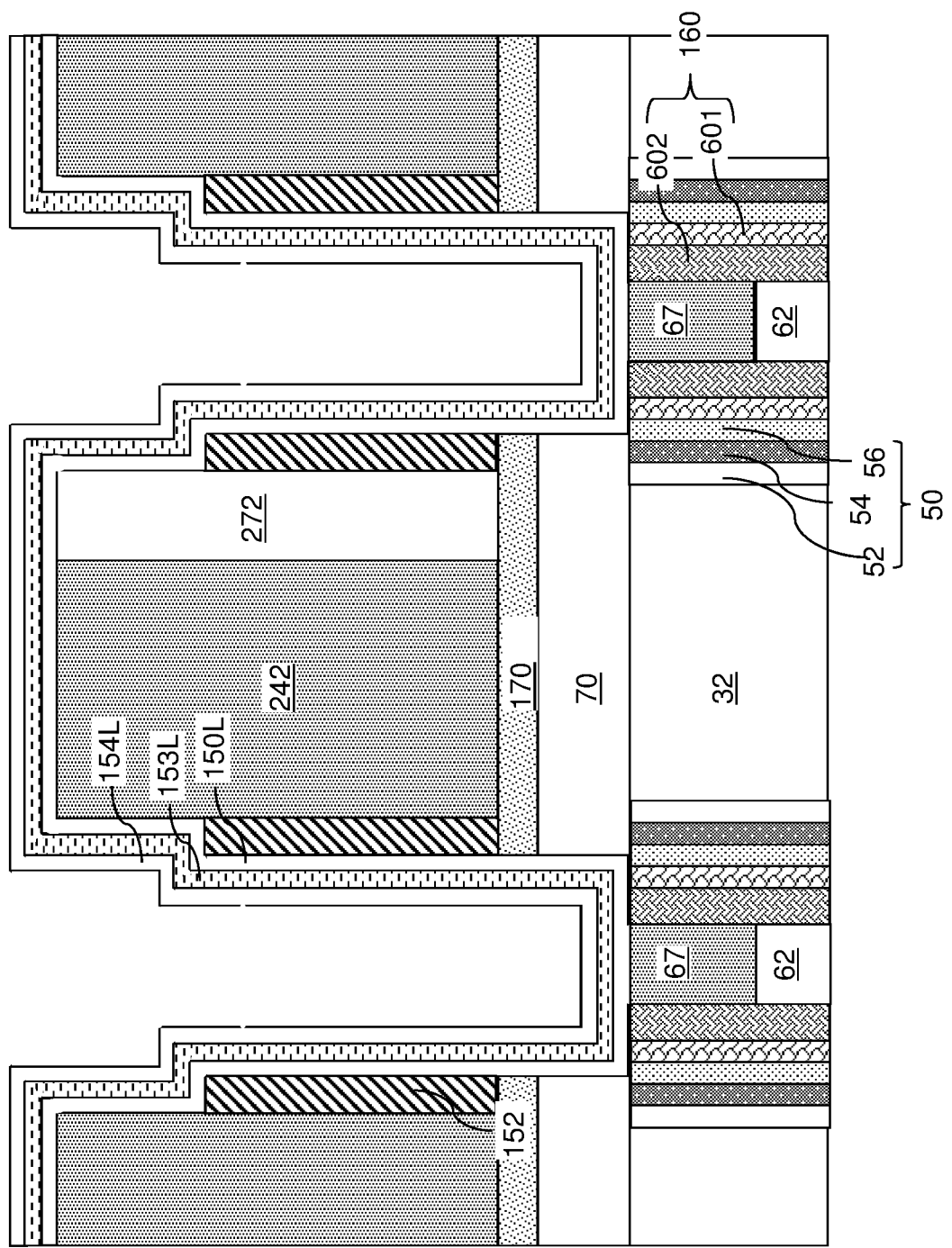

Referring to FIG. 10C, continuous material layers (150L, 153L, 154L) may be sequentially deposited in the drain-select-level openings 149 and over the drain-select-level sacrificial material layer 242. The continuous material layers (150L, 153L, 154L) may include a gate dielectric layer 150L, a cover semiconductor channel material layer 153L, and a cover dielectric material layer 154L.

The gate dielectric layer 150L may include a silicon oxide layer and/or a dielectric metal oxide layer. The entirety or a component layer of the gate dielectric layer 150L may be conformally deposited on the cylindrical gate electrodes 152. Alternatively, or additionally, the gate dielectric layer 150L may be formed by in-situ steam generation oxidation of surface portions of the cylindrical gate electrodes 152 if the cylindrical gate electrodes 152 comprise a doped semiconductor material, such as doped polysilicon or doped amorphous silicon. Each vertical portion of the gate dielectric layer 150L located within a respective one of the drain-select-level openings 149 constitutes a gate electric. Thus, the gate dielectric layer 150L includes a plurality of gate dielectrics, a horizontal top portion that overlies the drain-select-level sacrificial material layer 42, and horizontal bottom portions located at the bottom of the drain-select-level openings 149.

The cover semiconductor channel material layer 153L may be conformally deposited over the gate dielectric layer 150L. The cover semiconductor channel material layer 153L includes a doped semiconductor material such as doped polysilicon or doped amorphous silicon. The cover semiconductor channel material layer 153L may be formed with in-situ doping of the first conductivity type, or may be subsequently doped with dopants of the first conductivity type.

The cover dielectric material layer 154L may be conformally deposited over the cover semiconductor channel material layer 153L. In one embodiment, the cover dielectric material layer 154L may include a silicon oxide-based material such as undoped silicate glass.

Figure 10D:
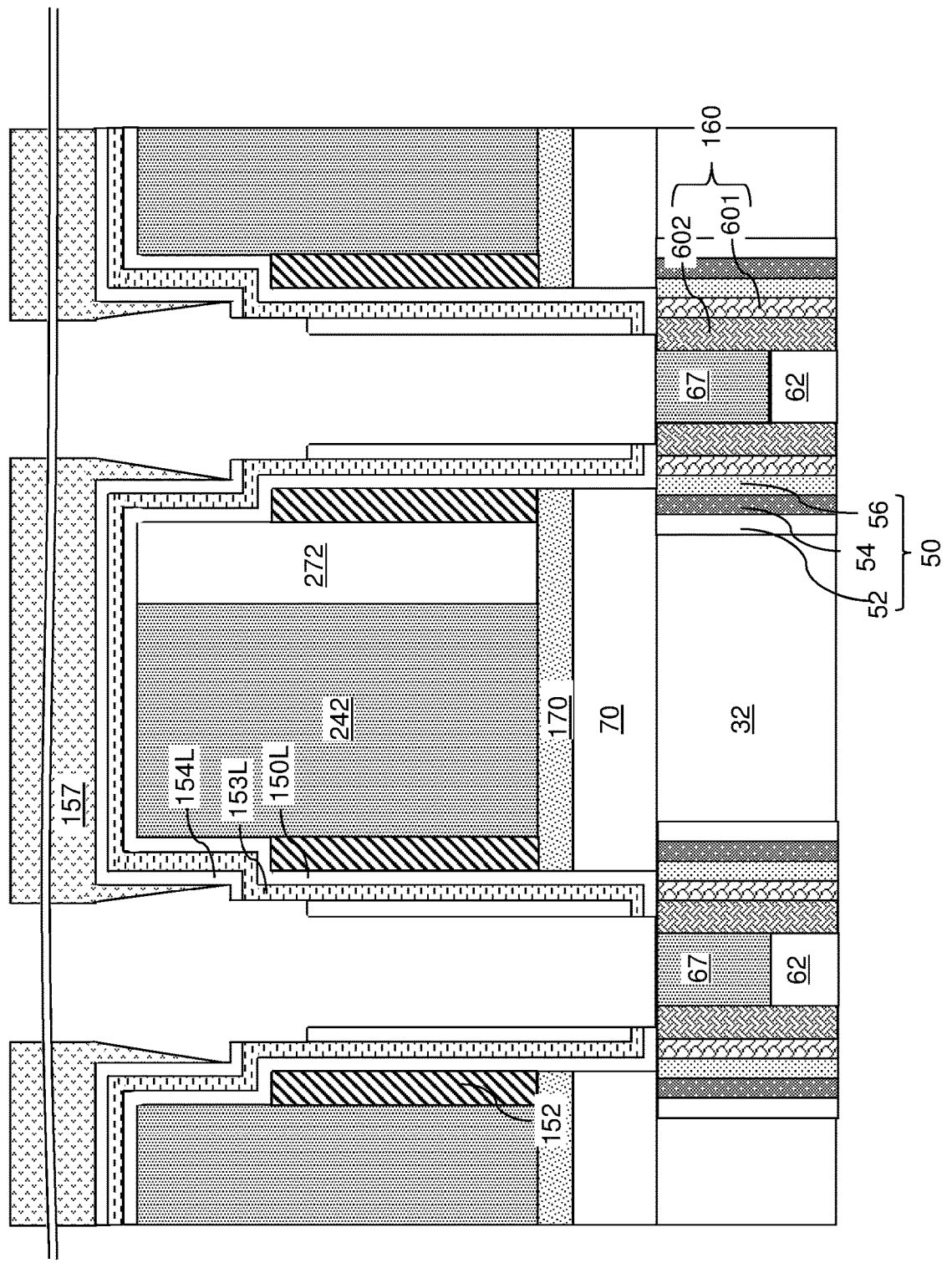

Referring to FIG. 10D, a patterning film 157 may be anisotropically deposited over the exemplary structure. The patterning film 157 may be deposited by a non-conformal deposition process such as plasma enhanced chemical vapor deposition. The maximum thickness of the patterning film 157 at the bottom of each drain-select-level opening 149 may be less than 80%, such as less than 50%, of the thickness of the patterning film 157 over the top surface of the drain-select-level sacrificial material layer 242. The maximum lateral thickness of the patterning film 157 on the sidewall of each drain-select-level opening 149 may be less than 80%, such as less than 50%, of the thickness of the patterning film 157 over the top surface of the drain-select-level sacrificial material layer 242. The lateral thickness of the patterning film 157 on the sidewall of each drain-select-level opening 149 may decrease with the depth from the horizontal plane including the top surface of the drain-select-level sacrificial material layer 242. For example, the patterning film 157 may include the Advanced Patterning Film (APF)™ that is commercially available from Applied Materials, Inc.

Each void laterally surrounded by a gate dielectric (i.e., a vertical portion of the gate dielectric layer 150L) may be vertically extended through the etch stop material layer 170 and the insulating cap layer 70 using an anisotropic etch process to form a drain-select-level cavity. An anisotropic etch process may be performed to etch through material portions of the patterning film 157, the cover dielectric material layer 154L, the cover semiconductor channel material layer 153L, and the gate dielectric layer 150L located at the bottom of the drain-select-level openings 149. The anisotropic etch process may include a first step that etches through the portions of the patterning film 157 located at the bottom of the drain-select-level openings 149, a second step that etches through the portions of the cover dielectric material layer 154L at the bottom of the drain-select-level openings 149 selective to the material of the patterning film 157, a third step that etches through the portions of the cover semiconductor channel material layer 153L selective to the material of the patterning film 157, a fourth step that etches through the material of the gate dielectric layer 150L at the bottom of the drain-select-level openings 149 selective to the material of the patterning film 157, a fifth step that etches through the material of the etch stop material layer 170 underneath the drain-select-level openings 149 selective to the material of the patterning film 157, and a sixth step that etches through the material of the insulating cap layer 70 underneath the drain-select-level openings 149 selective to the material of the patterning film 157.

Each void laterally surrounded by the layer stack of the gate dielectric layer 150L, the cover semiconductor channel material layer 153L, and the cover dielectric material layer 154L is vertically extended to form a drain-select-level cavity 149'. A memory opening fill structure 58 is physically exposed at the bottom of each drain-select-level cavity 149'. A top surface of a sacrificial dielectric material portion 67 is physically exposed underneath each drain-select-level cavity 149'. Each drain-select-level cavity 149' comprises a void that is laterally surrounded by a gate dielectric. In one embodiment, the cover dielectric material layer 154L may be divided into multiple discrete portions depending on the thickness of the cover dielectric material layer 154L and a taper angle of sidewalls of the cover dielectric material layer 154L. The patterning film 157 may be consumed during the anisotropic etch process, or may be removed after the anisotropic etch process, for example, by ashing.

Figure 10E:
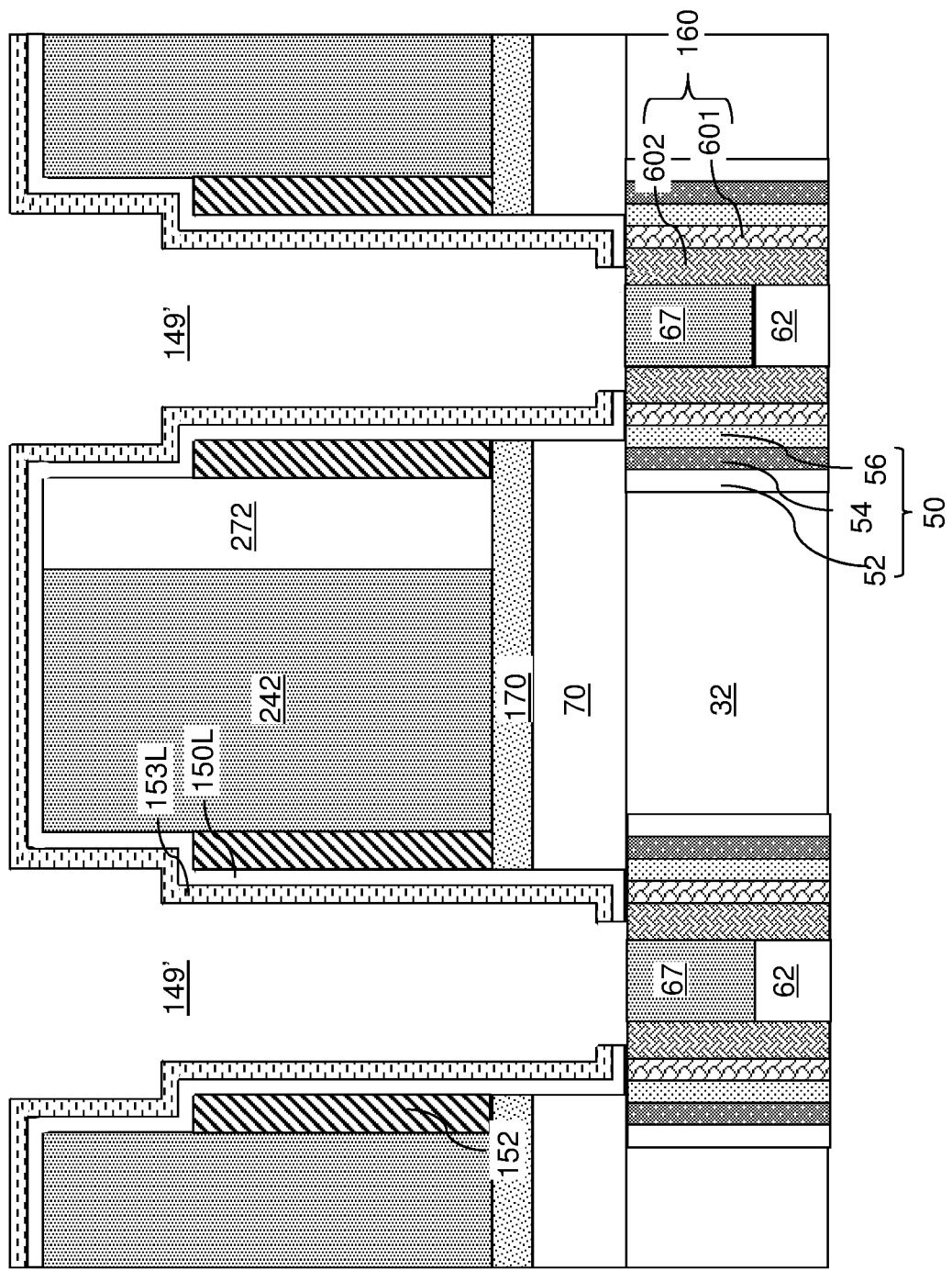

Referring to FIG. 10E, an isotropic etch process may be performed to laterally recess cylindrical sidewalls of the drain-select-level cavities 149'. Remaining portions of the cover dielectric material layer 154L may be collaterally removed during the isotropic etch process. For example, if the insulating cap layer 70 includes a silicon-oxide based material such as borosilicate glass, phosphosilicate glass, or undoped silicate glass, a wet etch using dilute hydrofluoric acid may be performed to laterally recess the vertical cylindrical sidewalls of the drain-select-level cavities 149'. Each drain-select-level cavity 149' includes a laterally expanded annular portion that is formed by removal of an annular portion of the insulating cap layer 70 around the volume of a respective drain-select-level cavity 149' as provided at the processing steps of FIG. 10D. In one embodiment, removal of the material of the insulating cap layer 70 may be selective to the materials of the sacrificial dielectric material portions 67 and the etch stop material layer 170. Surfaces of the cover semiconductor channel material layer 153L may be physically exposed after removal of the cover dielectric material layer 154L.

Figure 10F:
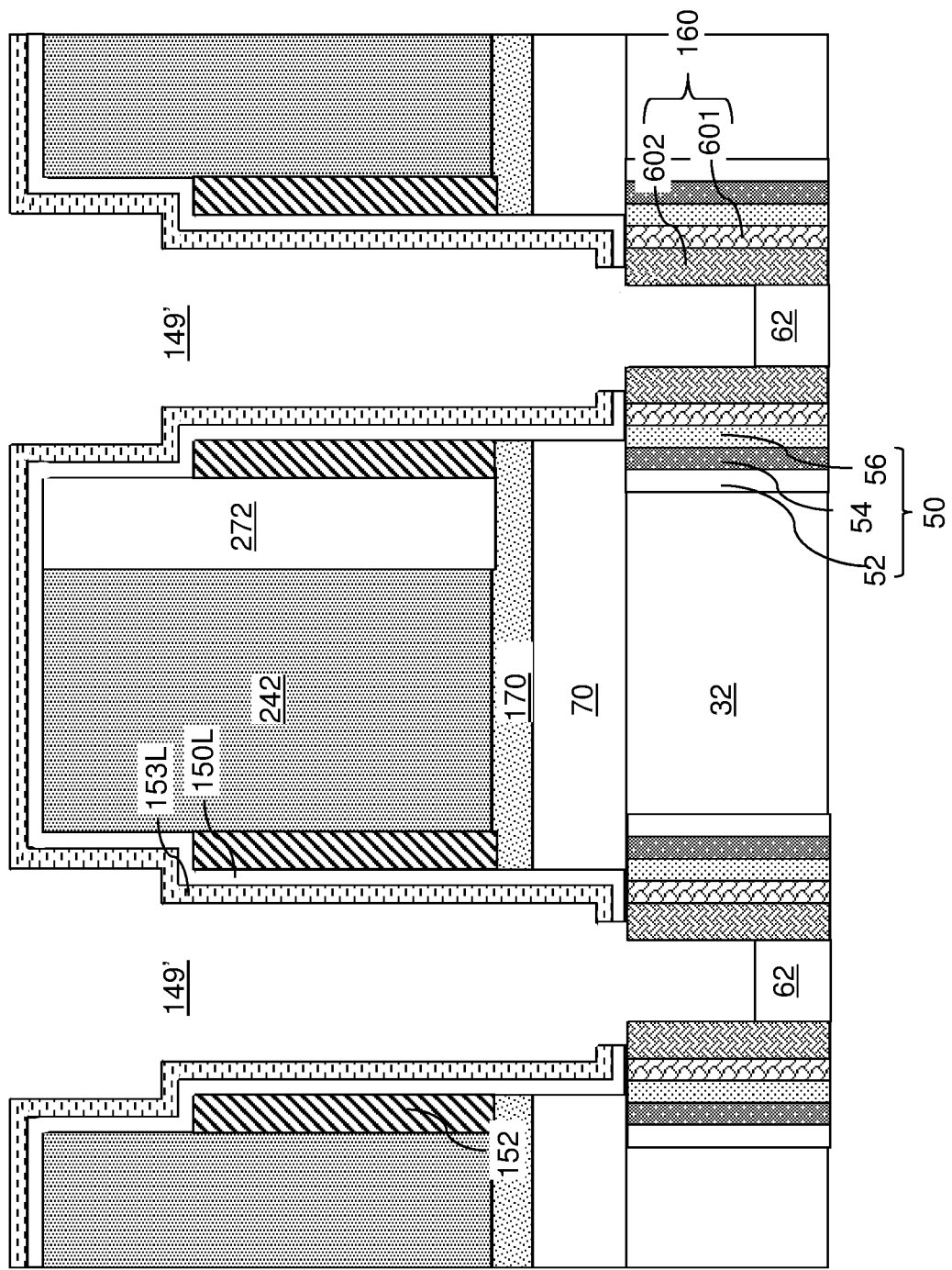

Referring to FIG. 10F, the sacrificial dielectric material portions 67 may be removed from underneath the drain-select-level cavities 149' selective to the materials of the word-line-level semiconductor channel portions 160, the cover semiconductor channel material layer 153L, the insulating cap layer 70, and the etch stop material layer 170 underneath the drain-select-level openings. For example, if the sacrificial dielectric material portions 67 include silicon nitride, a wet etch process using hot phosphoric acid may be used to remove the sacrificial dielectric material portions 67 selective to the materials of the word-line-level semiconductor channel portions 160, the cover semiconductor channel material layer 153L, the insulating cap layer 70, and the etch stop material layer 170.

Figure 10G:
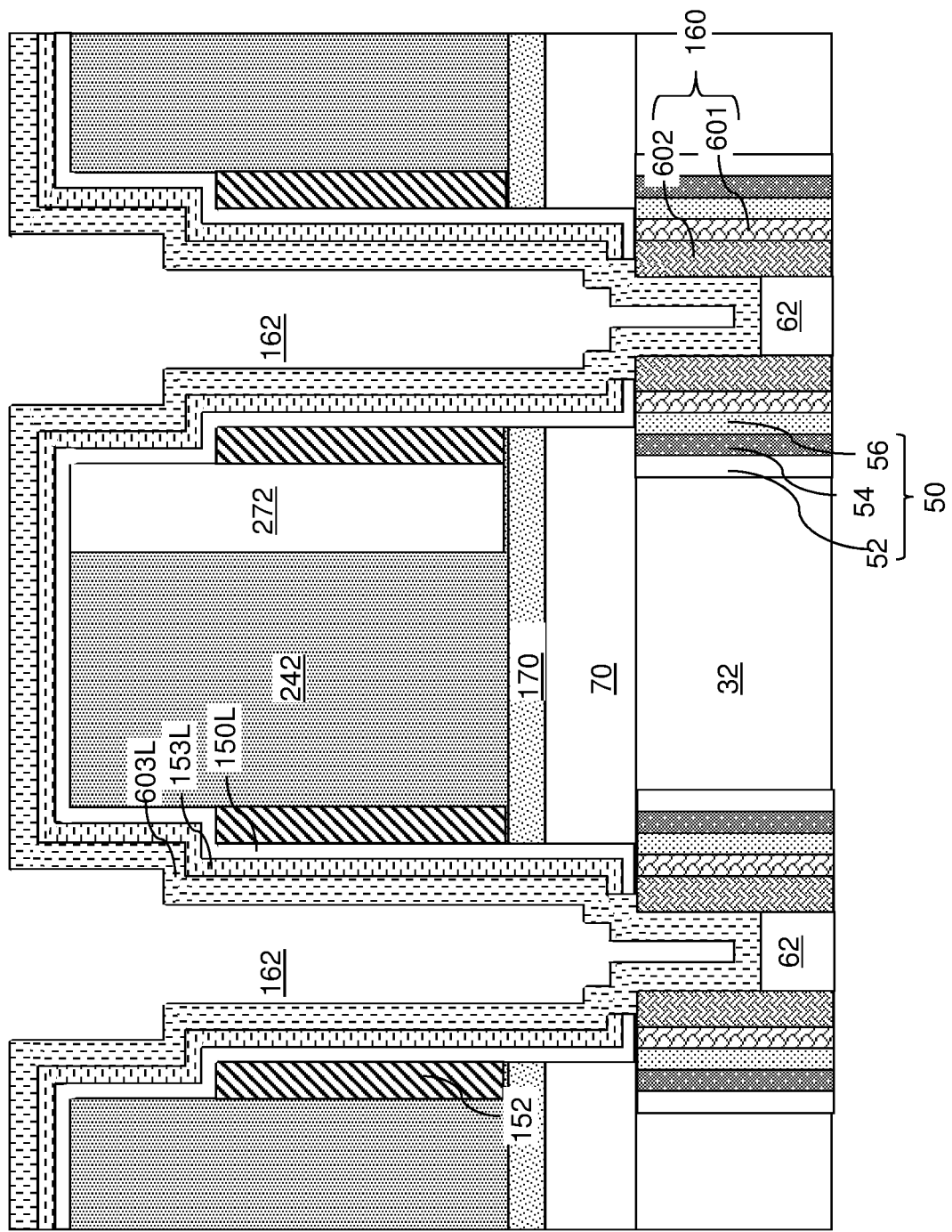

Referring to FIG. 10G, a drain-select-level semiconductor channel layer 603L may be deposited at the periphery of each drain-select-level cavity 149' by a conformal deposition process such as low pressure chemical vapor deposition (LPCVD). The drain-select-level semiconductor channel layer 603L may include any semiconductor material that may be used for the first semiconductor channel layer 601 or for the second semiconductor channel layer 602. The drain-select-level semiconductor channel layer 603L includes a semiconductor material having a doping of the first conductivity type. The drain-select-level semiconductor channel layer 603L is deposited directly on the inner sidewall of each word-line-level semiconductor channel portion 160, and may be formed on an annular top surface of each word-line-level semiconductor channel portion 160. The thickness of the drain-select-level semiconductor channel layer 603L may be in a range from 3 nm to 60 nm, such as from 6 nm to 30 nm, although lesser and greater thicknesses may also be used.

Figure 10H:
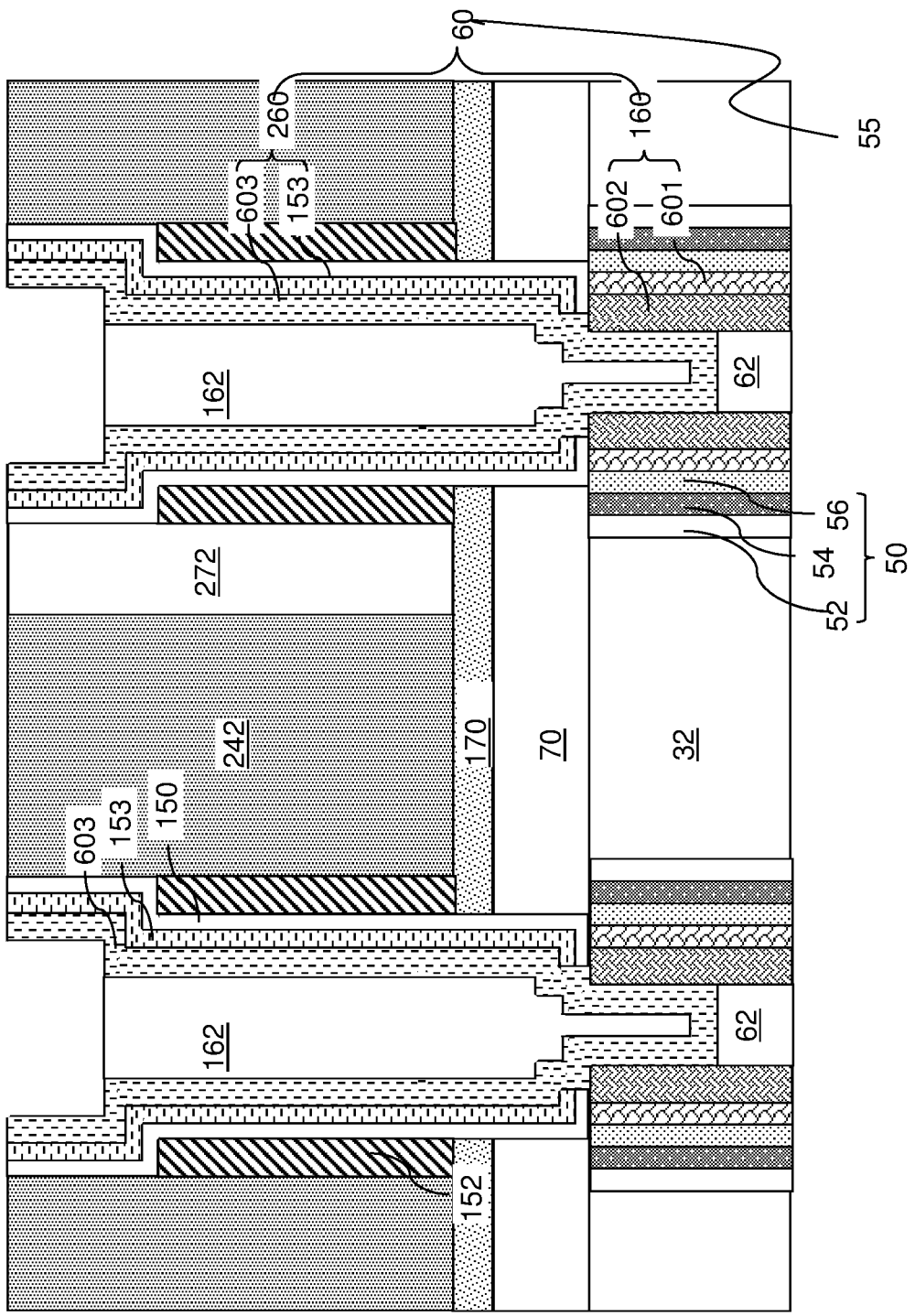

Referring to FIG. 10H, a drain-select-level dielectric core layer may be deposited in remaining volumes of the drain-select-level cavities 149'. The drain-select-level dielectric core layer may include a dielectric material such as silicon oxide or organosilicate glass. The drain-select-level dielectric core layer may be deposited by a conformal deposition method such as low pressure chemical vapor deposition (LPCVD), or by a self-planarizing deposition process such as spin coating. The material of the drain-select-level dielectric core layer may be recessed selective to the material of the drain-select-level semiconductor channel layer 603L below the horizontal plane including the top surface of the drain-select-level sacrificial material layer 242. An isotropic etch process or an anisotropic etch process may be used to recess the material of the drain-select-level dielectric core layer. Each remaining portion of the drain-select-level dielectric core layer may constitute a drain-select-level dielectric core 162.

Figure 10I:
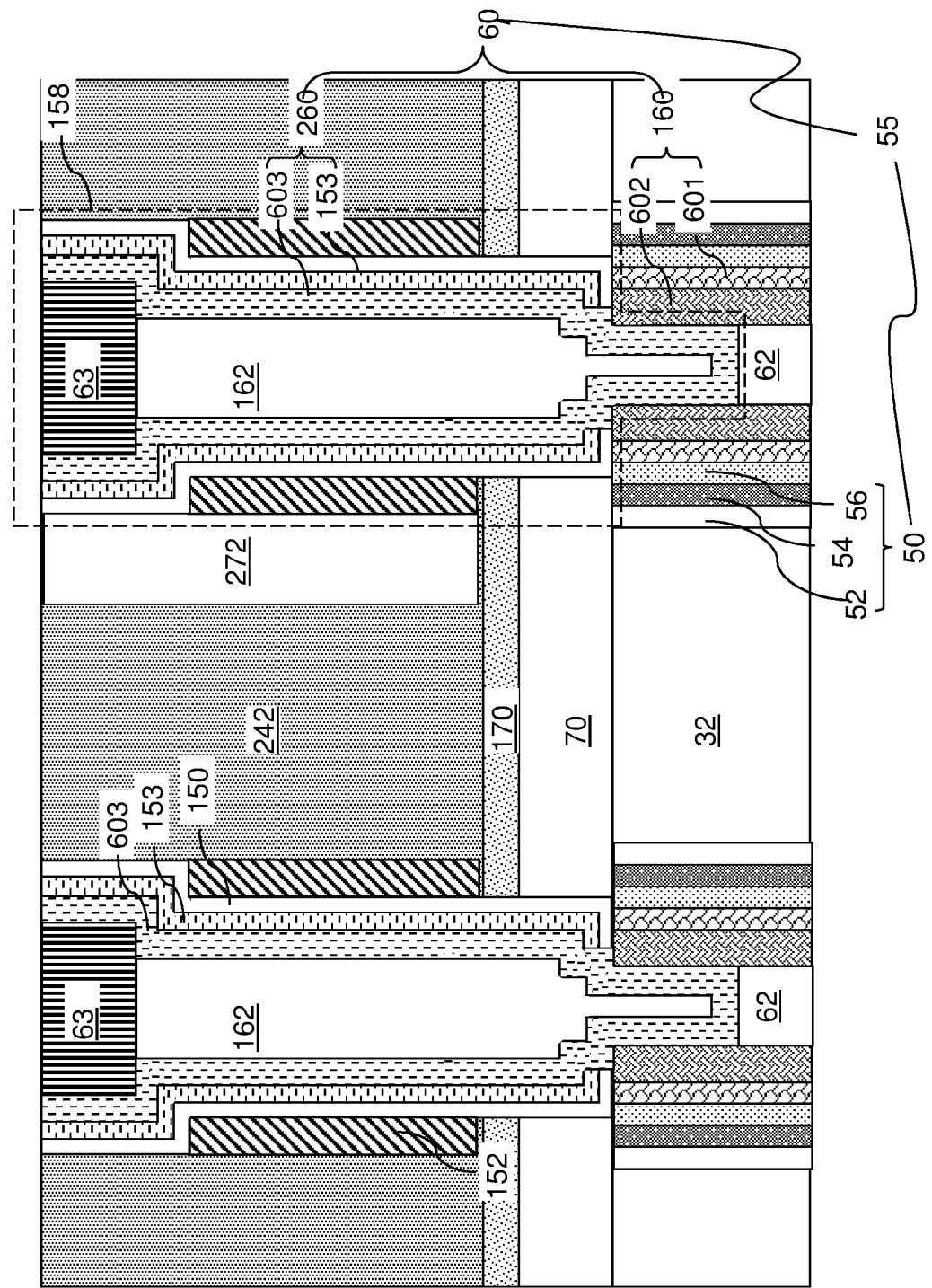

Referring to FIG. 10I, a heavily doped semiconductor material having a doping of the second conductivity type may be deposited in recessed volumes overlying the drain-select-level dielectric cores 162. A drain region 63 having a doping of the second conductivity type may be formed within a recess region overlying each drain-select-level dielectric core 162. Portions of the deposited doped semiconductor material having the doping of the second conductivity type, the drain-select-level semiconductor channel layer 603L, the cover semiconductor channel material layer 153L, and the gate dielectric layer 150L may be removed from above the horizontal plane including the top surface of the drain-select-level sacrificial material layer 242 by a planarization process. The planarization process may use chemical mechanical planarization (CMP) and/or a recess etch. Each remaining portion of the drain-select-level semiconductor channel layer 603L constitutes an outer drain-select-level semiconductor channel portion 603. Each remaining portion of the cover semiconductor channel material layer 153L constitutes an inner drain-select-level semiconductor channel portion 153. Each combination of an outer drain-select-level semiconductor channel portion 603 and an inner drain-select-level semiconductor channel portion 153 constitutes a drain-select-level semiconductor channel portion 260. Each remaining portions of the gate dielectric layer 150L constitutes a gate dielectric 150.

A cylindrical gate electrode 152 and a gate dielectric 150 may be formed within each drain-select-level opening 149. Each cylindrical gate electrode 152 may be formed at a periphery of a drain-select-level opening 149. Each gate dielectric 150 may be formed on an inner sidewall of the cylindrical gate electrode 152. Each drain-select-level semiconductor channel portion 260 may be formed directly on a word-line-level semiconductor channel portion 160, and directly on an inner sidewall of a gate dielectric 150. Each drain-select-level dielectric core 162 may be formed within a volume laterally surrounded by a drain-select-level semiconductor channel portion 260. Each drain region 63 may be formed at an upper end portion of the drain-select-level semiconductor channel portion 260. The drain regions 63 may have a doping of an opposite conductivity type than the drain-select-level semiconductor channel portions 260 and the word-line-level semiconductor channel portions 160.

The set of all elements within a memory opening as expanded by the processing steps of FIG. 10F constitutes a drain-select-level pillar structure 158. Each vertical stack of a memory opening fill structure 58 and a drain-select-level pillar structure 158 constitutes a memory pillar structure (58, 158).

Each drain-select-level pillar structure 158 may overlie a memory opening fill structure 58. Each drain-select-level pillar structure 158 may include a cylindrical gate electrode 152, a gate dielectric 150, and a drain-select-level semiconductor channel portion 260, a drain-select-level dielectric core 162, and a drain region 63. Because each drain-select-level semiconductor channel portion 260 may be formed in the volume formed by removal of a sacrificial dielectric material portion 67, each vertical interface between the drain-select-level semiconductor channel portion 260 and the word-line-level semiconductor channel portion 160 may be vertically coincident with an interface between the word-line-level semiconductor channel portion 160 and the word-line-level dielectric core 62.

The insulating cap layer 70 overlies the alternating stack (32, 42). A vertical interface between the drain-select-level semiconductor channel portion 260 and the insulating cap layer 70 may be laterally offset from the vertical interface between the word-line-level semiconductor channel portion 160 and the word-line-level dielectric core 62 within each vertical stack of a memory opening fill structure 58 and drain-select-level pillar structure 158. A portion of the drain-select-level semiconductor channel portion 260 laterally surrounded by the insulating cap layer 70 has a greater lateral extent than a portion of the drain-select-level semiconductor channel layer 260 laterally surrounded by the word-line-level semiconductor channel portion 160.

The etch stop material layer 170 overlies the insulating cap layer 70. A portion of the drain-select-level semiconductor channel portion 260 laterally surrounded by the etch stop material layer 170 has a lesser lateral extent than the portion of the drain-select-level semiconductor channel portion 260 laterally surrounded by the insulating cap layer 70. The gate dielectric 150 and the cylindrical gate electrode 152 are vertically spaced from the word-line-level semiconductor channel portion 160 by the insulating cap layer 70 and the etch stop material layer 170 for each vertical stack of a memory opening fill structure 58 and drain-select-level pillar structure 158.

The etch stop material layer 170 underlies the cylindrical gate electrode 152. A region of the drain-select-level dielectric core 162 underlying the etch stop material layer 170 (and laterally surrounded by the insulating cap layer 70) has a greater lateral extent than a region of the drain-select-level dielectric core 162 that is laterally surrounded by the etch stop material layer 170.

Figure 10J:
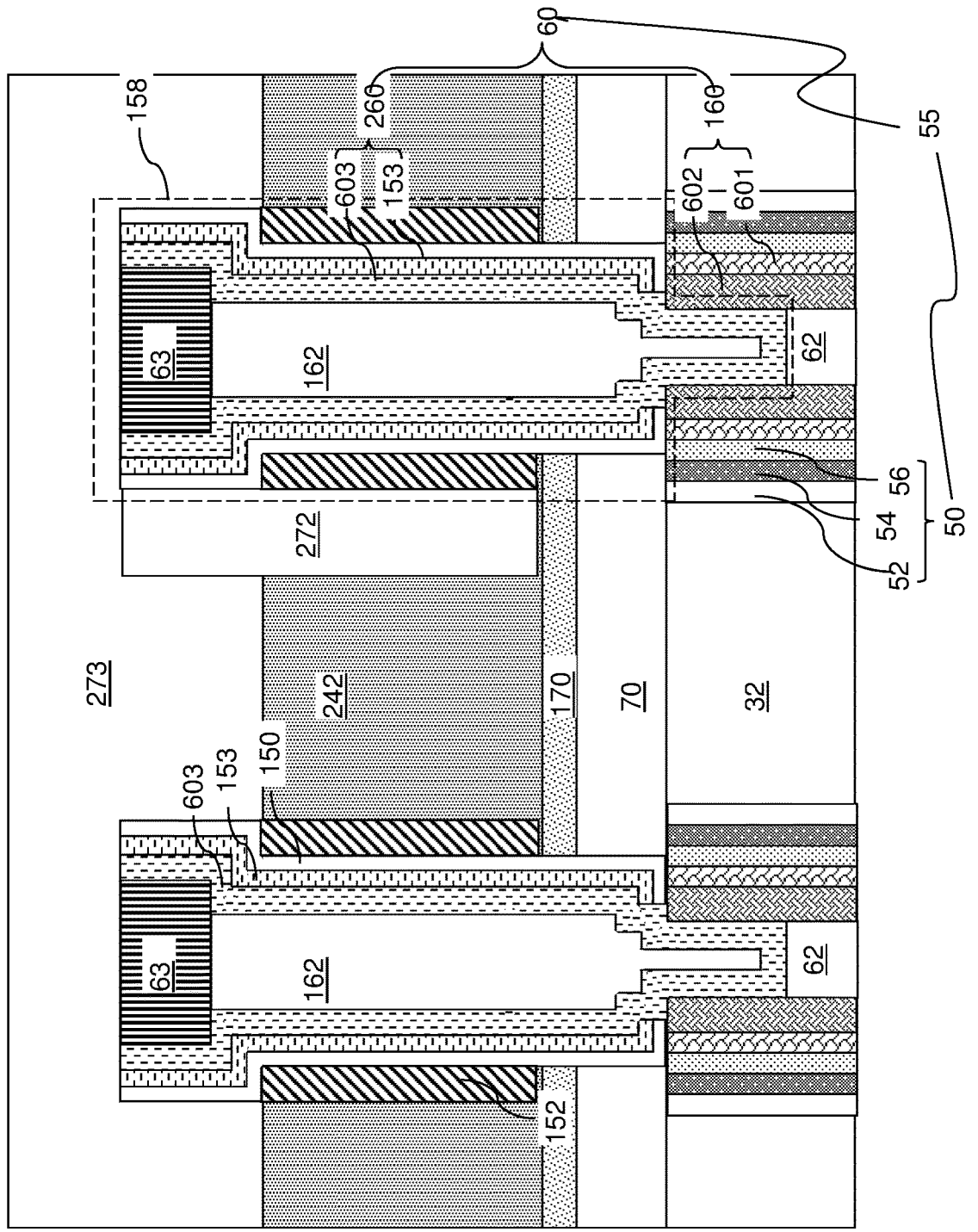
Figure 11A:
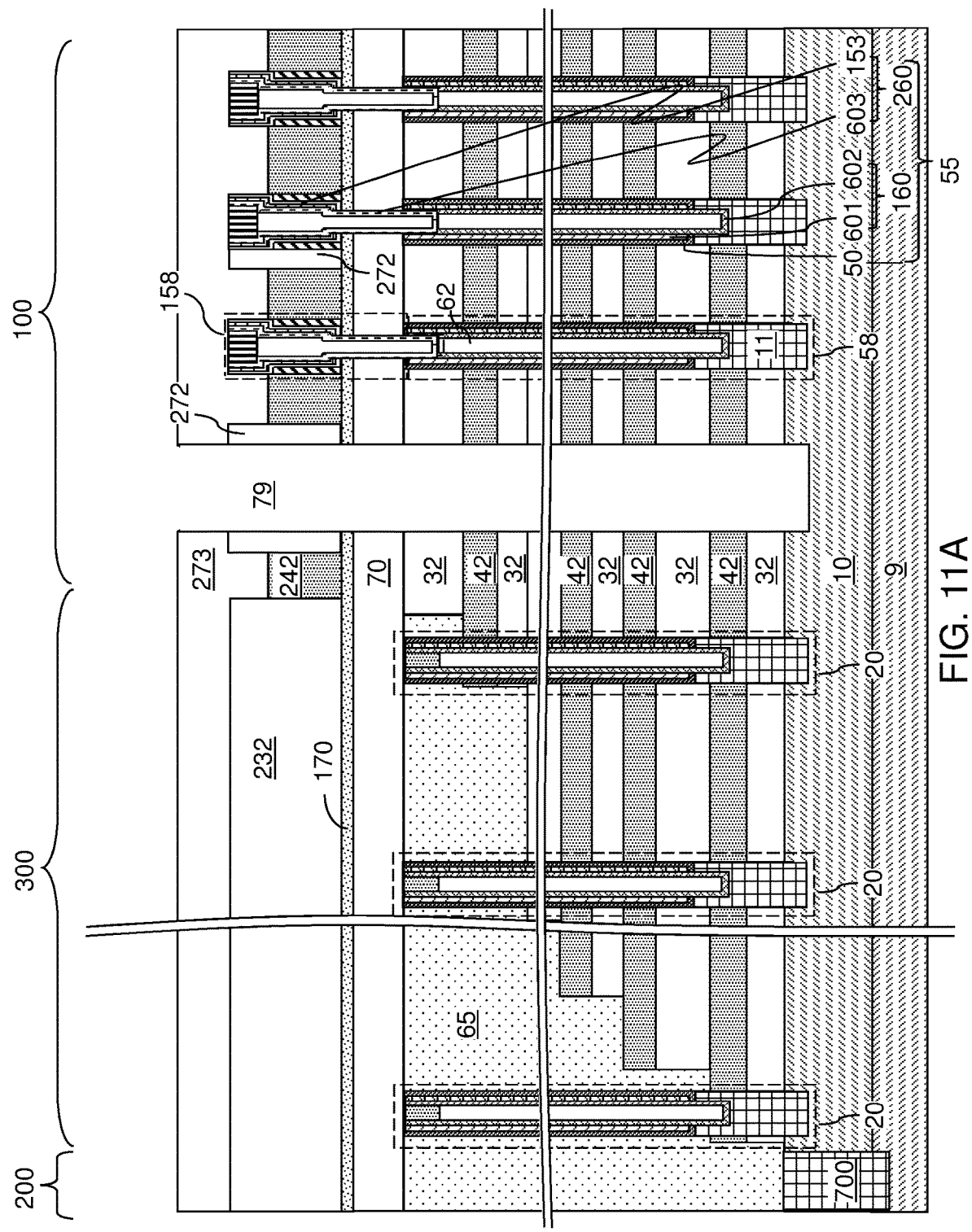
FIG. 11A is a vertical cross-sectional view of the exemplary structure after recessing the drain-select-level sacrificial material layer and formation of a sacrificial cover material layer and backside trenches according to an embodiment of the present disclosure.
Figure 11B:
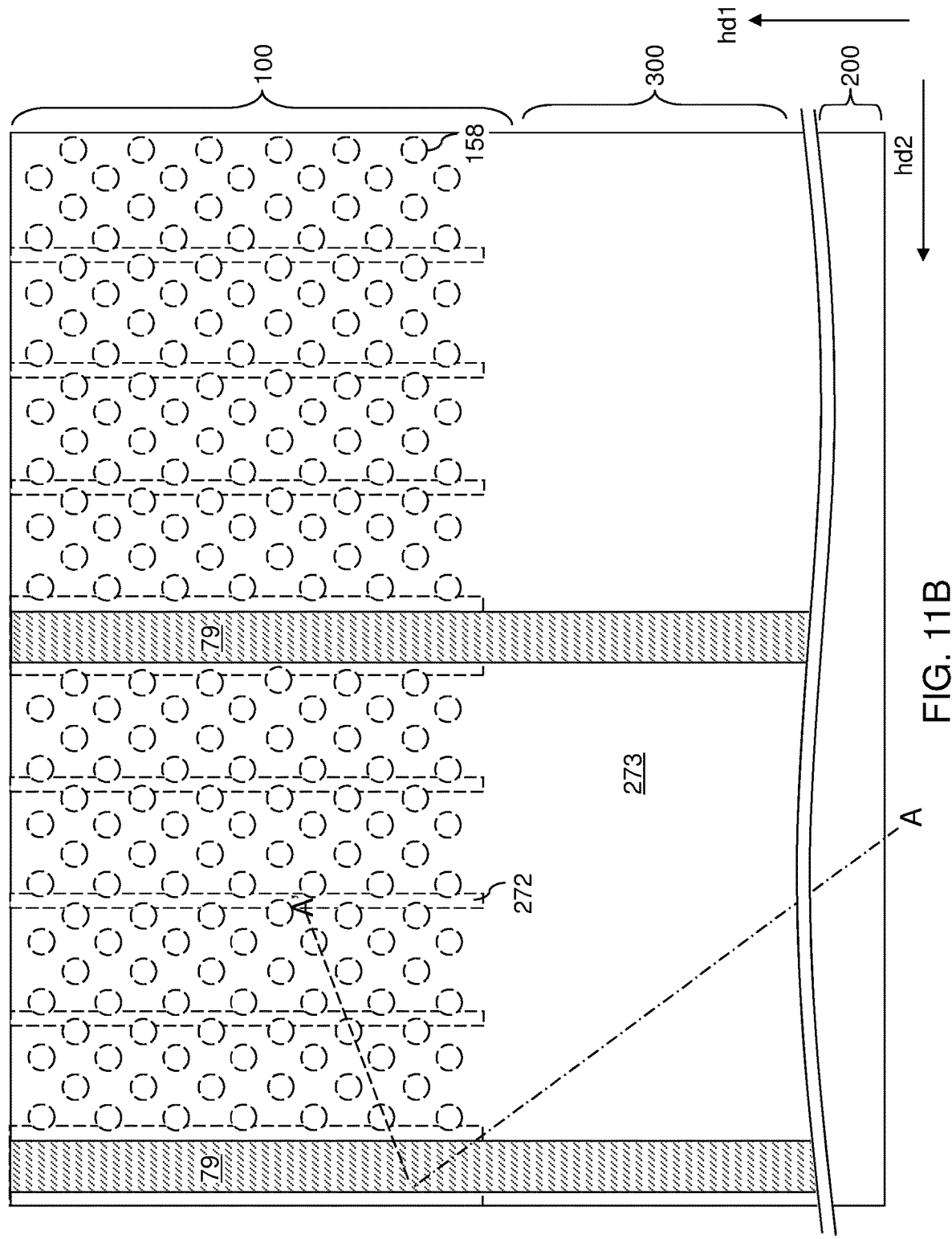
FIG. 11B is a top-down view of the exemplary structure of FIG. 11A. The hinged vertical plane A-A' is the plane of the schematic vertical cross-sectional view of FIG. 11A.

Referring to FIGS. 10J, 11A, and 11B, the drain-select-level sacrificial material layer 242 may be vertically recessed by a recess etch that is selective to the materials of the drain regions 63, the drain-select-level semiconductor channel portions 260, and the gate dielectrics 150. For example, if the drain-select-level sacrificial material layer 242 includes silicon nitride, the drain-select-level sacrificial material layer 242 may be recessed by a wet etch process using hot phosphoric acid. The duration of the wet etch process may be selected such that a recessed horizontal surface of the drain-select-level sacrificial material layer 242 is located between a horizontal plane including topmost surfaces of the cylindrical gate electrodes 152 and between a horizontal plane including bottom surfaces of the drain regions 63.

A sacrificial cover material layer 273 may be formed over the drain regions 63. The sacrificial cover material layer 273 includes a dielectric material that is different from the dielectric material of the drain-select-level sacrificial material layer 242. For example, the sacrificial cover material layer 273 may include silicon oxide. The sacrificial cover material layer 273 may be formed by a self-planarizing process such as spin coating, or may be planarized after deposition, for example, by chemical mechanical planarization. The sacrificial cover material layer 273 may have a thickness in a range from 50 nm to 500 nm above each drain region 63, although lesser and greater thicknesses may also be used.

A photoresist layer (not shown) may be applied over the sacrificial cover material layer 273, and may be lithographically patterned to form openings in areas between clusters of drain-select-level pillar structures 158. The pattern in the photoresist layer may be transferred through the sacrificial cover material layer 273, the alternating stack (32, 42) and/or the retro-stepped dielectric material portion 65 using an anisotropic etch to form backside trenches 79, which vertically extend from the top surface of the sacrificial cover material layer 273 at least to the top surface of the substrate (9, 10), and laterally extend through the memory array region 100 and the contact region 300. Each backside trench 79 may be formed through a respective one of the drain-select-level isolation structures 272. Thus, each portion of the drain-select-level sacrificial material layer 242 may be encapsulated within the sacrificial cover material layer 273, the etch stop dielectric layer 170, the dielectric isolation layer 232, a respective subset of the drain-select-level isolation structures 272, and a respective subset of the drain-select-level pillar structures 158. Thus, all surfaces of the drain-select-level sacrificial material layer 242 are covered by a dielectric material that protects the drain-select-level sacrificial material layer 242 during a subsequent isotropic etch process.

In one embodiment, the backside trenches 79 may laterally extend along a first horizontal direction hd1 and may be laterally spaced apart one from another along a second horizontal direction hd2 that is perpendicular to the first horizontal direction hd1. The drain-select-level pillar structures 158 (and underlying memory opening fill structures 58) may be arranged in rows that extend along the first horizontal direction hd1. The drain-select-level isolation structures 272 may laterally extend along the first horizontal direction hd1. Each backside trench 79 may have a uniform width that is invariant along the lengthwise direction (i.e., along the first horizontal direction hd1). In one embodiment, the backside trenches 79 may include a source contact opening in which a source contact via structure may be subsequently formed. The photoresist layer may be removed, for example, by ashing.

Figure 12:
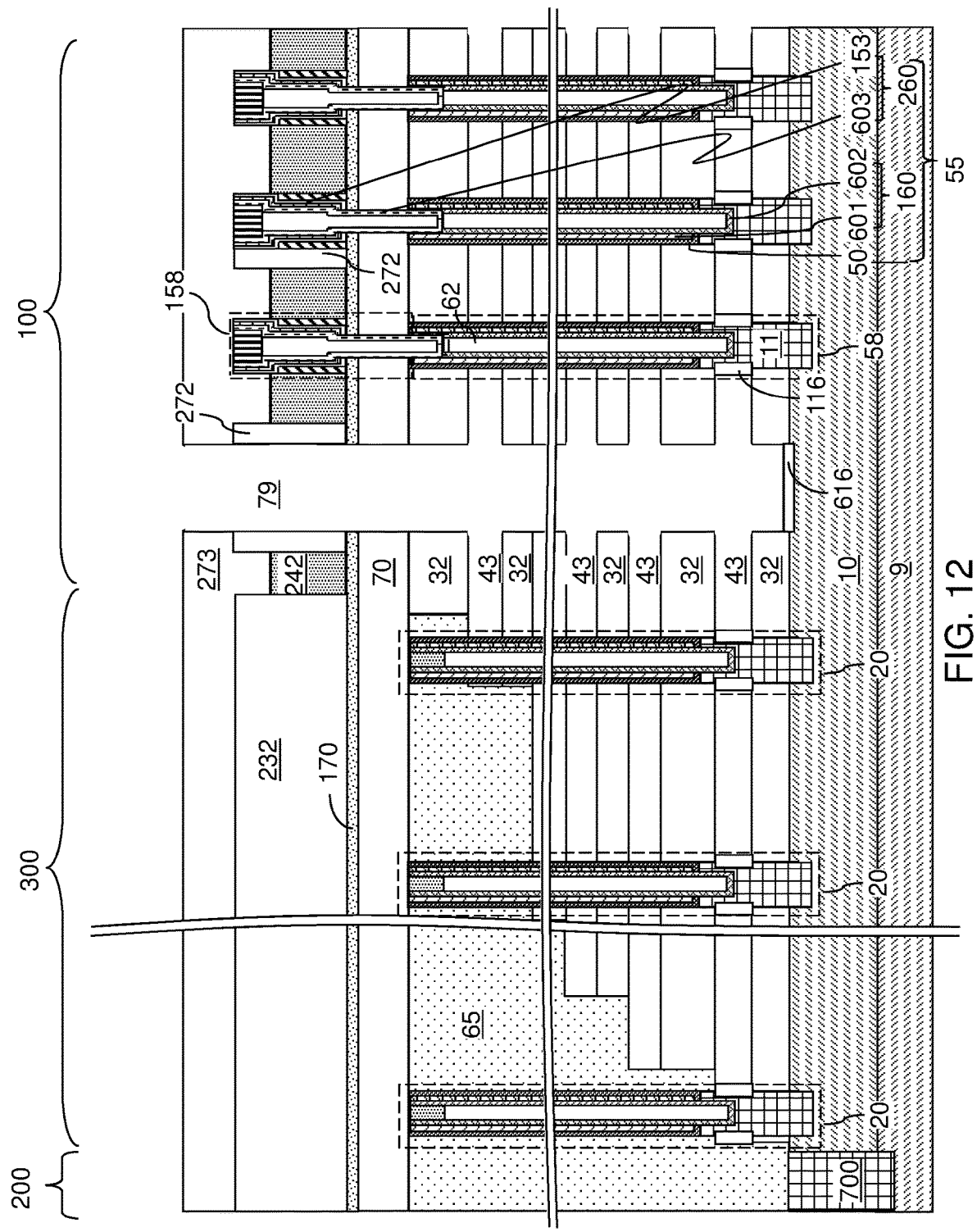
FIG. 12 is a schematic vertical cross-sectional view of the exemplary structure after formation of backside recesses according to an embodiment of the present disclosure.

Referring to FIGS. 12 and 13A, an etchant that selectively etches the second material of the sacrificial material layers 42 with respect to materials of the first material of the insulating layers 32, the insulating cap layer 70, the etch stop material layer 170, and the sacrificial cover material layer 273 may be introduced into the backside trenches 79 using an isotropic etch process. FIG. 13A illustrates a region of the exemplary structure of FIG. 12. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the materials of the insulating cap layer 70, the etch stop material layer 170, and the sacrificial cover material layer 273, the semiconductor material of the semiconductor material layer 10, and the material of the outermost layer of the memory films 50. In one embodiment, the sacrificial material layers 42 may include silicon nitride, and the materials of the insulating layers 32, the retro-stepped dielectric material portion 65, the insulating cap layer 70, the etch stop material layer 170, and the sacrificial cover material layer 273 may be selected from silicon oxide and dielectric metal oxides.

In one embodiment, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and memory opening fill structures 58, and the drain-select-level pillar structures 158 provide structural support while the backside recesses 43 and the drain-select-level backside recesses are present within volumes previously occupied by the sacrificial material layers 42 and the drain-select-level sacrificial material layer 242, respectively.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. In one embodiment, the memory array region 100 comprises an array of monolithic three-dimensional NAND strings having a plurality of device levels disposed above the substrate (9, 10). In such embodiments, each backside recess 43 may define a space for receiving a respective word line of the array of monolithic three-dimensional NAND strings. Each drain-select-level backside recess defines a space for receiving a respective drain-select-level gate electrode.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout. Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 13B, a backside blocking dielectric layer 44 may be optionally formed. The backside blocking dielectric layer 44, if present, comprises a dielectric material that functions as a control gate dielectric for the control gates to be subsequently formed in the backside recesses 43. In embodiments in which the blocking dielectric layer 52 is present within each memory opening, the backside blocking dielectric layer 44 is optional. In embodiments in which the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory opening fill structures 58 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory opening fill structures 58 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 13C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 14:
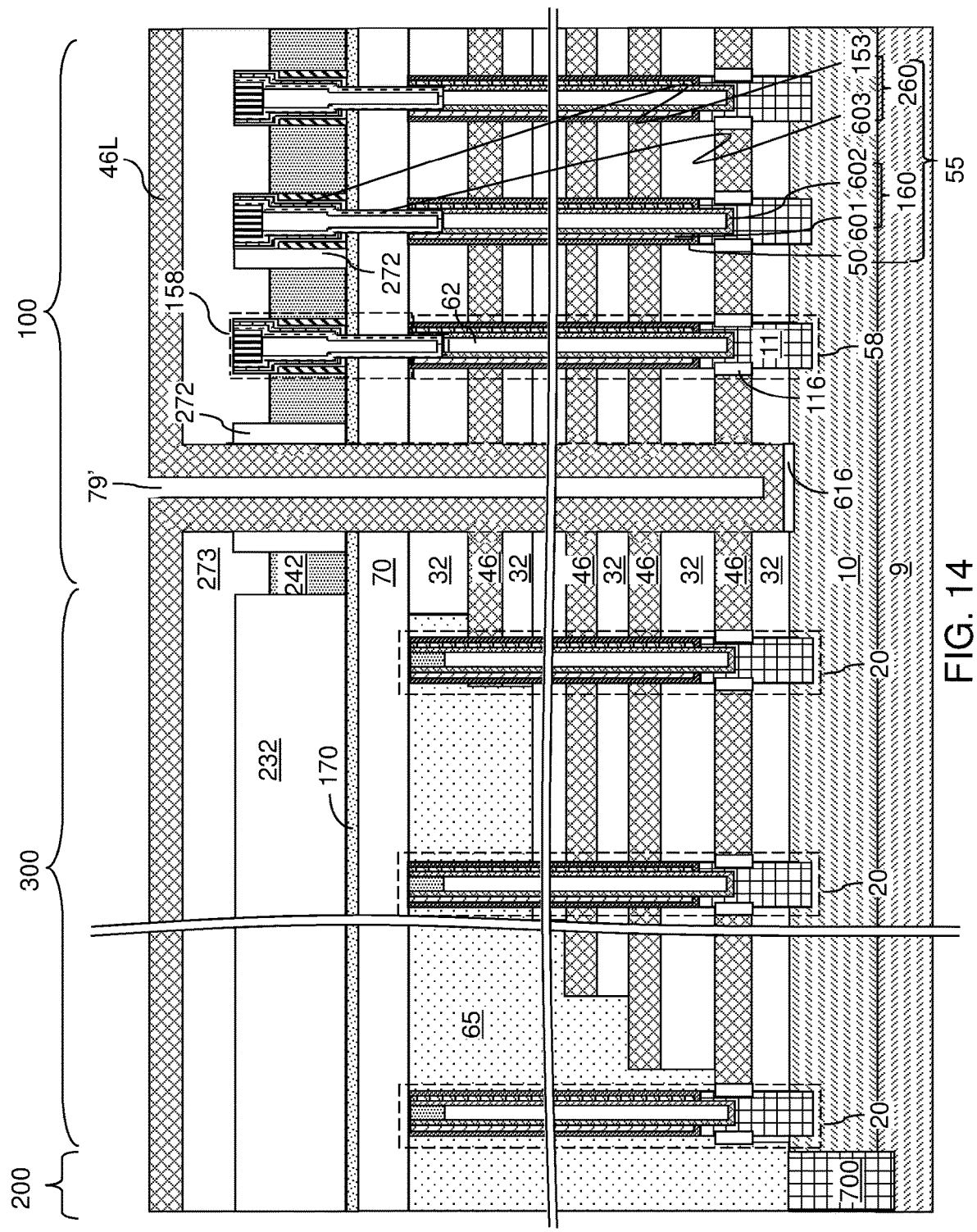
FIG. 14 is a schematic vertical cross-sectional view of the exemplary structure at the processing step of FIG. 13D.

Referring to FIGS. 13D and 14, a metal fill material may be deposited in the plurality of backside recesses 43, on the sidewalls of the at least one the backside trench 79, and over the top surface of the sacrificial cover material layer 273 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough.

A plurality of word-line-level electrically conductive layers 46 may be formed in the plurality of backside recesses 43, and a continuous metallic material layer 46L may be formed on the sidewalls of each backside trench 79 and over the sacrificial cover material layer 273. Each word-line-level electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the sacrificial cover material layer 273.

Each sacrificial material layer 42 may be replaced with a word-line-level electrically conductive layer 46. A backside cavity 79' may be present in the portion of each backside trench 79 that is not filled with the backside blocking dielectric layer 44 and the continuous metallic material layer 46L. A tubular dielectric spacer 116 may laterally surround a pedestal channel portion 11. A bottommost word-line-level electrically conductive layer 46 laterally surrounds each tubular dielectric spacer 116 upon formation of the word-line-level electrically conductive layers 46. Each combination of a word-line-level semiconductor channel portion 160 and a drain-select-level semiconductor channel portion 260 constitutes a vertical semiconductor channel (160, 260). Each combination of a memory film 50, a word-line-level semiconductor channel portion 160, and a drain-select-level semiconductor channel portion 260 constitutes a memory stack structure 55 that includes a vertical stack of memory elements and a vertical semiconductor channel (160, 260).

Figure 15:
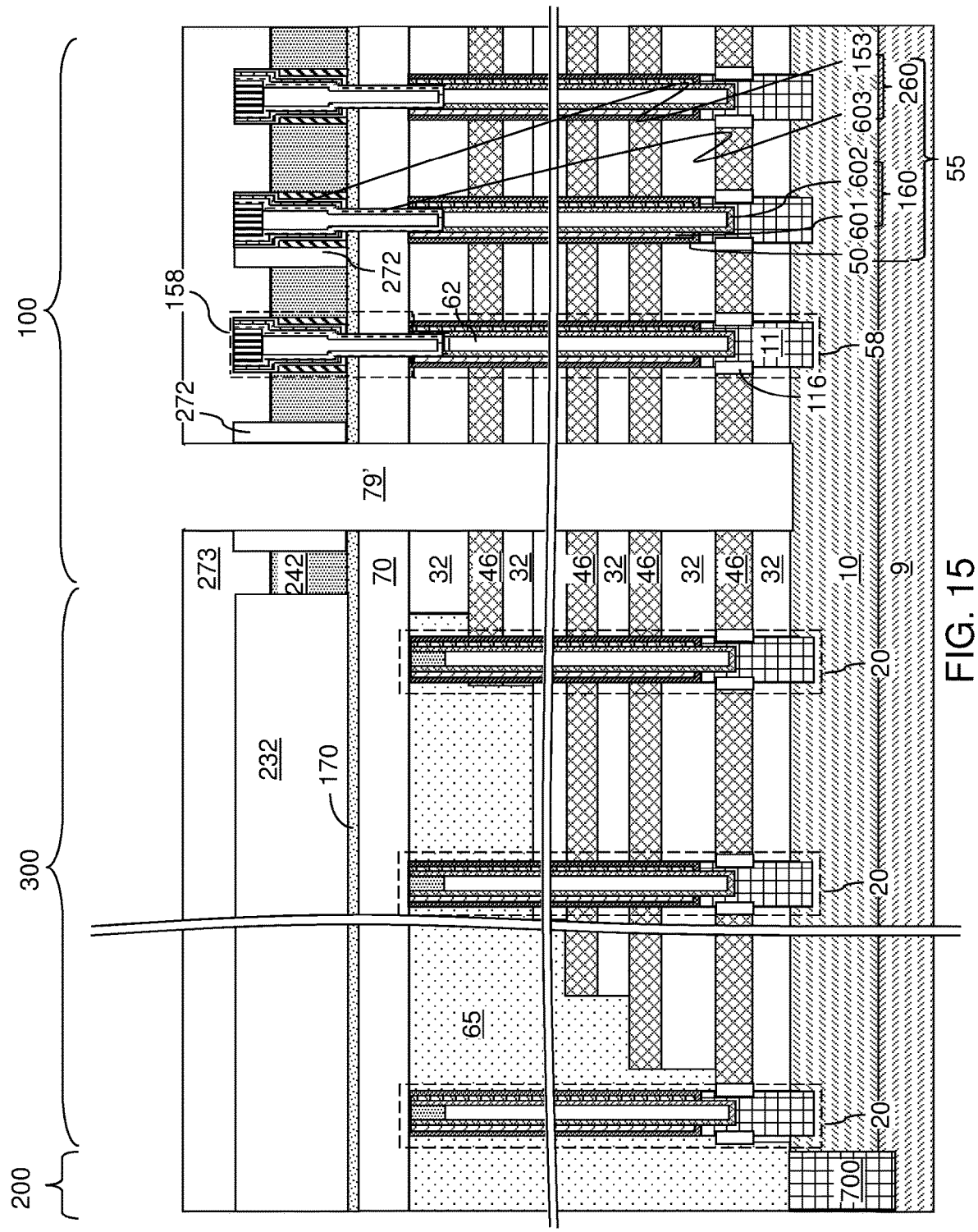
FIG. 15 is a schematic vertical cross-sectional view of the exemplary structure after removal of a deposited conductive material from within the backside trench according to an embodiment of the present disclosure.

Referring to FIG. 15, the deposited metallic material of the continuous metallic material layer 46L may be etched back from the sidewalls of each backside trench 79 and from above the sacrificial cover material layer 273, for example, by an isotropic wet etch, an anisotropic dry etch, or a combination thereof. Each remaining discrete portion of the deposited metallic material in the backside recesses 43 constitutes a word-line-level electrically conductive layer 46. Each word-line-level electrically conductive layer 46 may be a conductive line structure. Thus, the sacrificial material layers 42 may be replaced with the word-line-level electrically conductive layers 46.

Each word-line-level electrically conductive layer 46 may function as a combination of a plurality of control gate electrodes located at a same level and a word line electrically interconnecting, i.e., electrically connecting, the plurality of control gate electrodes located at the same level. The plurality of control gate electrodes within each word-line-level electrically conductive layer 46 may be the control gate electrodes for the vertical memory devices including the memory stack structures 55. In other words, each word-line-level electrically conductive layer 46 may be a word line that functions as a common control gate electrode for the plurality of vertical memory devices.

In one embodiment, the removal of the continuous metallic material layer 46L may be selective to the material of the backside blocking dielectric layer 44. In such embodiments, a horizontal portion of the backside blocking dielectric layer 44 may be present at the bottom of each backside trench 79. In another embodiment, the removal of the continuous metallic material layer 46L may not be selective to the material of the backside blocking dielectric layer 44 or, the backside blocking dielectric layer 44 may not be used. The planar dielectric portions 616 may be removed during removal of the continuous metallic material layer 46L. A backside cavity 79' is present within each backside trench 79.

Figure 16A:
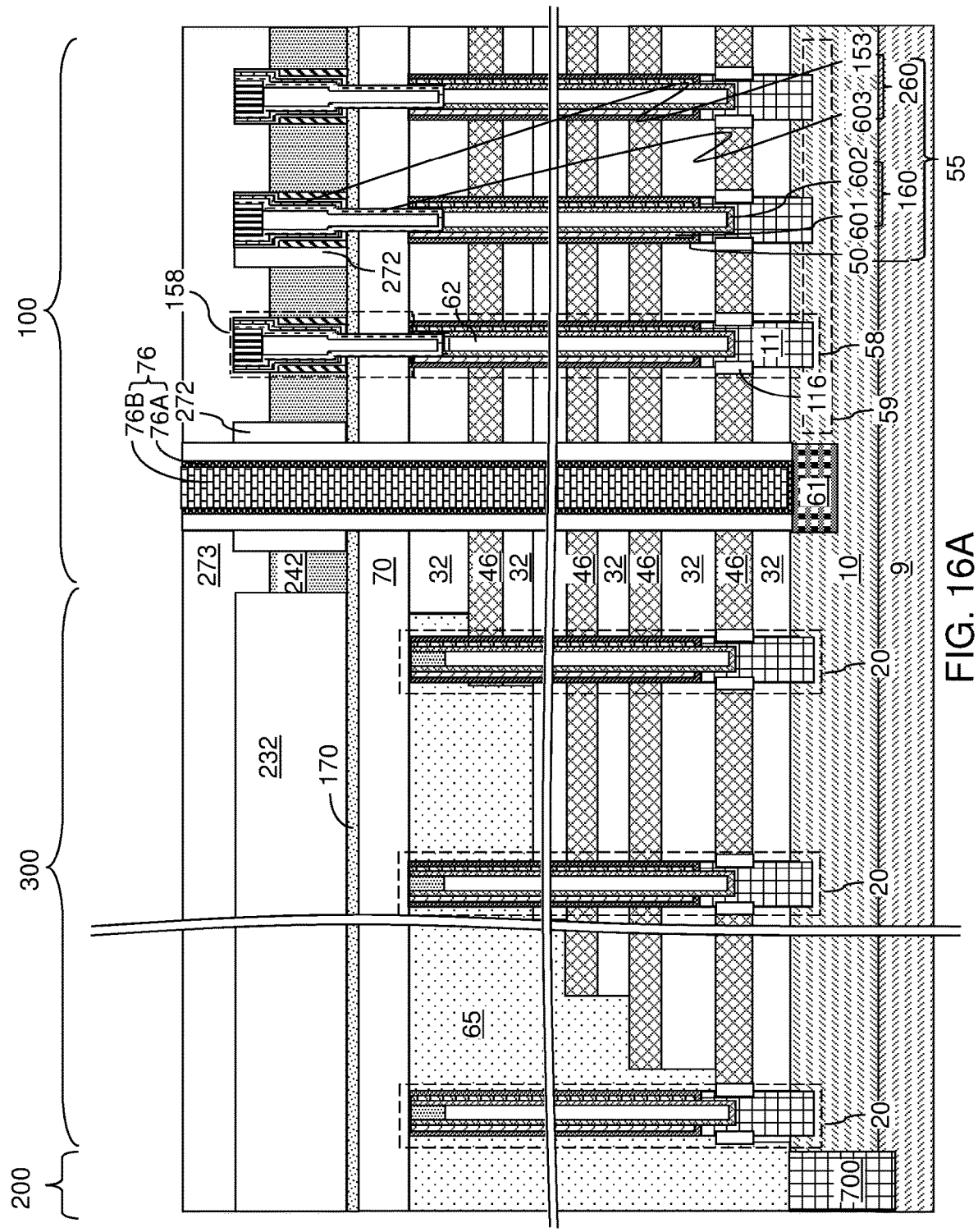
FIG. 16A is a schematic vertical cross-sectional view of the exemplary structure after formation of an insulating spacer and a backside contact structure according to an embodiment of the present disclosure.
Figure 16B:
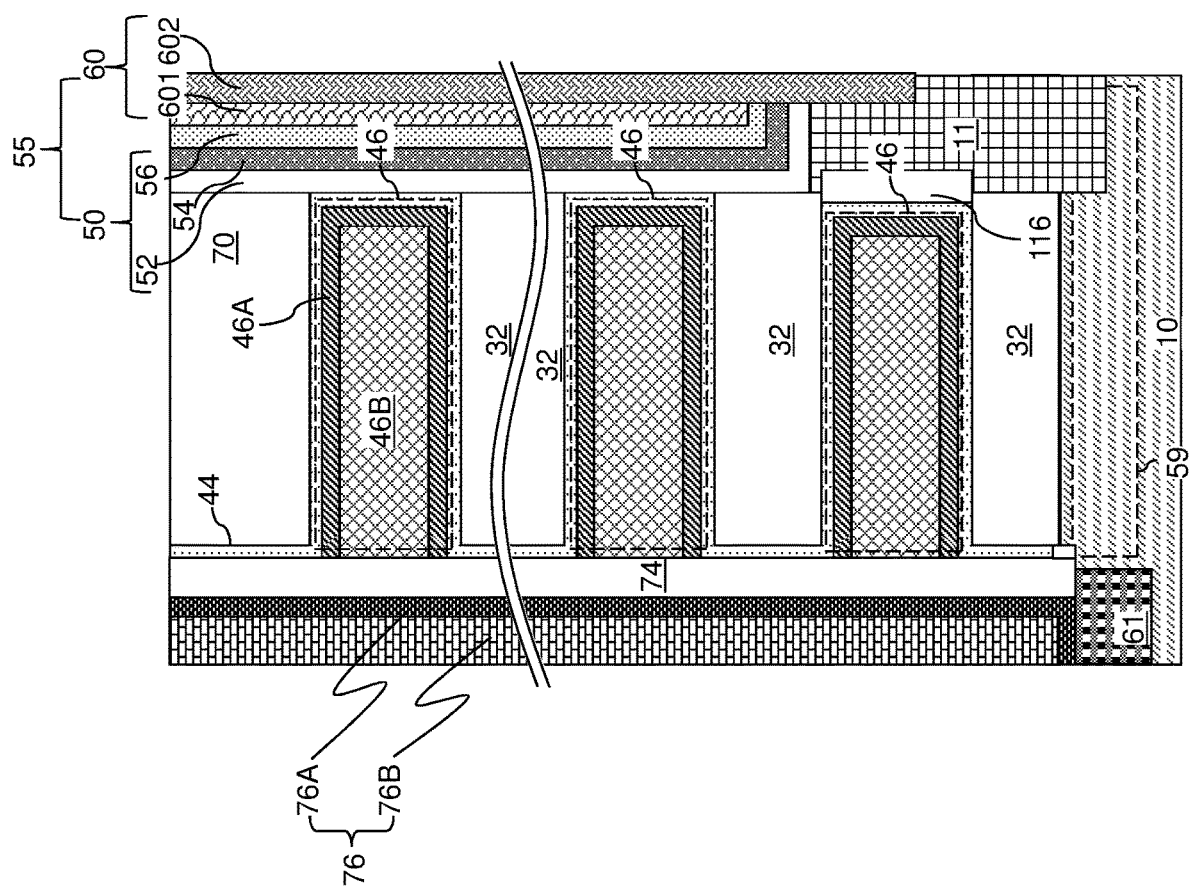
FIG. 16B is a magnified view of a region of the exemplary structure of FIG. 16A.

Referring to FIGS. 16A and 16B, an insulating material layer may be formed in the backside trenches 79 and over the sacrificial cover material layer 273 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

In embodiments in which a backside blocking dielectric layer 44 is present, the insulating material layer may be formed directly on surfaces of the backside blocking dielectric layer 44 and directly on the sidewalls of the word-line-level electrically conductive layers 46. In embodiments in which a backside blocking dielectric layer 44 is not used, the insulating material layer may be formed directly on sidewalls of the insulating layers 32 and directly on sidewalls of the word-line-level electrically conductive layers 46.

An anisotropic etch may be performed to remove horizontal portions of the insulating material layer from above the sacrificial cover material layer 273 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 may be connected to multiple vertical semiconductor channels (160, 260) through respective pedestal channel portions 11. The horizontal semiconductor channel 59 may contact the source region 61 and the plurality of pedestal channel portions 11. A bottommost word-line-level electrically conductive layer 46 provided upon formation of the word-line-level electrically conductive layers 46 within the alternating stack (32, 46) may comprise a select gate electrode for the field effect transistors. Each source region 61 may be formed in an upper portion of the substrate (9, 10). Semiconductor channels (59, 11, 160, 260) may extend between each source region 61 and a respective set of drain regions 63. The semiconductor channels (59, 11, 160, 260) include the vertical semiconductor channels (160, 260) of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the sacrificial cover material layer 273 as a stopping layer. If chemical mechanical planarization (CMP) process is used, the sacrificial cover material layer 273 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. In embodiments in which a backside blocking dielectric layer 44 is used, the backside contact via structure 76 may contact a sidewall of the backside blocking dielectric layer 44.

Figure 17:
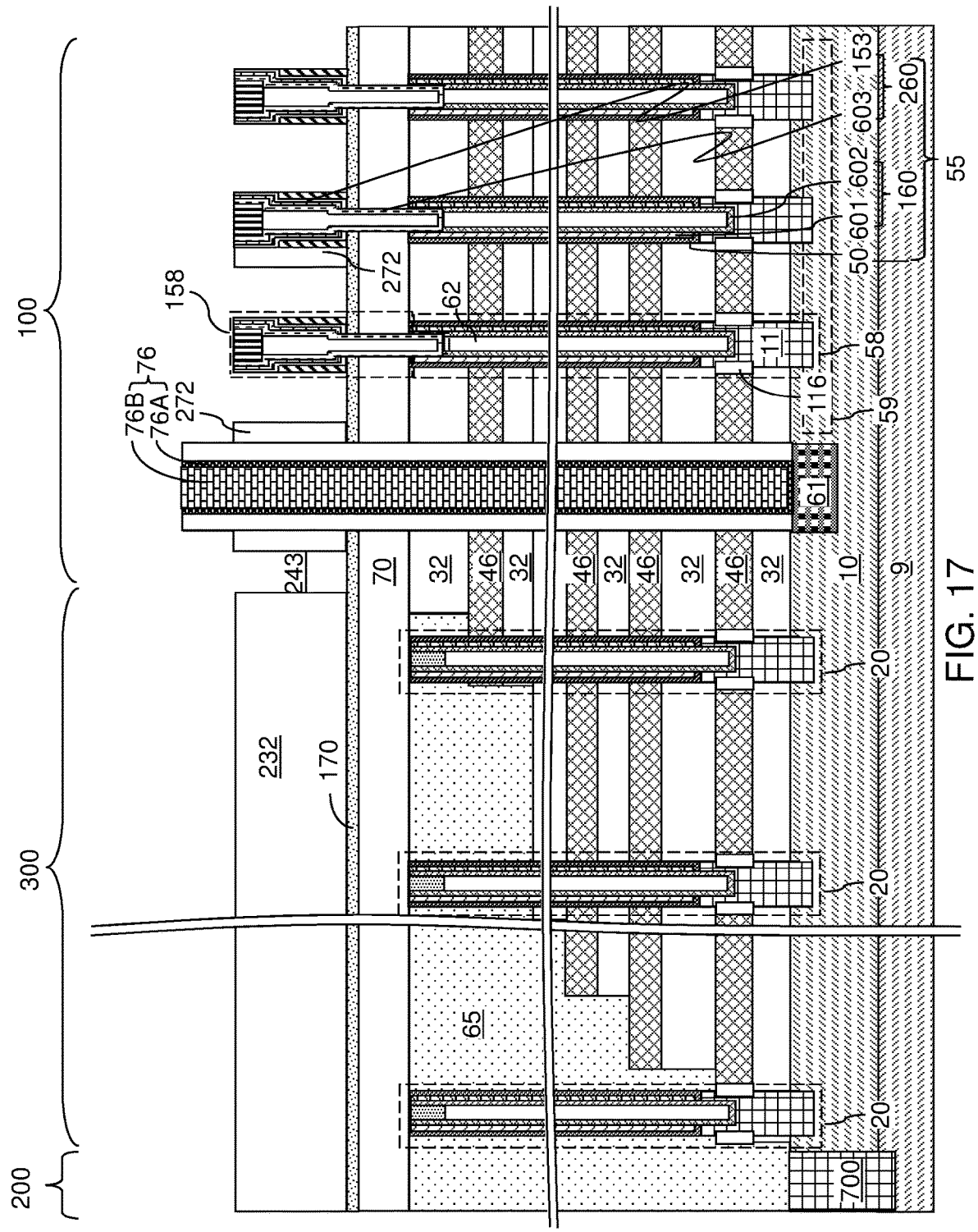
FIG. 17 is a schematic vertical cross-sectional view of the exemplary structure after removal of the sacrificial cover material layer and the drain-select-level sacrificial material layer and formation of inter-pillar gap regions according to an embodiment of the present disclosure.
Figure 18A:
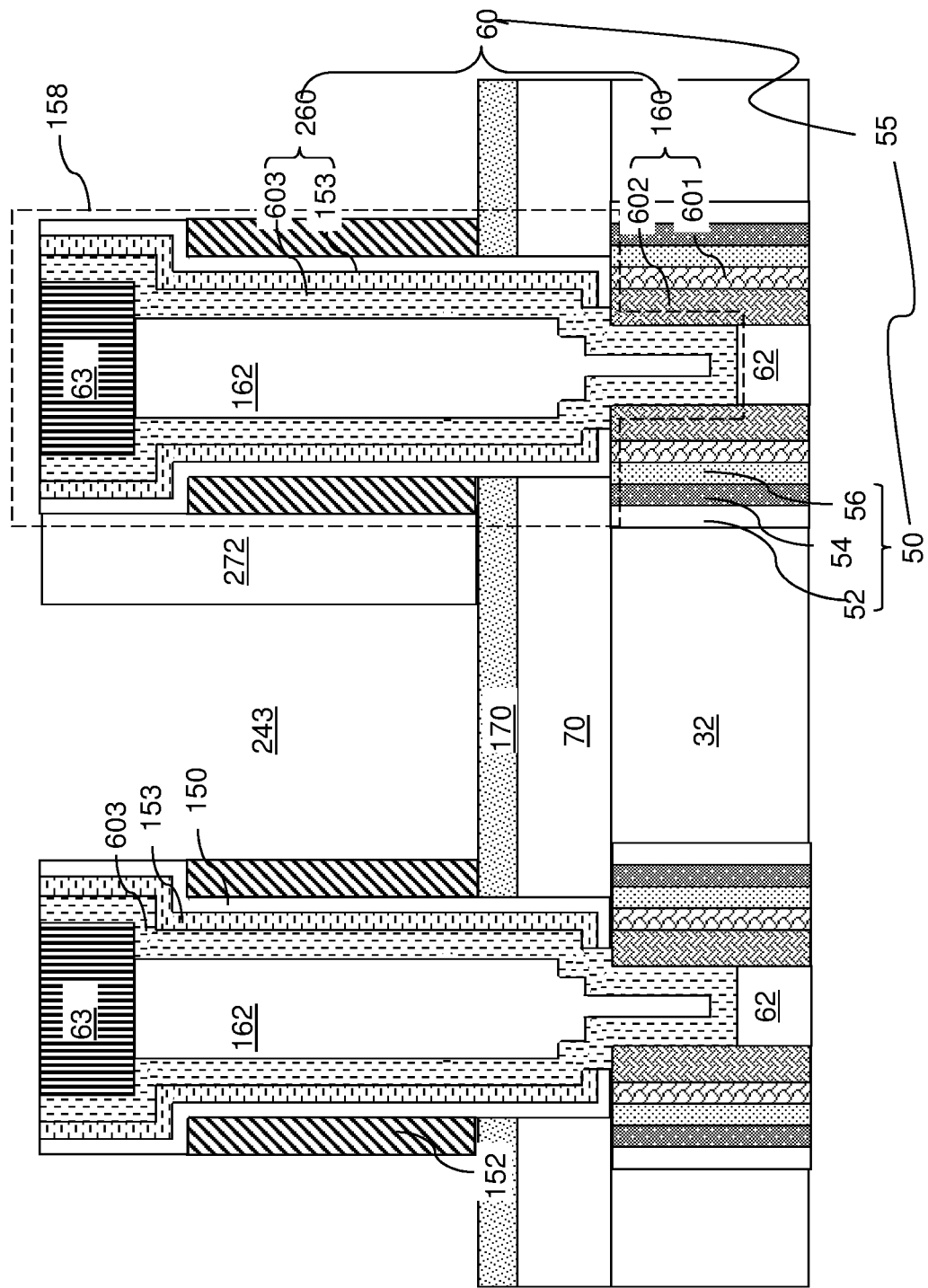
FIGS. 18A-18E are sequential magnified views of a region of the exemplary structure during formation of a drain-select-level electrically conductive layer in a first configuration according to an embodiment of the present disclosure.

Referring to FIGS. 17 and 18A, the sacrificial cover material layer 273 may be removed selective to the dielectric isolation layer 232 and the drain-select-level isolation structures 272 by an etch process. For example, if the sacrificial cover material layer 273 includes organosilicate glass or borosilicate glass and if the dielectric isolation layer 232 and the drain-select-level isolation structures 272 include undoped silicate glass, a wet etch process using hydrofluoric acid may be used to remove the sacrificial cover material layer 273 selective to the dielectric isolation layer 232 and the drain-select-level isolation structures 272. Subsequently, the drain-select-level sacrificial material layer 242 may be removed selective to the dielectric isolation layer 232 and the drain-select-level isolation structures 272. If the drain-select-level sacrificial material layer 242 includes silicon nitride, a wet etch process using hot phosphoric acid may be used. If the drain-select-level sacrificial material layer 242 includes a semiconductor material such as amorphous silicon, a wet etch process using hot trimethyl-2 hydroxyethyl ammonium hydroxide ("hot TMY") or tetramethyl ammonium hydroxide (TMAH) may be used.

An inter-pillar gap region 243 may be formed between portions of the memory pillar structures (58, 158) that protrude above the top surface of the etch stop dielectric layer 170. Each of the memory pillar structures (58, 158) may include a vertical stack of a memory opening fill structure 58 and a drain-select-level pillar structure 158. The memory pillar structures (58, 158) extend through an alternating stack of insulating layers 32 and word-line-level electrically conductive layers 46. Each of the memory pillar structures (58, 158) comprises a vertical semiconductor channel 60 and a memory film 50 in contact with the vertical semiconductor channel 60. Each of the memory pillar structures (58, 158) protrudes above the insulating cap layer 70 that is located above the alternating stack (32, 46). The protruding portions of the memory pillar structures (58, 158) provide the inter-pillar gap region 243 throughout. The inter-pillar gap region 243 laterally extends between laterally-neighboring pairs of the memory pillar structures (58, 158).

Figure 18B:
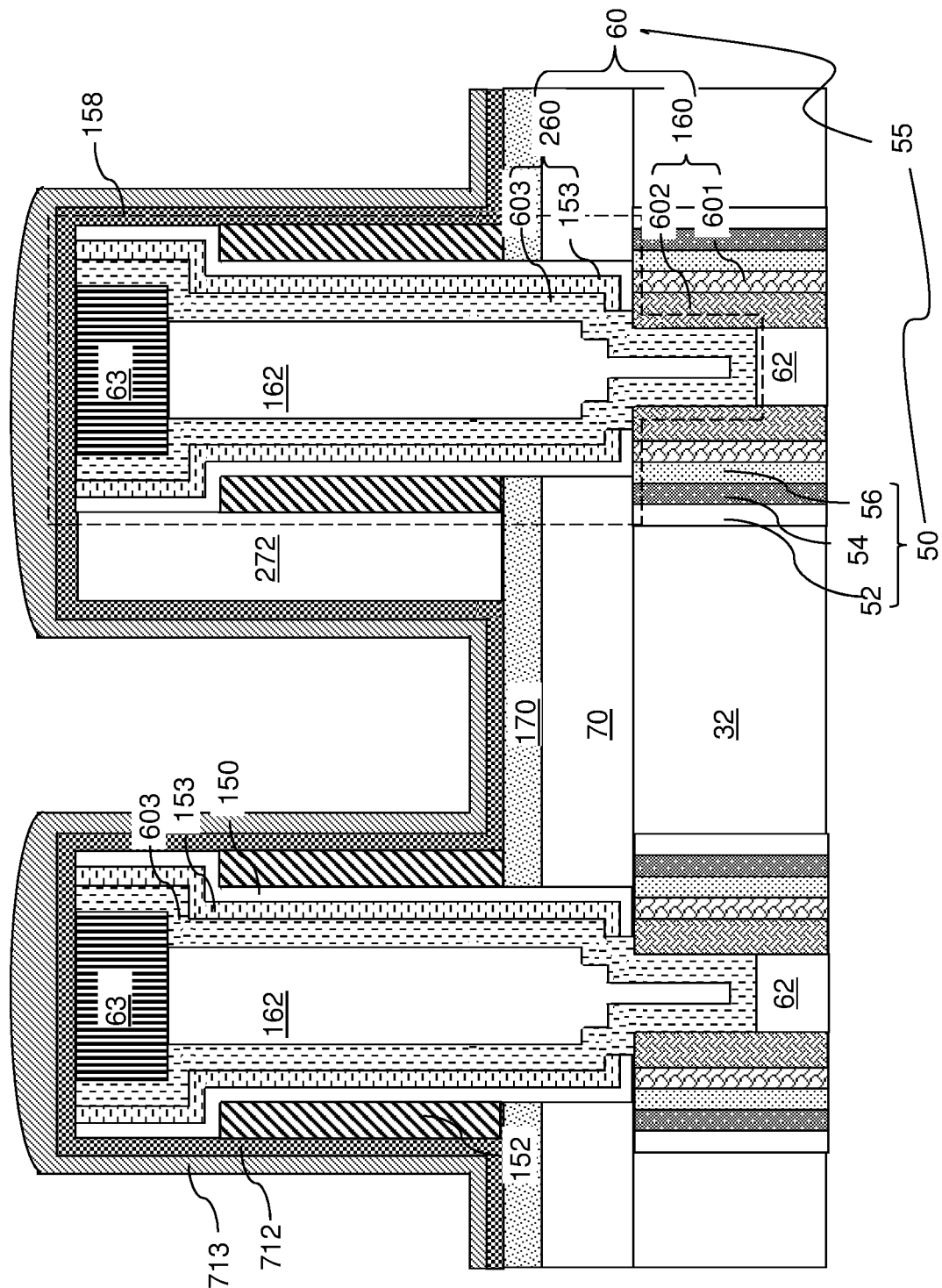

Referring to FIG. 18B, a metallic nitride liner 712 may be conformally deposited on the physically exposed surfaces of the etch stop dielectric layer 170 and the drain-select-level pillar structures 158. The metallic nitride liner 712 may be deposited on a bottom surface of the inter-pillar gap region 243, on the sidewalls of the memory pillar structures (58, 158), and on the top surfaces of the memory pillar structures (58, 158). The metallic nitride liner 712 may include, and/or may consist of, at least one conductive metallic nitride material such as TiN, TaN, and/or WN. The metallic nitride liner 712 may be deposited by a conformal deposition process such as chemical vapor deposition or atomic layer deposition. The thickness of the metallic nitride liner 712 may be in a range from 2 nm to 20 nm, such as from 4 nm to 10 nm, although lesser and greater thicknesses may also be used.

A metal-nucleating material may be conformally deposited on the metallic nitride liner 712 by a conformal deposition process such as chemical vapor deposition. As used herein, a "metal-nucleating material" refers to a material on which an elemental metal may be directly deposited without using a nucleation process that relies on formation of a compound including the elemental metal and any other element. For example, deposition of tungsten on a dielectric surface may first form an interfacial layer including a silicon-tungsten compound, a germanium-tungsten compound, or a boron-tungsten compound. Thus, a dielectric surface is not a metal-nucleating material for tungsten. However, tungsten may be deposited directly on silicon-tungsten compound, a germanium-tungsten compound, or a boron-tungsten compound. As such, tungsten may be deposited directly on a silicon-tungsten compound, a germanium-tungsten compound, or a boron-tungsten compound. As such, the silicon-tungsten compound, the germanium-tungsten compound, and the boron-tungsten compound are metal-nucleating materials for tungsten. It is understood that metal-nucleating materials are defined with respect to a metal. Thus, a metal-nucleating material for a first metal may not be a metal-nucleating material for a second metal, and vice versa.

A continuous layer of the metal-nucleating material that is formed on the metallic nitride liner 712 is herein referred to as a conformal metal-nucleating material layer 713. The conformal metal-nucleating material layer 713 may be formed at the bottom of the inter-pillar gap region 243, over sidewalls of the memory pillar structures (58, 158), and over top surfaces of the memory pillar structures (58, 158) as a continuous material layer without a hole therethrough. The conformal metal-nucleating material layer 713 may include a metal having a de-wetting property upon anneal, i.e., a metal having a tendency to form a ball and does not spread out to wet an underlying surface. In one embodiment, the conformal metal-nucleating material layer 713 may include, and/or may consist essentially of, cobalt. In one embodiment, the conformal metal-nucleating material layer 713 may have a partially rounded or curved top surface, as shown in FIG. 18B.

Figure 18C:
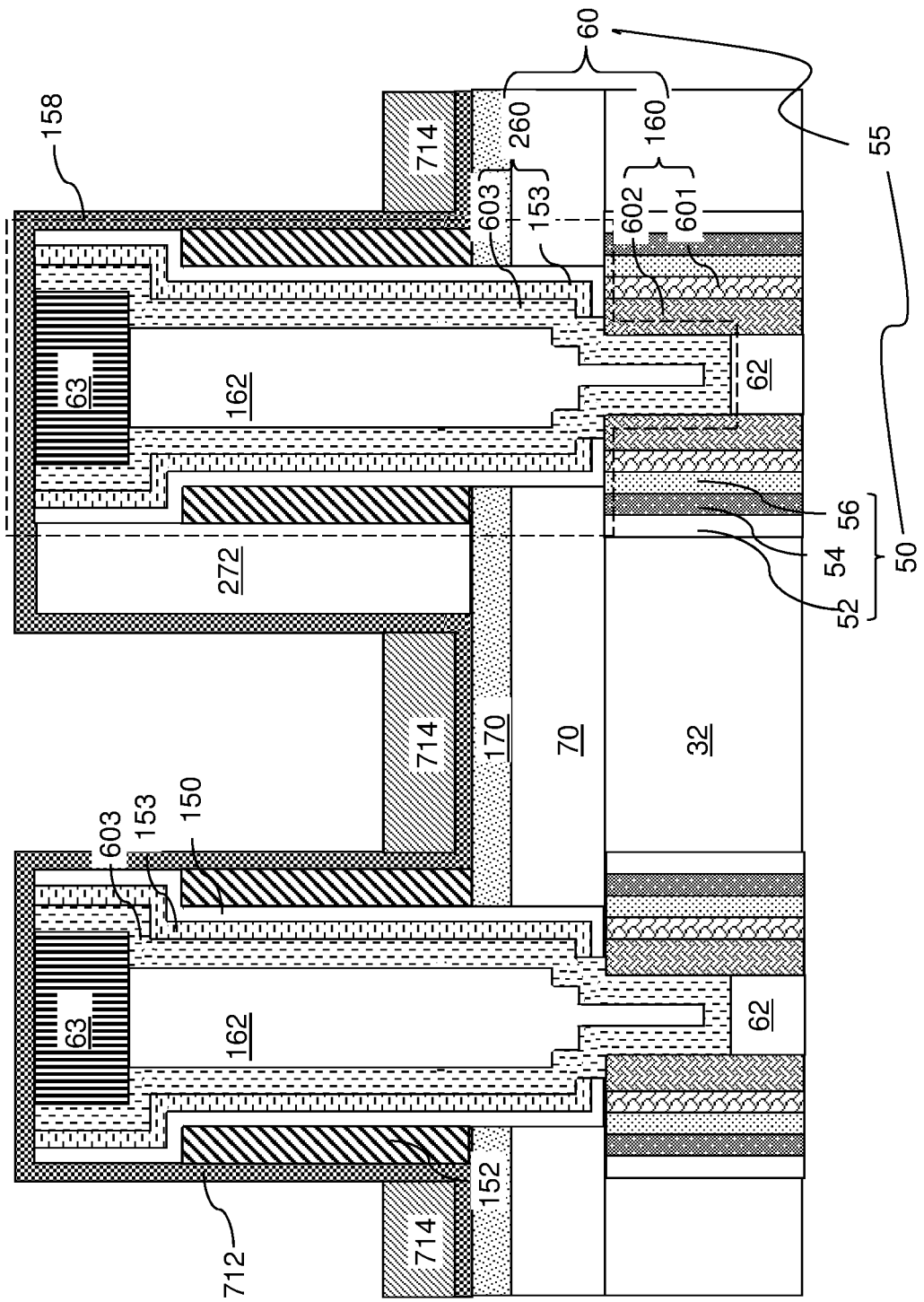

Referring to FIG. 18C, an anneal is performed at an elevated temperature that is lower than the melting temperature of the elemental metal of the conformal metal-nucleating material layer 713. For example, the elemental metal of the conformal metal-nucleating material layer 713 and the elevated temperature may be in a range from 600 degrees Celsius to 1,050 degrees Celsius. The anneal at the elevated temperature may induce thermal migration of the metal-nucleating material in the conformal metal-nucleating material layer 713. The partially rounded or curved top surface of the conformal metal-nucleating material layer 713 may facilitate the thermal migration. The metal-nucleating material may be removed from above the top surfaces of the memory pillar structures (58, 158) and forms planar metal-nucleating material layers 714 having a respective planar top surface located below a horizontal plane including top surfaces of the memory pillar structures (58, 158). Each planar metal-nucleating material layer 714 may be laterally bounded by the dielectric isolation layer 232 and a respective subset of the drain-select-level isolation structures 272. A metal-nucleating material having a physically exposed metal-nucleating surface is formed at a bottom of the inter-pillar gap region 243 without covering upper portions of sidewalls of the memory pillar structures (58, 158) with the metal-nucleating material. In one embodiment, the top surface of each planar metal-nucleating material layer 714 may be located below a horizontal plane including top surfaces of the cylindrical gate electrodes 152.

Figure 18D:
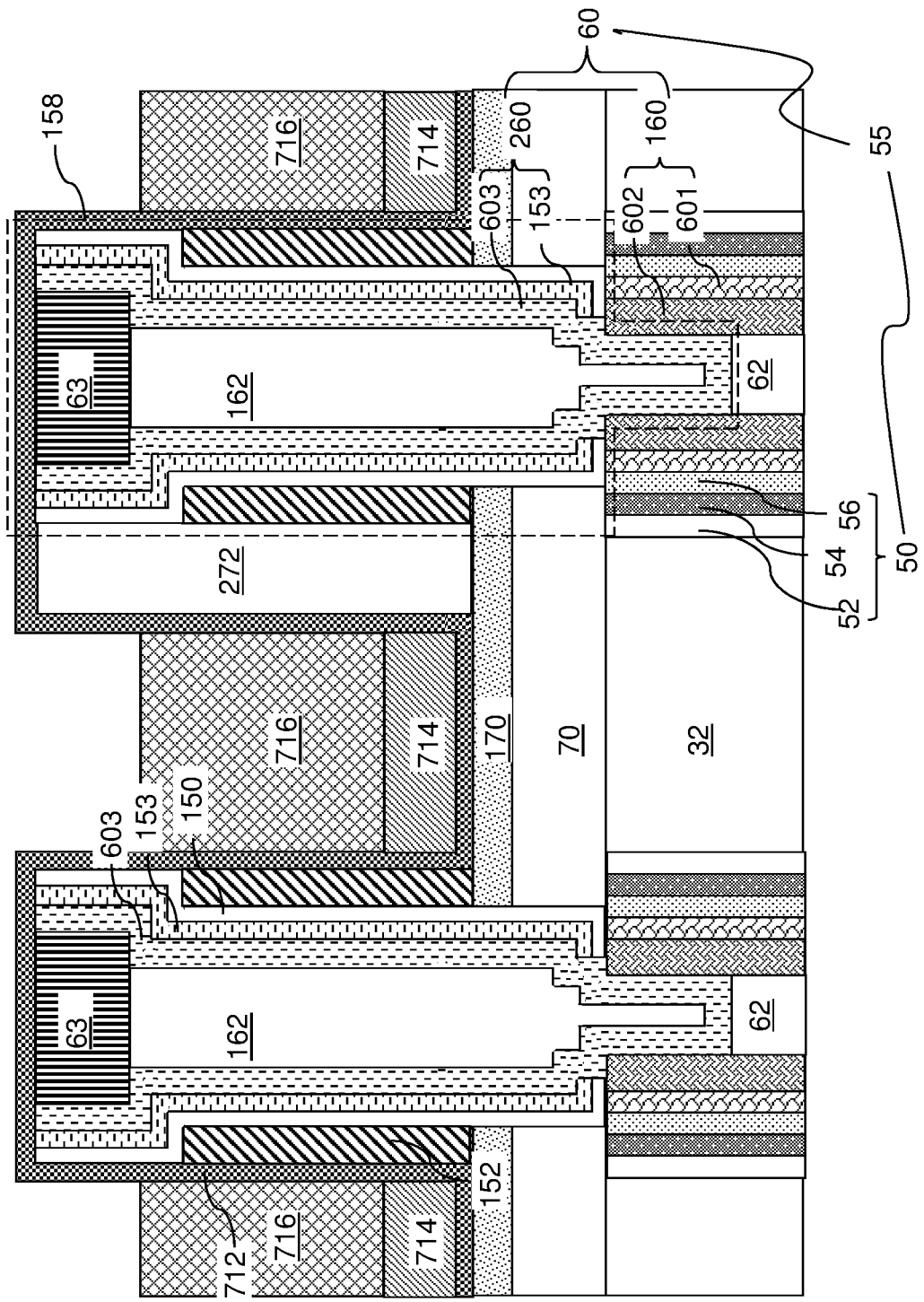

Referring to FIG. 18D, a metal may be selectively deposited upward from the physically exposed metal-nucleating surface of each planar metal-nucleating material layer 714 while suppressing growth of the metal from physically exposed vertical surfaces around the memory pillar structures (58, 158). The metal deposition process does not include a nucleation step that forms a compound of a metal and any other element, but consists of a single deposition step that induces deposition of pure metal without formation of compounds. For example, the metal may be tungsten, molybdenum or ruthenium, and the deposition process may be a decomposition process of a metal-containing precursor gas without use of any gas that reacts with the metal-containing precursor gas. For example, tungsten hexafluoride gas may be flowed into a process chamber without use of any semiconductor-containing gas or a boron-containing gas. A metal layer 716 may be formed by vertical growth of the metal from the top surface of the planar metal-nucleating material layer 714. The top surfaces of the memory pillar structures (58, 158) are not covered with the metal-nucleating material at a processing step of selectively growing the metal. Thus, the metal-nucleating material is not physically exposed over top surfaces of the memory pillar structures (58, 158) at the processing step of selectively growing the metal. In one embodiment, the planar metal-nucleating material layer 714 may comprise, and/or may consist essentially of, cobalt, and the metal layer 716 may consist essentially of tungsten, molybdenum or ruthenium.

Figure 18E:
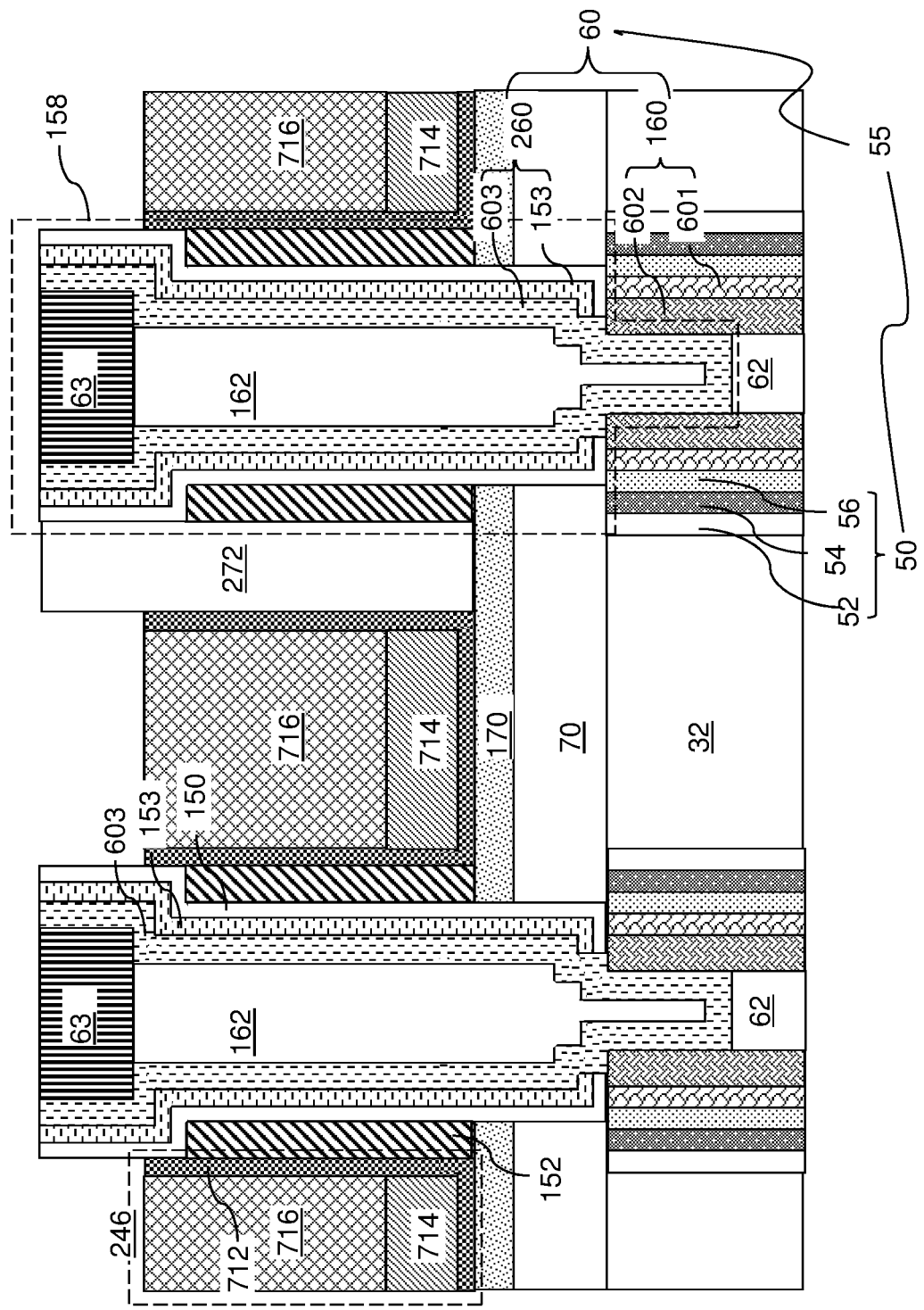

Referring to FIG. 18E, an isotropic etch process may be performed to remove physically exposed portions of the metallic nitride liner 712 that protrude above the top surface of a metal layer 716. An isotropic etch process such as a wet etch process may be removed to etch the physically exposed portions of the metallic nitride liner 712. Each continuous remaining portion of the metallic nitride liner 712, the planar metal-nucleating material layer 714 (which is a first metal layer), and the metal layer 716 (which is a second metal layer) constitutes a drain-select-level electrically conductive layer 246, which contacts a respective set of cylindrical gate electrodes 152.

Figure 19A:
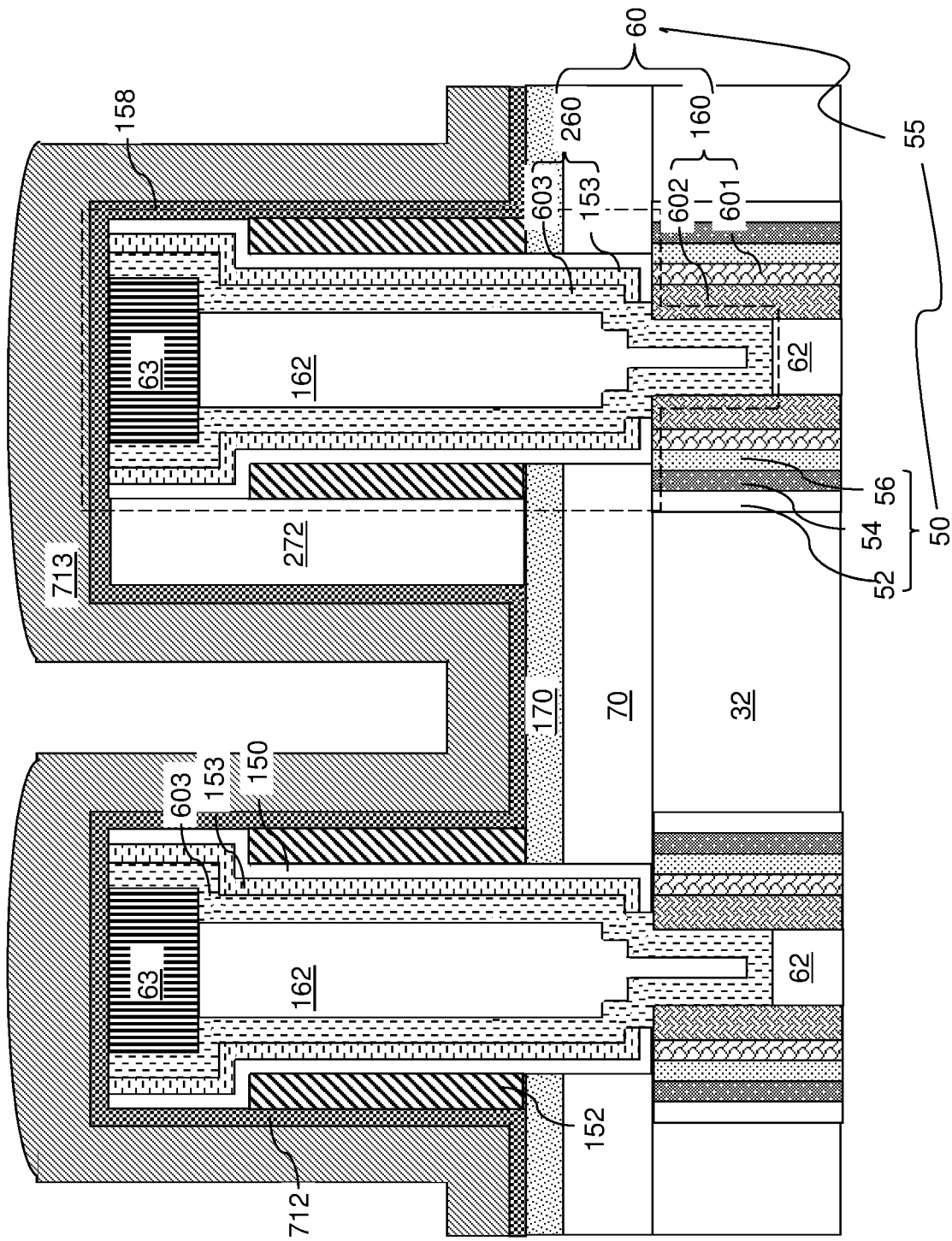
FIGS. 19A-19C are sequential magnified views of a region of the exemplary structure during formation of a drain-select-level electrically conductive layer in a second configuration according to an embodiment of the present disclosure.

Referring to FIG. 19A, a structure for forming a drain-select-level electrically conductive layer in a second embodiment configuration is illustrated, which may be derived from the structure of FIG. 18B by increasing the thickness of the conformal metal-nucleating material layer 713. The memory pillar structures (58, 158) extend through the alternating stack of insulating layers 32 and word-line-level electrically conductive layers 46. Each of the memory pillar structures (58, 158) comprises a vertical semiconductor channel 60 and a memory film 50 in contact with the vertical semiconductor channel 60. Each of the memory pillar structures (58, 158) protrudes above the insulating cap layer 70 to provide an inter-pillar gap region 243 that laterally extends between laterally-neighboring pairs of the memory pillar structures (58, 158). The metallic nitride liner 712 may be deposited in the same manner as in the formation of the exemplary structure of FIG. 18B. The metal of the conformal metal-nucleating material layer 713 may be conformally deposited over a bottom surface and sidewalls of the inter-pillar gap region 243 and above top surfaces of the memory pillar structures (58, 158) in the same manner as in the formation of the exemplary structure of FIG. 18B with the modification in the thickness of the conformal metal-nucleating material layer 713. Specifically, the thickness of the conformal metal-nucleating material layer 713 may be modified such that the amount of metal in the conformal metal-nucleating material layer 713 is sufficient to form drain-select-level electrically conductive layers upon reflow. The conformal metal-nucleating material layer 713 is deposited as a conformal metal layer on the physically exposed surfaces of the metallic nitride liner 712.

Figure 19B:
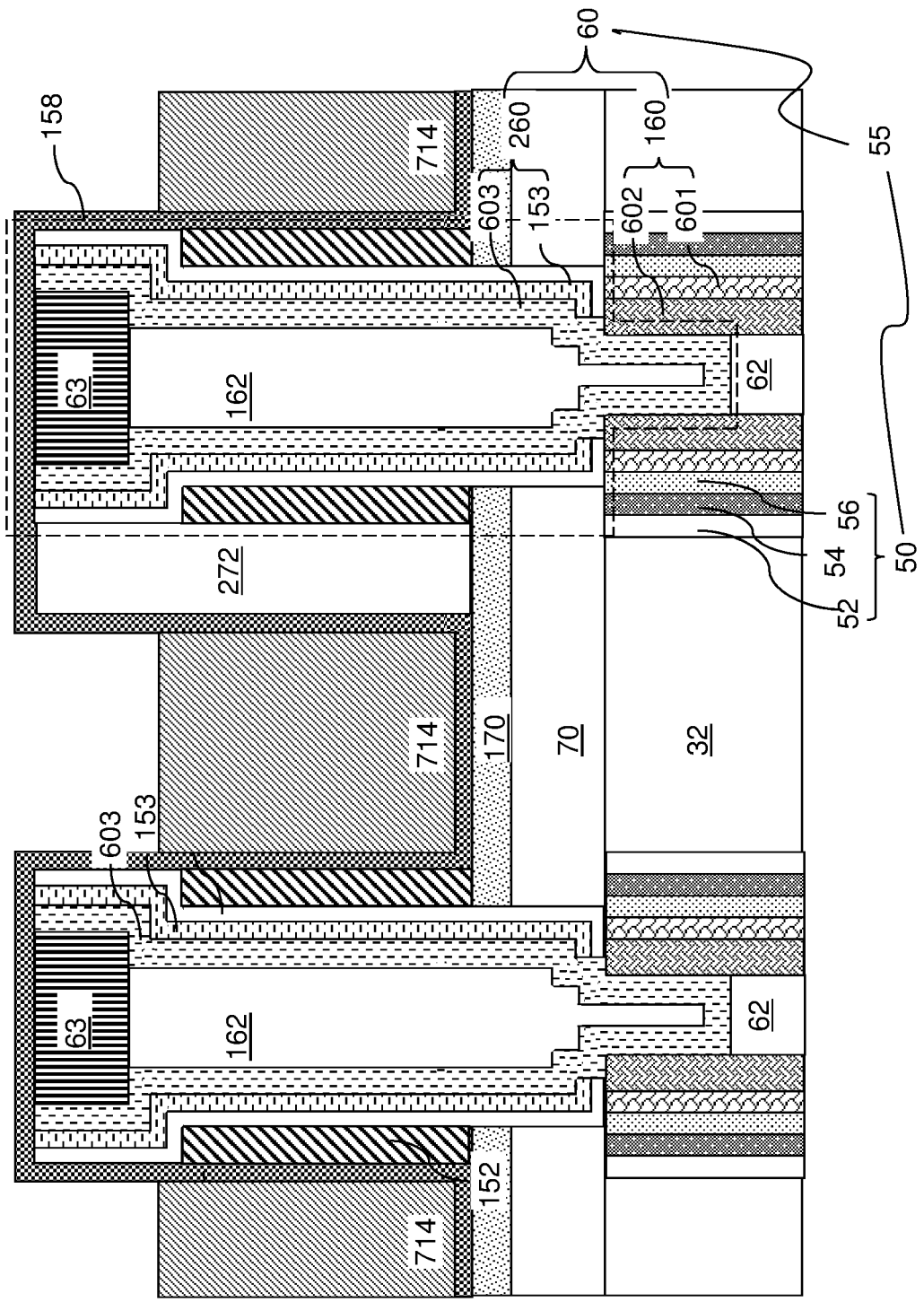

Referring to FIG. 19B, an anneal process at an elevated temperature may be performed to induce thermal migration of the metal. The anneal conditions may be the same as in the processing steps of FIG. 18C. The metal of the conformal metal-nucleating material layer may be is removed from above the top surfaces of the memory pillar structures (58, 158). Thermally migrated portions of the metal fill a bottom portion of the inter-pillar gap region 243 to provide planar metal-nucleating material layers 714. A metal layer having a planar top surface may be formed within each inter-pillar gap region 243. In one embodiment, the top surface of each planar metal-nucleating material layer 714 may be located at, or above, a horizontal plane including top surfaces of the cylindrical gate electrodes 152.

Figure 19C:
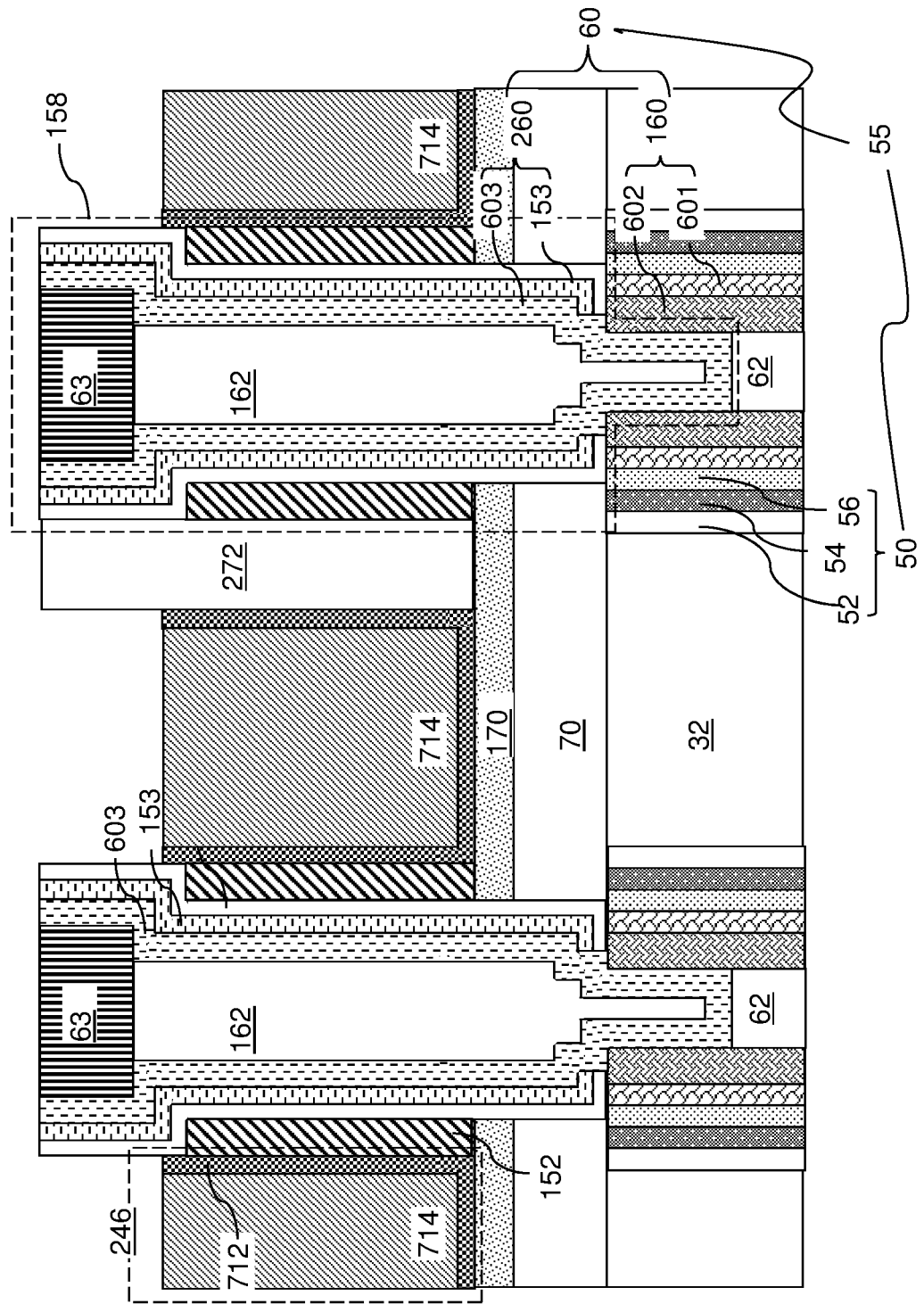

Referring to FIG. 19C, an isotropic etch process may be performed to remove physically exposed portions of the metallic nitride liner 712 that protrude above the top surface of a planar metal-nucleating material layer 714, which may be a metal layer consisting essentially of a metal such as cobalt. Each continuous remaining portion of the metallic nitride liner 712 and the planar metal-nucleating material layer 714 constitutes a drain-select-level electrically conductive layer 246, which contacts a respective set of cylindrical gate electrodes 152.

Figure 20A:
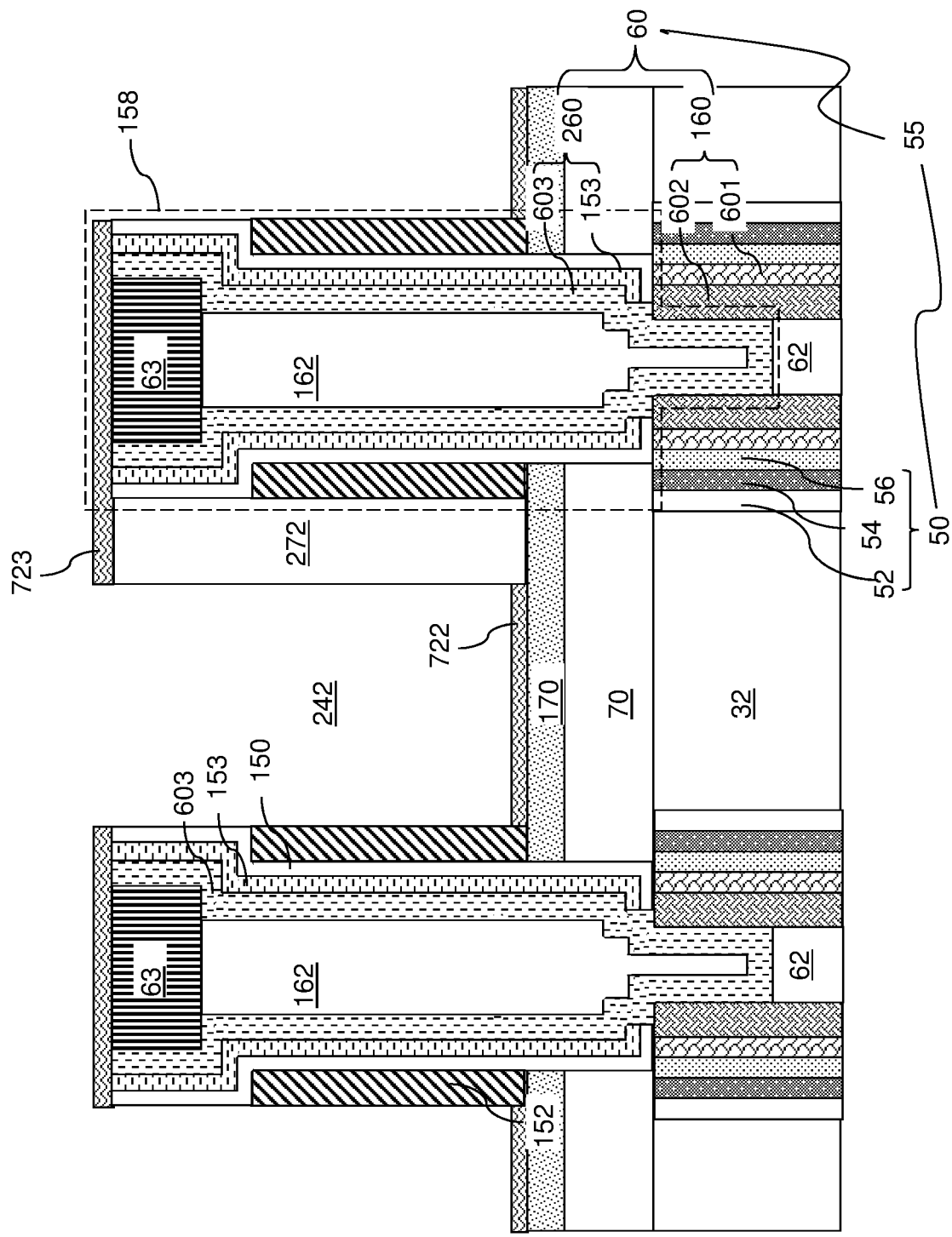
FIGS. 20A-20D are sequential magnified views of a region of the exemplary structure during formation of a drain-select-level electrically conductive layer in a third configuration according to an embodiment of the present disclosure.

Referring to FIG. 20A, a structure for forming a drain-select-level electrically conductive layer in a third embodiment configuration is illustrated, which may be derived from the structure illustrated in FIG. 18A by anisotropically depositing a non-metallic material over the top surfaces of the memory pillar structures (58, 158) and into the inter-pillar gap region 243. For example, a non-metallic material such as silicon, germanium, a silicon-germanium alloy, or boron may be deposited by an anisotropic deposition method such as physical vapor deposition (PVD). Horizontal portions of the deposited non-metallic material have a greater thickness than any vertical portion of the deposited non-metallic material. Optionally, an isotropic etch back process may be performed to remove vertical portions of the non-metallic material from the sidewalls of the drain-select-level pillar structures 158. The remaining horizontal portions of the non-metallic material may include a non-metallic liner 722 formed on the top surface of the etch stop dielectric layer 170 and non-metallic plates 723 that are formed over top surfaces of the memory pillar structures (58, 158) concurrently with formation of the non-metallic liner 722. The thickness of the non-metallic liner 722 and the non-metallic plates 723 may be in a range from 1 nm to 20 nm, such as from 2 nm to 10 nm, although lesser and greater thicknesses may also be used. The non-metallic liner 722 is formed on a bottom surface of the inter-pillar gap region 243 without covering upper portions of sidewalls of the memory pillar structures (58, 158).

Figure 20B:
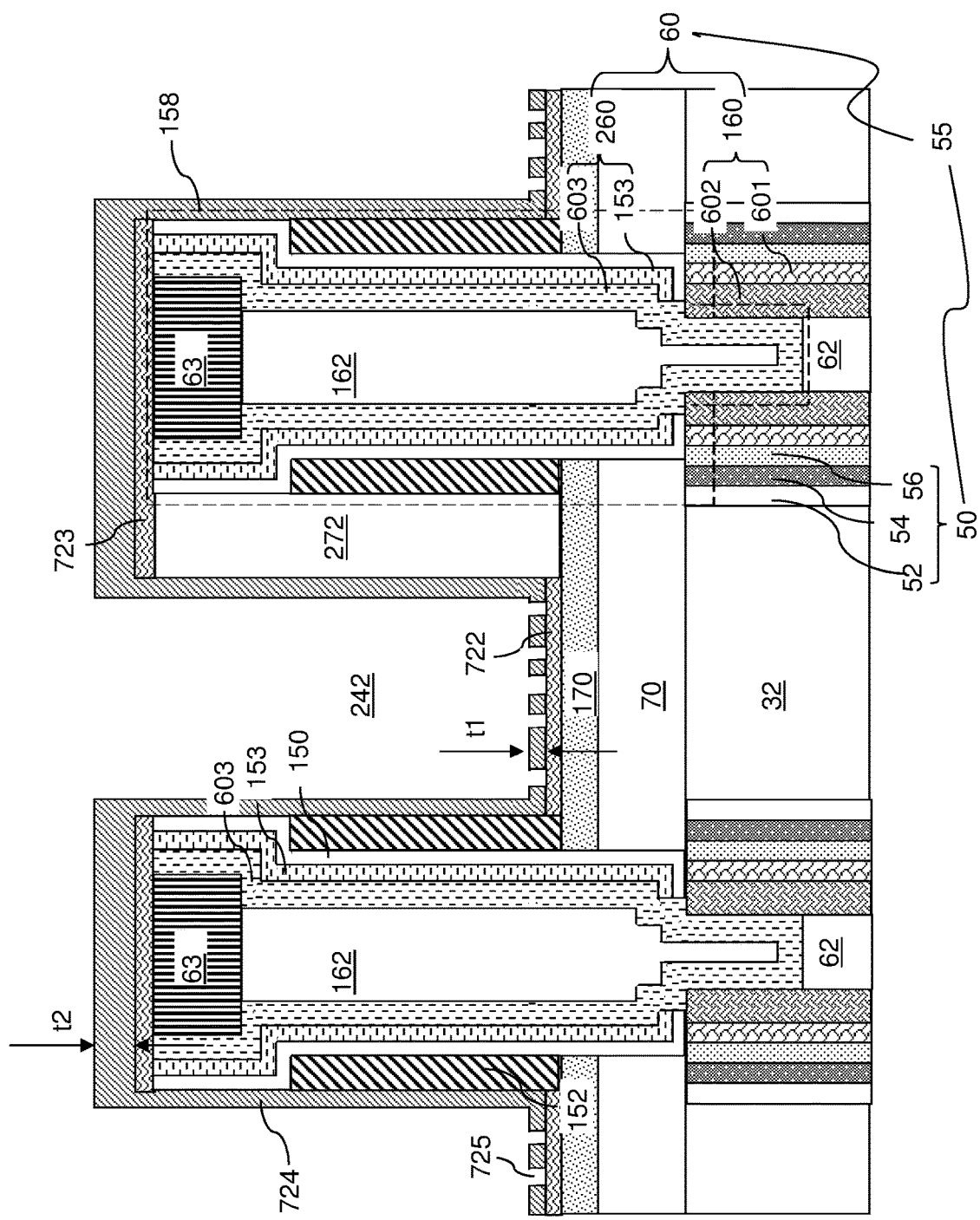

Referring to FIG. 20B, a metallic nitride liner 724 may be deposited using an anisotropic deposition process with low collimation such that a significant portion of a metallic nitride material impinges on the exemplary structure at an angle with respect to the vertical direction. The metallic nitride liner 724 may comprise, and/or consist essentially of, TiN, TaN, and/or WN. The metallic nitride liner 724 may be deposited on the non-metallic liner 722, on the sidewalls of the memory pillar structures (58, 158), and over the top surfaces of the memory pillar structures (58, 158). The thickness of the metallic nitride liner 724 on the non-metallic liner 722 is less than the thickness of the metallic nitride liner 724 over the non-metallic plates 723 due to a wide angular distribution of impinging metallic nitride particles that impinge onto the exemplary structure and the geometrical shielding effect due to the protruding portions of the memory pillar structures (58, 158). The duration and the flux of the of the metallic nitride material during the anisotropic deposition process may be controlled such that the portion of the metallic nitride liner 724 on the non-metallic liner 722 has holes therethrough, and the portions of the metallic nitride liner 724 on the non-metallic plates 723 has a greater thickness and does not include any hole therethrough. Thus, the metallic nitride liner 724 comprises a planar bottom portion having a first thickness t1 and including holes therethrough and located over a bottom surface of the inter-pillar gap region 243, and planar top portions without holes therethrough, having a second thickness t2 that is greater than the first thickness t1, and overlying the non-metallic plates 723. For example, the first thickness t1 may be in a range from 0.5 nm to 3 nm, and the second thickness t2 may be in a range from 1.5 nm to 5 nm. The ranges for the first thickness t1 and the second thickness t2 may be different depending on the material composition of the metallic nitride liner 724 and the size of deposited metal nitride particles during the anisotropic deposition process (such as a physical vapor deposition process).

The physically exposed surfaces of the non-metallic liner 722 may be a metal-nucleating material that may induce direct deposition of a metal (such as W, Mo, or Ru) thereupon. A physically exposed metal-nucleating surface of a metal-nucleating material (comprising the material of the non-metallic liner 722 underneath the holes through the bottom portion of the metallic nitride liner 724) may be provided at a bottom of the inter-pillar gap region without covering upper portions of sidewalls of the memory pillar structures (58, 158) with the metal-nucleating material. The metal-nucleating material is not physically exposed over top surfaces of the memory pillar structures (58, 158) at this processing step.

Figure 20C:
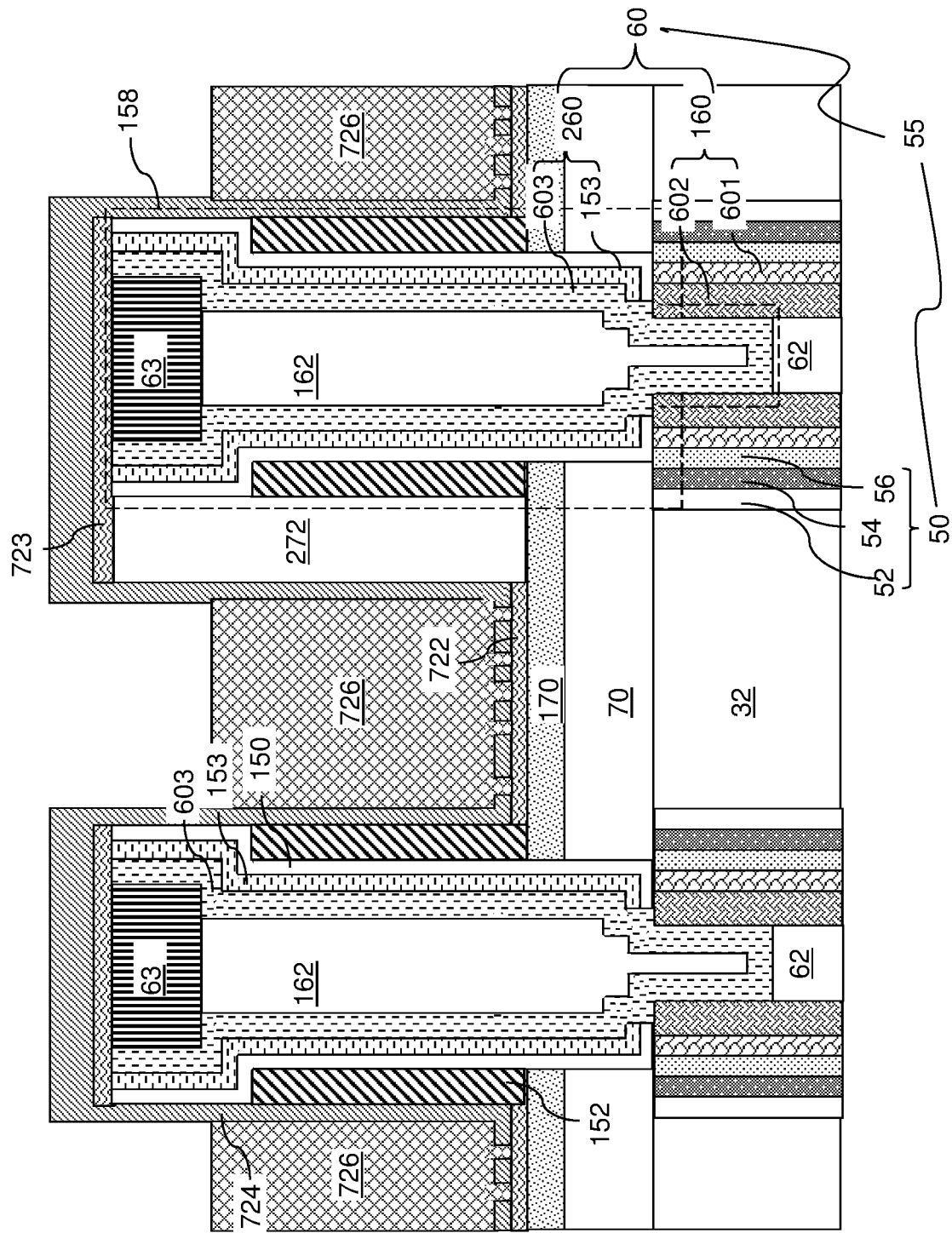

Referring to FIG. 20C, a metal may be selectively deposited upward from the physically exposed metal-nucleating surface of the non-metallic liner 722 through the holes in the metallic nitride liner 724 while suppressing growth of the metal from physically exposed vertical surfaces around the memory pillar structures (58, 158) (which are sidewall surfaces of the metallic nitride liner 724). In such embodiments, the deposition process uses a chemistry that does not provide direct nucleation of the metal on the surfaces of the metallic nitride liner 724. The metal deposition process does not include a nucleation step that forms a compound of a metal and any other element, but consists of a single deposition step that induces deposition of pure metal without formation of compounds. For example, the metal may be tungsten, molybdenum, or ruthenium, and the deposition process may be a decomposition process of a metal-containing precursor gas without use of any gas that reacts with the metal-containing precursor gas. For example, tungsten hexafluoride gas may be flowed into a process chamber without use of any semiconductor-containing gas or a boron-containing gas. A metal layer 726 may be formed by vertical growth of the metal from the top surface of the non-metallic liner 722 through the holes in the metallic nitride liner 724. The metal-nucleating material is not physically exposed over top surfaces of the memory pillar structures (58, 158) at the processing step of selectively growing the metal. In one embodiment, the non-metallic liner 722 may comprise, and/or may consist essentially of, undoped or doped silicon, germanium, or a silicon-germanium alloy, and the metal layer 726 may consist essentially of tungsten, molybdenum, or ruthenium.

Figure 20D:
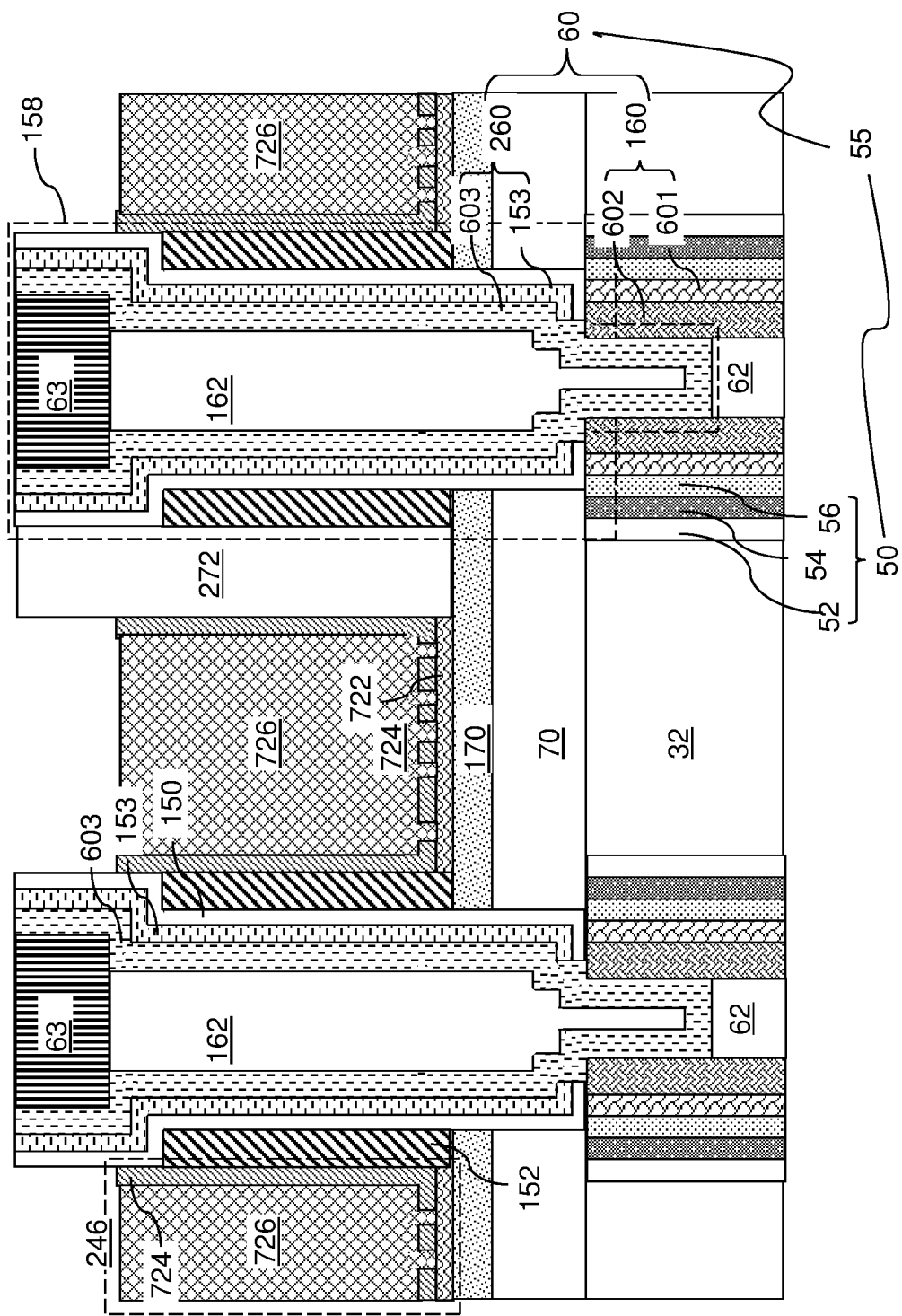

Referring to FIG. 20D, an isotropic etch process may be performed to remove physically exposed portions of the metallic nitride liner 724 that protrude above the top surface of a metal layer 726. An isotropic etch process such as a wet etch process may be removed to etch the physically exposed portions of the metallic nitride liner 724. The non-metallic plates 723 may be removed selective to the drain-select-level pillar structures 158 by an etch process, which may be an isotropic etch process (such as a wet etch process) or an anisotropic etch process. Each continuous remaining portion of the metallic nitride liner 724 and the metal layer 726 constitutes a drain-select-level electrically conductive layer 246, which contacts a respective set of cylindrical gate electrodes 152.

Figure 21A:
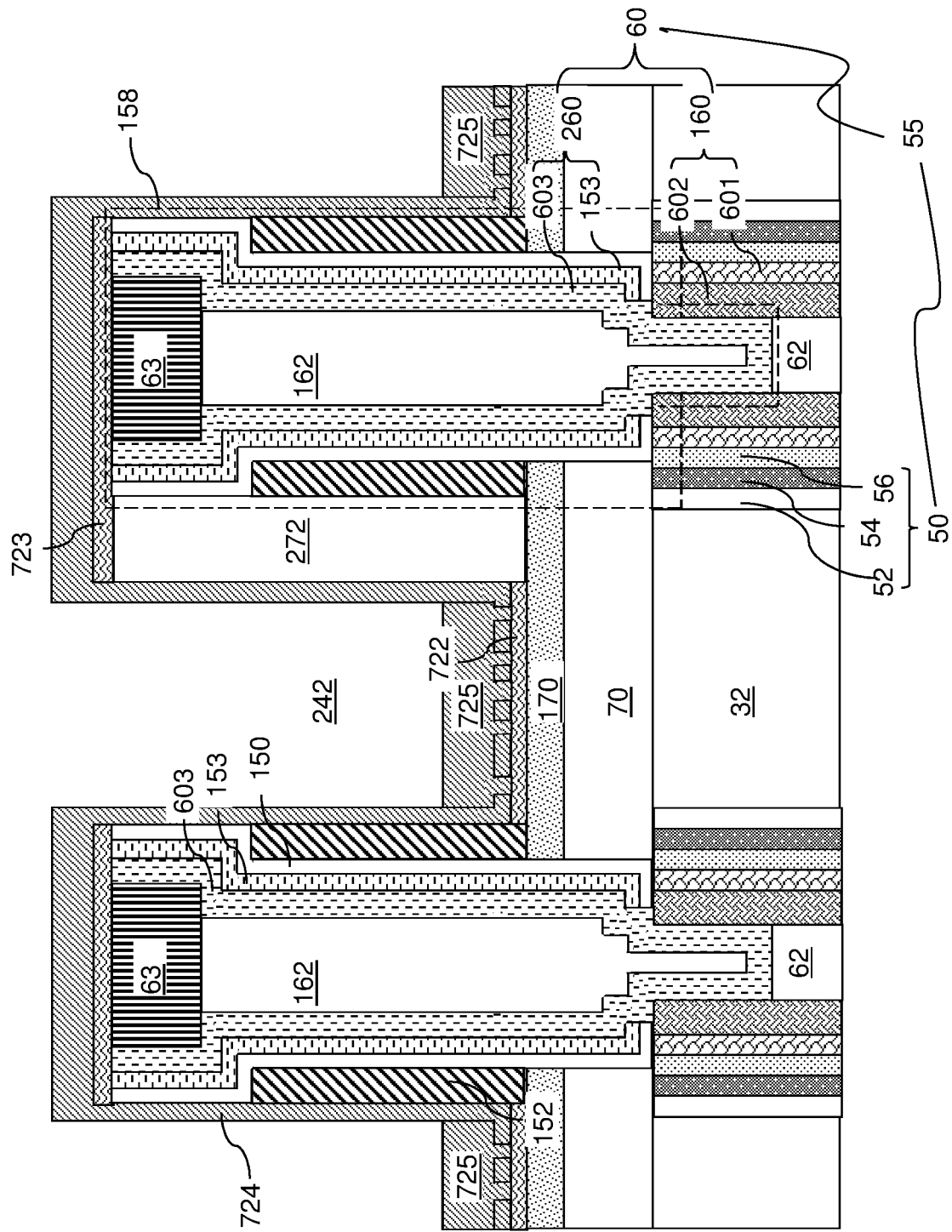
FIGS. 21A-21C are sequential magnified views of a region of the exemplary structure during formation of a drain-select-level electrically conductive layer in a fourth configuration according to an embodiment of the present disclosure.

Referring to FIG. 21A, a structure for forming drain-select-level electrically conductive layers in a fourth embodiment configuration may be derived from the exemplary structure of FIG. 20B by selectively depositing a metal-nucleating material on physically exposed surfaces of the non-metallic liner 722 without growth of the metal-nucleating material from surfaces of the metallic nitride liner 724. A planar metal-nucleating material layer 725 may be formed by selective growth of the metal-nucleating material from the physically exposed surfaces of the non-metallic liner 722 through holes in the metallic nitride liner 724. For example, the metal-nucleating material of the planar metal-nucleating material layer 725 may comprise, and/or may consist essentially of, cobalt. The planar metal-nucleating material layer 725 may have a horizontal top surface.

Figure 21B:
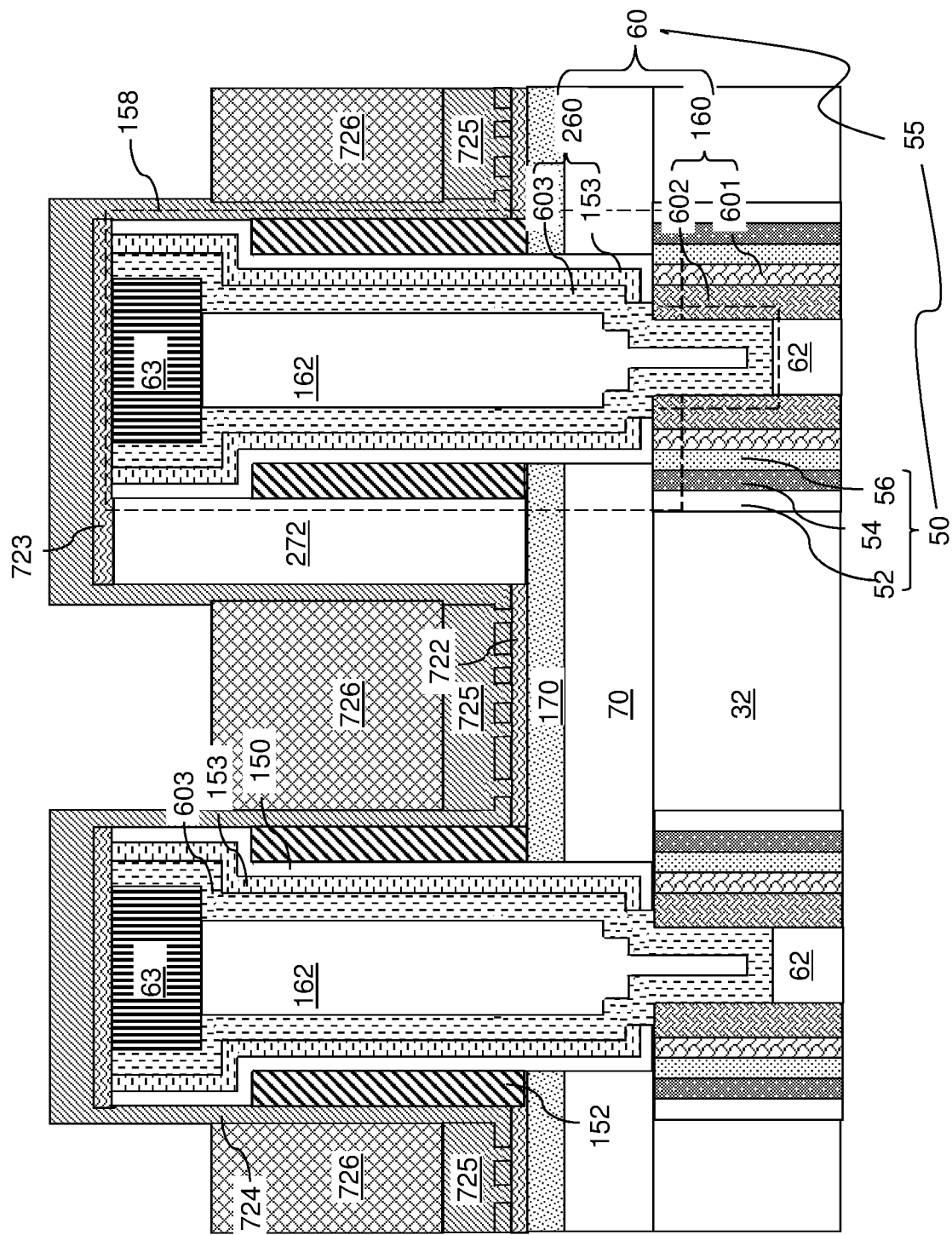

Referring to FIG. 21B, a metal may be selectively grown upward from the physically exposed metal-nucleating surface of the planar metal-nucleating material layer 725 while suppressing growth of the metal from physically exposed vertical surfaces around the memory pillar structures (58, 158) (which are sidewall surfaces of the metallic nitride liner 724). In such embodiments, the deposition process uses a chemistry that does not provide direct nucleation of the metal on the surfaces of the metallic nitride liner 724. The metal deposition process does not include a nucleation step that forms a compound of a metal and any other element, but consists of a single deposition step that induces deposition of pure metal without formation of compounds. For example, the metal may be tungsten, molybdenum, or ruthenium, and the deposition process may be a decomposition process of a metal-containing precursor gas without use of any gas that reacts with the metal-containing precursor gas. For example, tungsten hexafluoride gas may be flowed into a process chamber without use of any semiconductor-containing gas or a boron-containing gas. A metal layer 726 may be formed by vertical growth of the metal from the top surface of the planar metal-nucleating material layer 725. The metal-nucleating material is not present over top surfaces of the memory pillar structures (58, 158), and thus, is not physically exposed over top surfaces of the memory pillar structures (58, 158) at the processing step of selectively growing the metal. In one embodiment, the planar metal-nucleating material layer 725 may comprise, and/or may consist essentially of, tungsten, and the metal layer 726 may consist essentially of tungsten, molybdenum, or ruthenium.

Figure 21C:
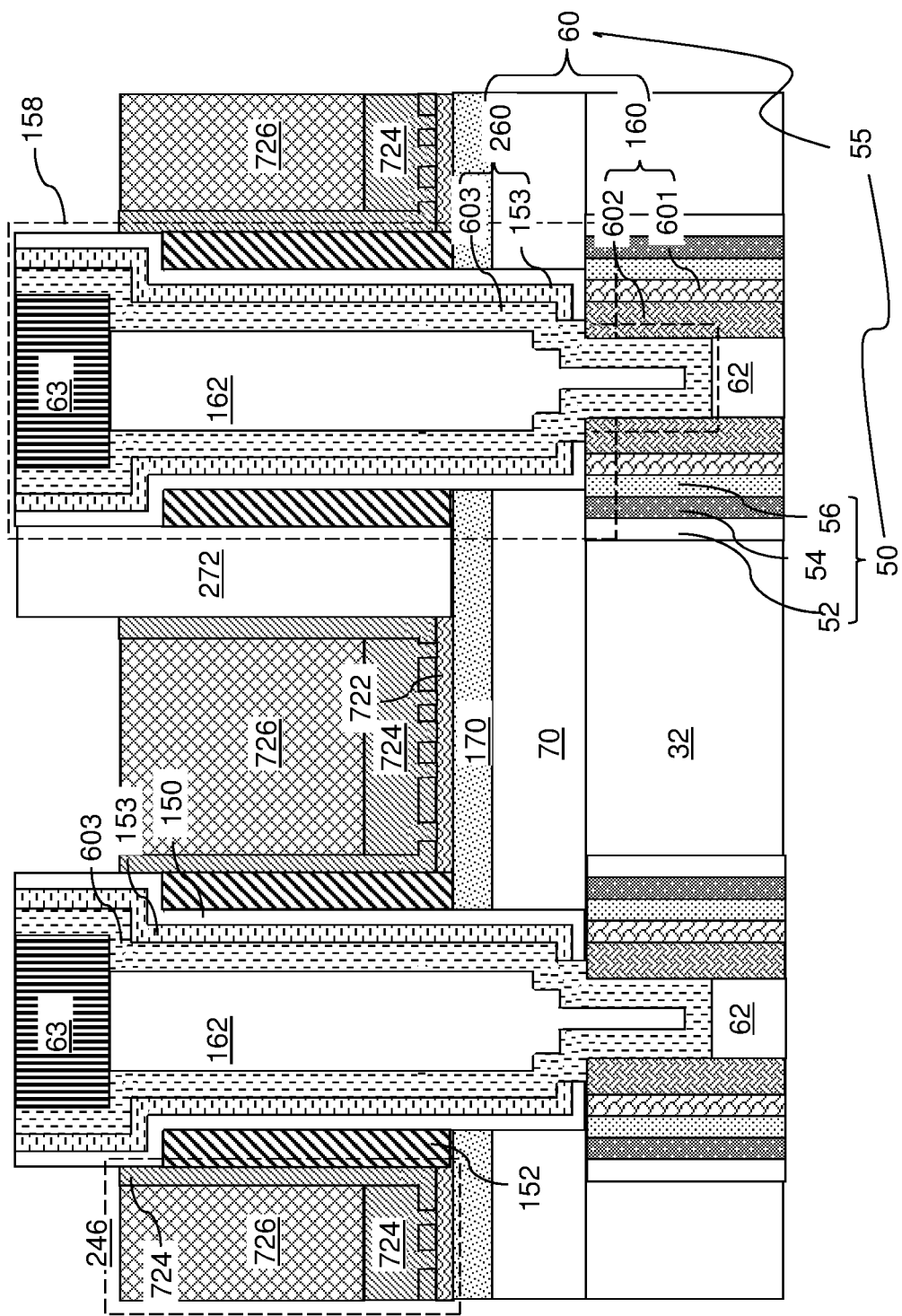

Referring to FIG. 21C, an isotropic etch process may be performed to remove physically exposed portions of the metallic nitride liner 724 that protrude above the top surface of a metal layer 726. An isotropic etch process such as a wet etch process may be removed to etch the physically exposed portions of the metallic nitride liner 724. The non-metallic plates 723 may be removed selective to the drain-select-level pillar structures 158 by an etch process, which may be an isotropic etch process (such as a wet etch process) or an anisotropic etch process. Each continuous remaining portion of the metallic nitride liner 724, the planar metal-nucleating material layer 725, and the metal layer 726 constitutes a drain-select-level electrically conductive layer 246, which contacts a respective set of cylindrical gate electrodes 152.

Figure 22A:
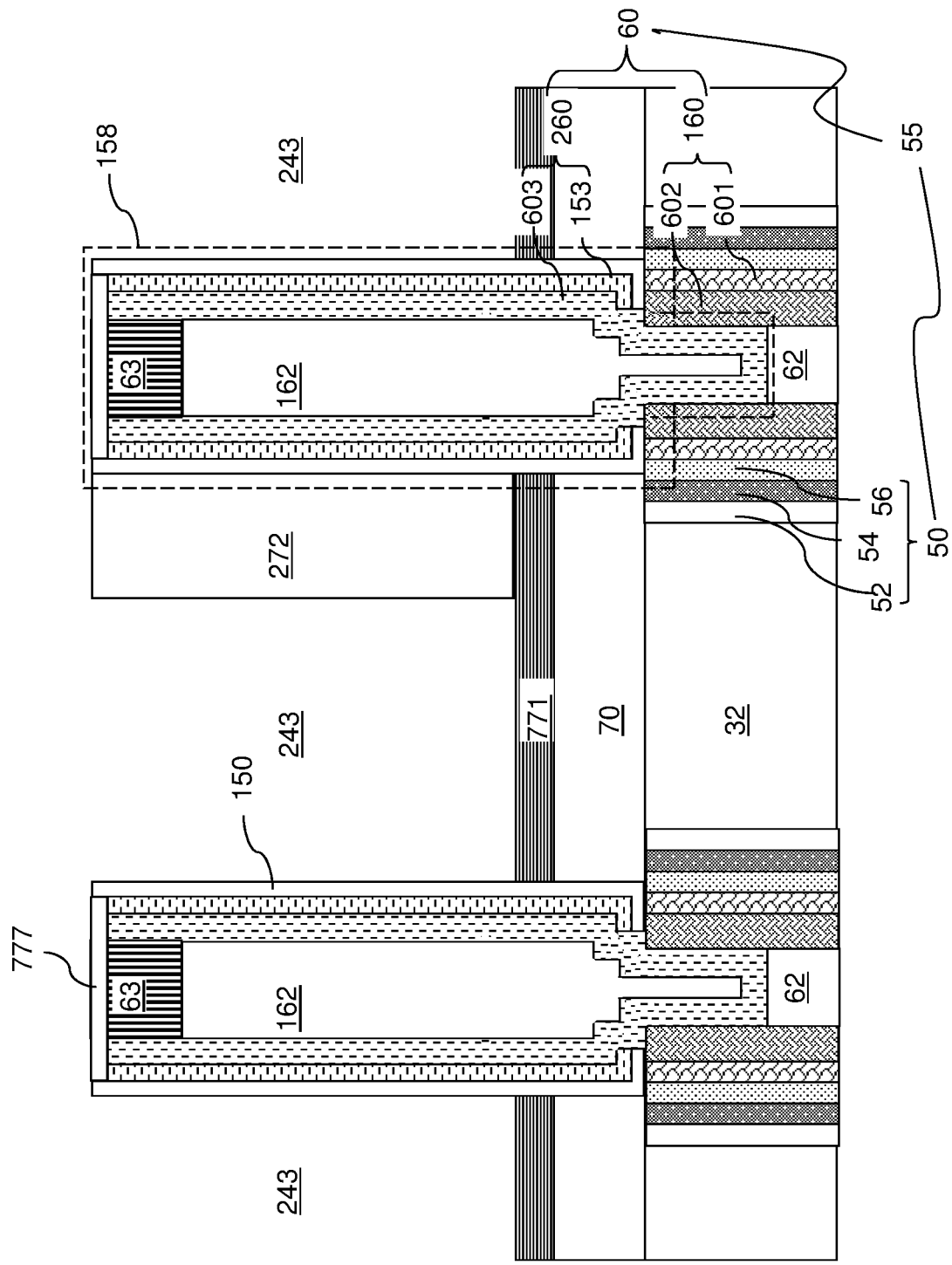
FIGS. 22A and 22B are sequential magnified views of a region of the exemplary structure during formation of a drain-select-level electrically conductive layer in a fifth configuration according to an embodiment of the present disclosure.

Referring to FIG. 22A, a structure for forming a drain-select-level electrically conductive layer in a fifth embodiment configuration is illustrated, which may be derived from the structure illustrated in FIG. 18A by forming a metal-nucleating layer 771 above or instead of the etch stop dielectric layer 170 and by omitting formation of the cylindrical gate electrodes 152. Specifically, if the metal-nucleating layer 771 is a metal-nucleating dielectric layer, such as silicon nitride, then the processing steps of FIG. 10B may be omitted to avoid formation of the cylindrical gate electrodes 152. The metal-nucleating dielectric layer 771 includes a dielectric material that facilitates nucleation of a metal more than semiconductor oxide materials such as silicon oxide. For example, the metal-nucleating dielectric layer 771 includes a dielectric material that provides direct nucleation of a metal while the metal does not nucleate on a silicon oxide surface. In one embodiment, the metal-nucleating dielectric layer 771 may be a silicon nitride layer having a thickness in a range from 4 nm to 20 nm, such as from 6 nm to 10 nm, although lesser and greater thicknesses may also be used. Alternatively, the metal-nucleating layer 771 may be a metal-nucleating semiconductor layer, such as silicon, germanium or silicon-germanium.

An oxidation process may be performed to convert surface portions of the drain regions 63 and the vertical semiconductor channels 60 into semiconductor oxide caps 777. For example, if the drain regions 63 and the vertical semiconductor channels 60 include polysilicon, the semiconductor oxide caps 777 may include silicon oxide. The thickness of the semiconductor oxide caps 777 may be in a range from 2 nm to 20 nm, such as from 4 nm to 10 nm, although lesser and greater thicknesses may also be used. If the metal-nucleating layer 771 comprises a semiconductor layer, then the metal-nucleating layer 771 may be masked during the oxidation processes or the metal-nucleating layer 771 may be formed after the oxidation process.

The memory pillar structures (58, 158) extend through an alternating stack of insulating layers 32 and word-line-level electrically conductive layers 46. Each of the memory pillar structures (58, 158) comprises a vertical semiconductor channel 60 and a memory film 50 in contact with the vertical semiconductor channel 60. Each of the memory pillar structures (58, 158) protrudes above an insulating cap layer 70 located above the alternating stack (32, 46) to provide an inter-pillar gap region 243 that laterally extends between laterally-neighboring pairs of the memory pillar structures (58, 158). The metal-nucleating dielectric layer 771 provides metal-nucleating material having a physically exposed metal-nucleating surface at a bottom of the inter-pillar gap region 243 without covering sidewalls of the memory pillar structures (58, 158) with the metal-nucleating material. In one embodiment, the metal-nucleating dielectric layer 771 may consist essentially of silicon nitride, and the gate dielectrics 150 and the semiconductor oxide caps 777 may consist essentially of doped or undoped silicon oxide (in which p-type dopants and/or n-type dopants may be present).

Figure 22B:
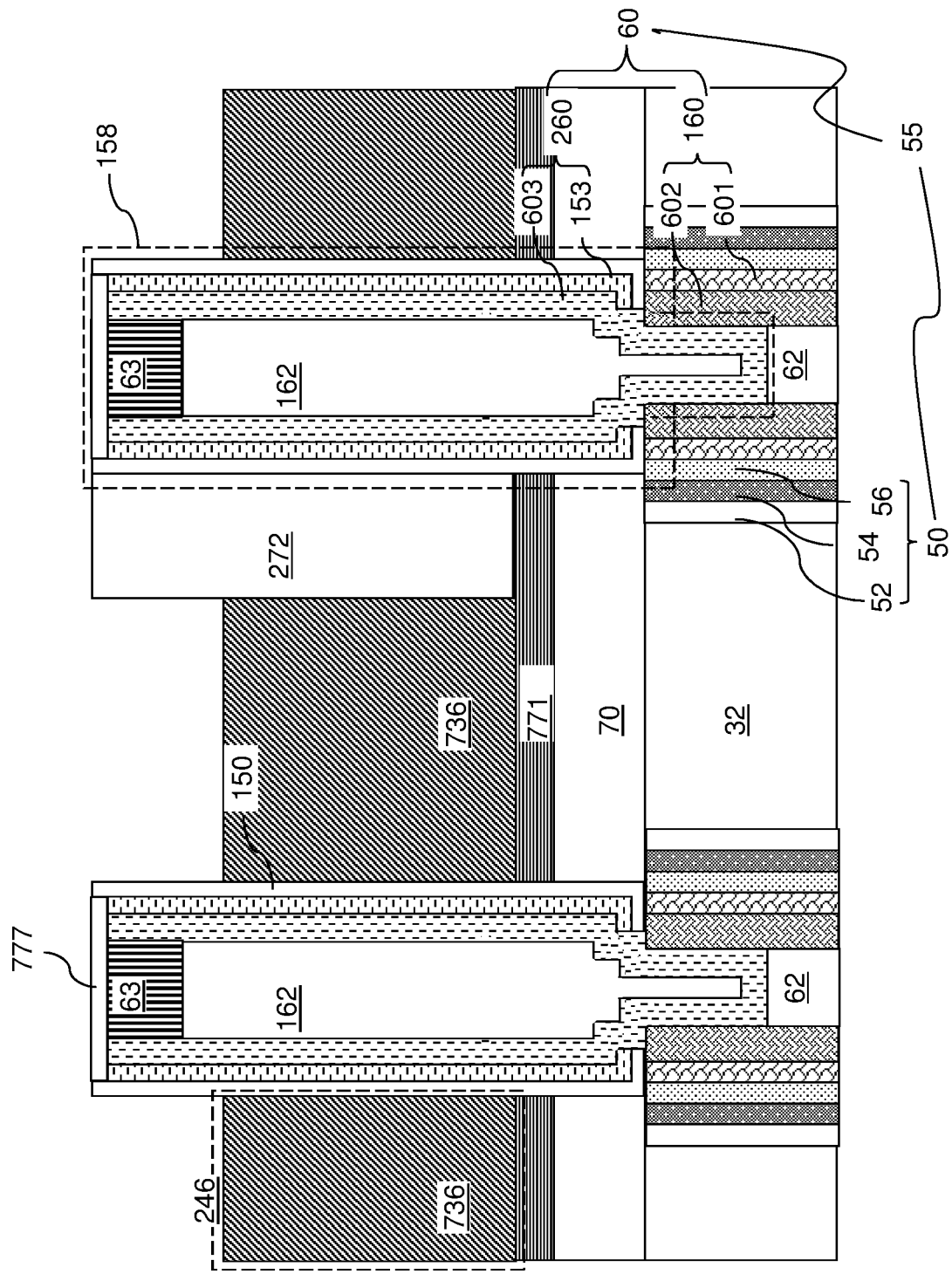

Referring to FIG. 22B, a metal may be selectively grown upward from the physically exposed metal-nucleating surface of the metal-nucleating layer 771 while suppressing growth of the metal from physically exposed vertical surfaces around the memory pillar structures (58, 158) (which are sidewall surfaces of the gate dielectrics 150). In such embodiments, the deposition process uses a chemistry that does not provide direct nucleation of the metal on the surfaces of the gate dielectrics 150 or the semiconductor oxide caps 777. In one embodiment, the deposition process may use an etchant gas that is flowed into a process chamber alternately with, or concurrently with, the metal deposition process gas in order to suppress deposition of the metal on the physically exposed surfaces of the gate dielectrics 150 and the semiconductor oxide caps 777. The metal deposition process does not include a nucleation step that forms a compound of a metal and any other element, but consists of a single deposition step that induces deposition of pure metal without formation of compounds. For example, the metal may be tungsten, cobalt, molybdenum, or ruthenium, and the deposition process may be a decomposition process of a metal-containing precursor gas without use of any gas that reacts with the metal-containing precursor gas. For example, tungsten hexafluoride gas may be flowed into a process chamber without use of any semiconductor-containing gas or a boron-containing gas. A metal layer 736 may be formed by vertical growth of the metal from the top surface of the metal-nucleating layer 771. If the metal-nucleating layer 771 is a silicon nitride layer, the metal layer 736 may comprise ruthenium. The metal-nucleating material is not physically exposed over top surfaces of the memory pillar structures (58, 158) at the processing step of selectively growing the metal. In one embodiment, the metal-nucleating layer 771 may comprise, and/or may consist essentially of, silicon nitride, silicon, germanium and/or silicon-germanium, and the metal layer 736 may consist essentially of tungsten, cobalt, molybdenum, or ruthenium. In one embodiment, the metal layer 736 may consist essentially of ruthenium.

Each continuous portion of the metal layer 736 constitutes a drain-select-level electrically conductive layer 246, which functions as gate electrodes 152 for vertical semiconductor channels 60 located within a respective subset of the drain-select-level pillar structures 158. Each drain-select-level electrically conductive layer 246 may be laterally bounded by the dielectric isolation layer 232 and a respective subset of the drain-select-level isolation structures 272.

Figure 23A:
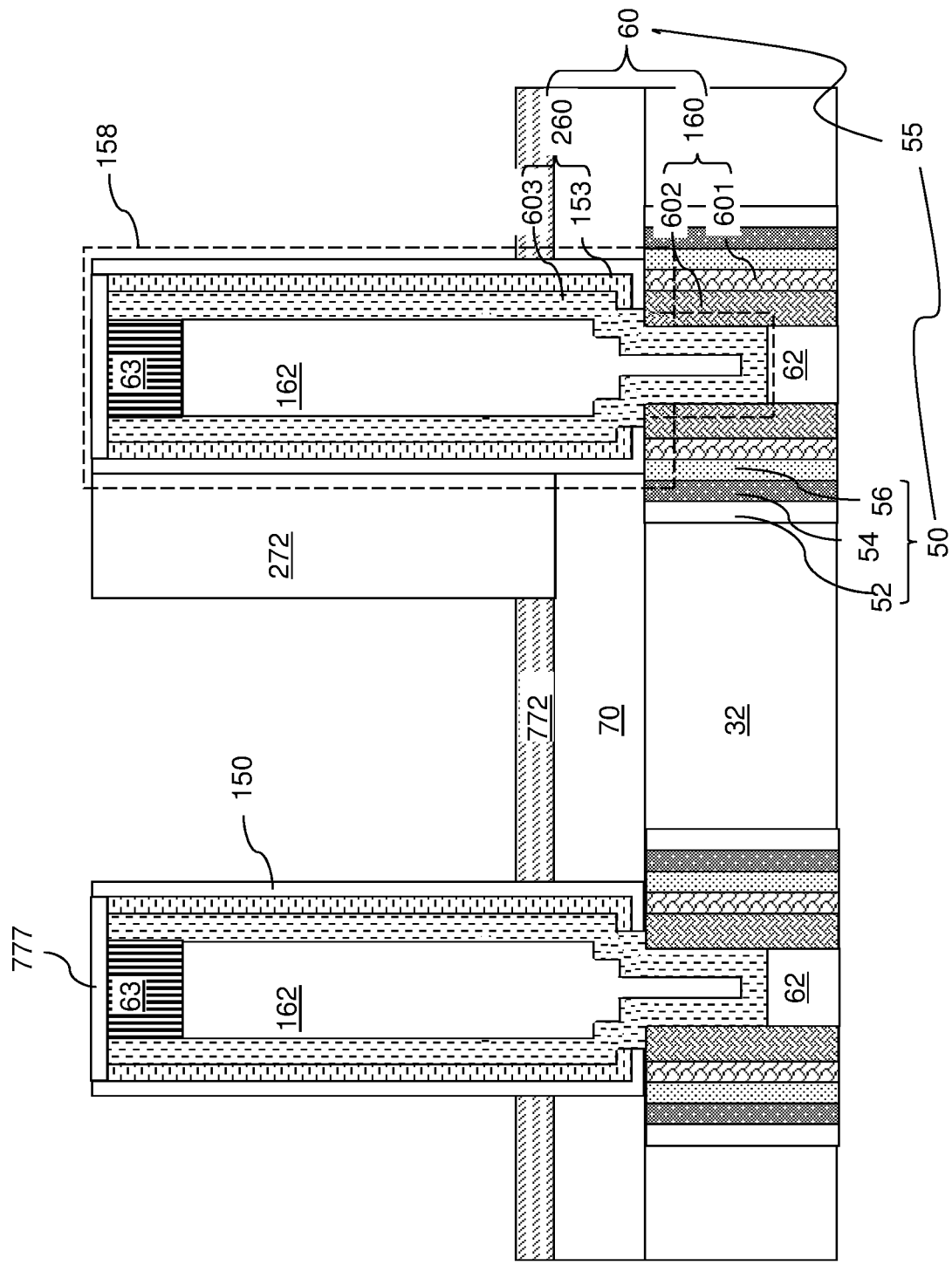
FIGS. 23A-23C are sequential magnified views of a region of the exemplary structure during formation of a drain-select-level electrically conductive layer in a sixth configuration according to an embodiment of the present disclosure.

Referring to FIG. 23A, a structure for forming a drain-select-level electrically conductive layer in a sixth embodiment configuration is illustrated, which may be derived from the structure illustrated in FIG. 18A by forming a planar semiconductor layer 772 as, or in lieu of, an etch stop dielectric layer 170, and by omitting formation of the cylindrical gate electrodes 152. The depth of the dielectric isolation layer 232 and the drain-select-level isolation structures 272 may be modified such that the dielectric isolation layer 232 and the drain-select-level isolation structures 272 vertically extend through the planar semiconductor layer 772. The processing steps of FIG. 10B may be omitted to avoid formation of the cylindrical gate electrodes 152. The planar semiconductor layer 772 includes a semiconductor material that facilitates nucleation of a metal more than semiconductor oxide materials such as silicon oxide. For example, the planar semiconductor layer 772 includes silicon, germanium, or a silicon-germanium alloy. The planar semiconductor layer 772 may have a thickness in a range from 4 nm to 20 nm, such as from 6 nm to 10 nm, although lesser and greater thicknesses may also be used.

An oxidation process may be performed to convert surface portions of the drain regions 63 and the vertical semiconductor channels 60 into semiconductor oxide caps 777. For example, if the drain regions 63 and the vertical semiconductor channels 60 include polysilicon, the semiconductor oxide caps 777 may include silicon oxide. The thickness of the semiconductor oxide caps 777 may be in a range from 2 nm to 20 nm, such as from 4 nm to 10 nm, although lesser and greater thicknesses may also be used.

Figure 23B:
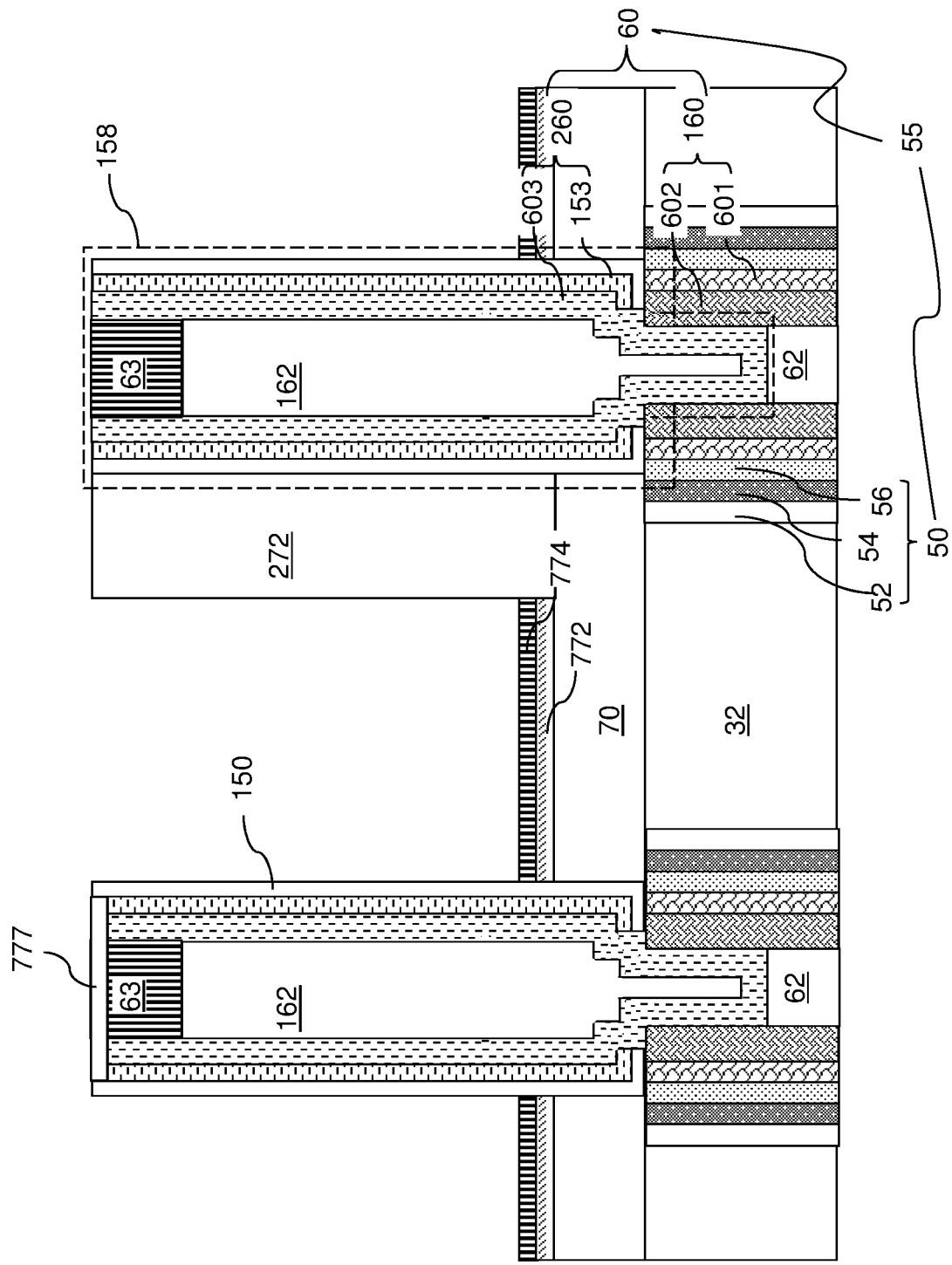

Referring to FIG. 23B, a surface portion of the planar semiconductor layer 772 may be converted into a metal-semiconductor compound layer 774 by exposure to a metal-containing precursor gas. For example, if the planar semiconductor layer 772 includes silicon, germanium, or a silicon-germanium alloy, the planar semiconductor layer 772 may be exposed to tungsten hexafluoride gas within a vacuum enclosure to convert a surface portion of the planar semiconductor layer 772 into the metal-semiconductor compound layer 774. The thickness of the metal-semiconductor compound layer 774 may be in a range from 0.6 nm to 10 nm, such as from 1.5 nm to 4 nm, although lesser and greater thicknesses may also be used.

The memory pillar structures (58, 158) may extend through an alternating stack of insulating layers 32 and word-line-level electrically conductive layers 46. Each of the memory pillar structures (58, 158) comprises a vertical semiconductor channel 60 and a memory film 50 in contact with the vertical semiconductor channel 60. Each of the memory pillar structures (58, 158) protrudes above an insulating cap layer 70 located above the alternating stack (32, 46) to provide an inter-pillar gap region 243 that laterally extends between laterally-neighboring pairs of the memory pillar structures (58, 158). The metal-semiconductor compound layer 774 provides metal-nucleating material having a physically exposed metal-nucleating surface at a bottom of the inter-pillar gap region 243 without covering sidewalls of the memory pillar structures (58, 158) with the metal-nucleating material. In one embodiment, the metal-semiconductor compound layer 774 may consist essentially of a metal silicide, a metal germanide, or a metal germane-silicide, and the gate dielectrics 150 and the semiconductor oxide caps 777 may consist essentially of doped or undoped silicon oxide (in which p-type dopants and/or n-type dopants may be present).

Figure 23C:
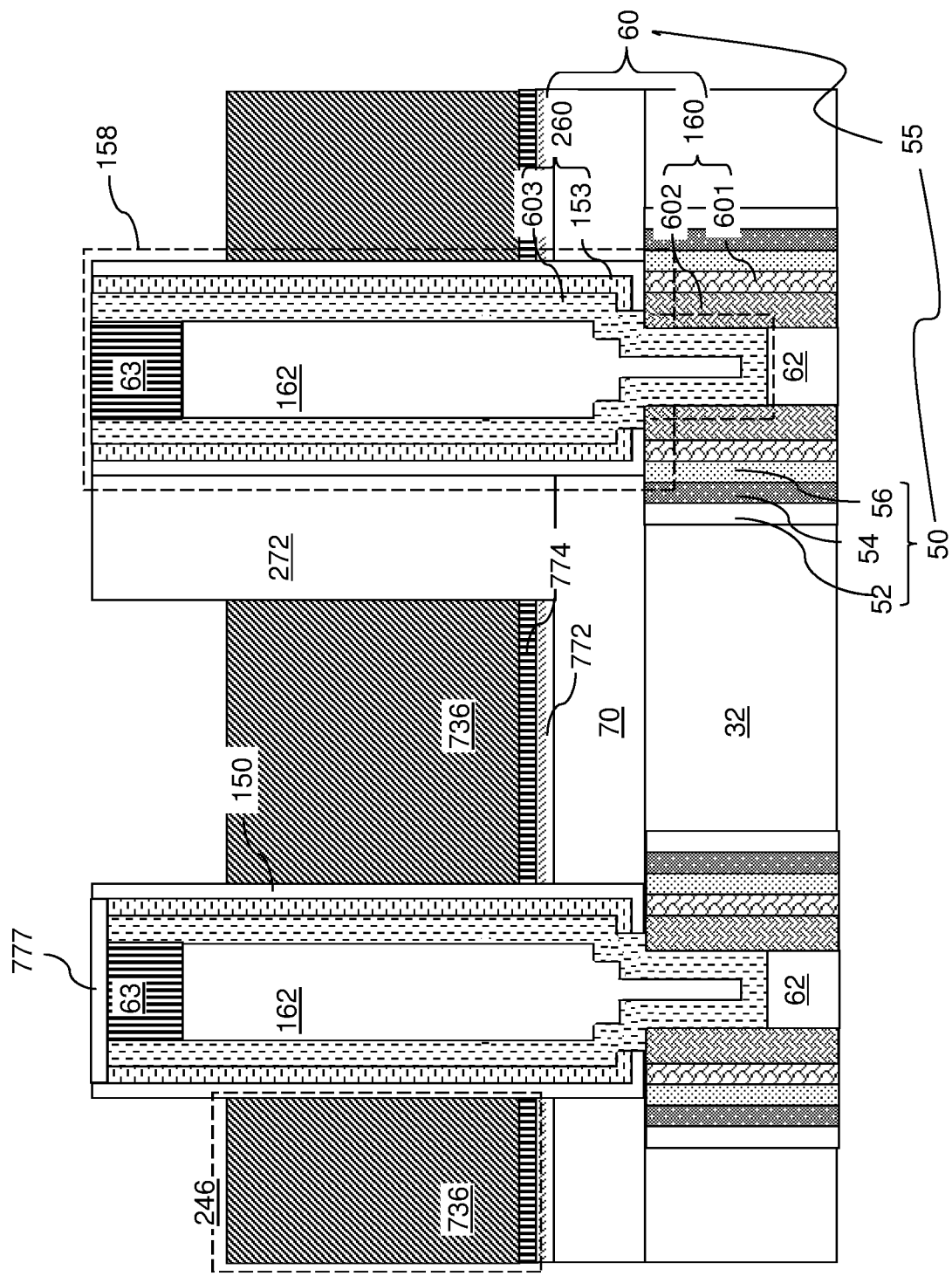

Referring to FIG. 23C, a metal may be selectively grown upward from the physically exposed metal-nucleating surface of the metal-semiconductor compound layer 774 while suppressing growth of the metal from physically exposed vertical surfaces around the memory pillar structures (58, 158) (which are sidewall surfaces of the gate dielectrics 150). In such embodiments, the deposition process uses a chemistry that does not provide direct nucleation of the metal on the surfaces of the gate dielectrics 150 or the semiconductor oxide caps 777. In one embodiment, the deposition process may use an etchant gas that is flowed into a process chamber alternately with, or concurrently with, the metal deposition process gas in order to suppress deposition of the metal on the physically exposed surfaces of the gate dielectrics 150 and the semiconductor oxide caps 777. The metal deposition process does not include a nucleation step that forms a compound of a metal and any other element, but consists of a single deposition step that induces deposition of pure metal without formation of compounds. For example, the metal may be tungsten, cobalt, molybdenum, or ruthenium, and the deposition process may be a decomposition process of a metal-containing precursor gas without use of any gas that reacts with the metal-containing precursor gas. For example, tungsten hexafluoride gas may be flowed into a process chamber without use of any semiconductor-containing gas or a boron-containing gas. A metal layer 736 may be formed by vertical growth of the metal from the top surface of the metal-semiconductor compound layer 774. The metal-nucleating material is not physically exposed over top surfaces of the memory pillar structures (58, 158) at the processing step of selectively growing the metal. In one embodiment, the metal-semiconductor compound layer 774 may comprise, and/or may consist essentially of, a metal silicide, a metal germanide, or a metal germane-silicide, and the metal layer 736 may consist essentially of tungsten, cobalt, molybdenum, or ruthenium.

Each continuous portion of the metal layer 736 and the metal-semiconductor compound layer 774 constitutes a drain-select-level electrically conductive layer 246, which functions as gate electrodes 152 for vertical semiconductor channels 60 located within a respective subset of the drain-select-level pillar structures 158. Each drain-select-level electrically conductive layer 246 may be laterally bounded by the dielectric isolation layer 232 and a respective subset of the drain-select-level isolation structures 272.

Figure 24A:
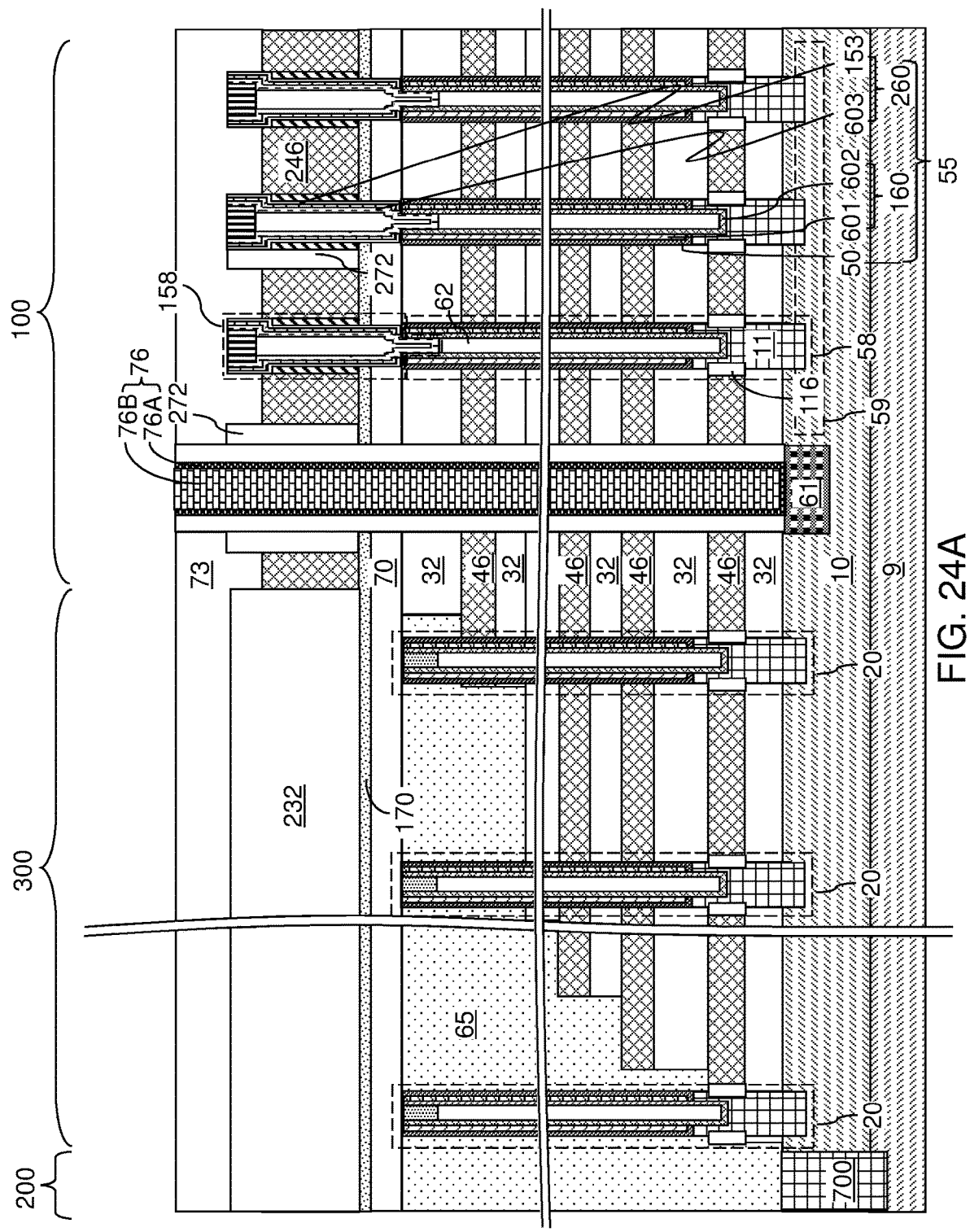
FIG. 24A is a vertical cross-sectional view of the exemplary structure after formation of a contact-level dielectric layer according to an embodiment of the present disclosure.
Figure 24B:
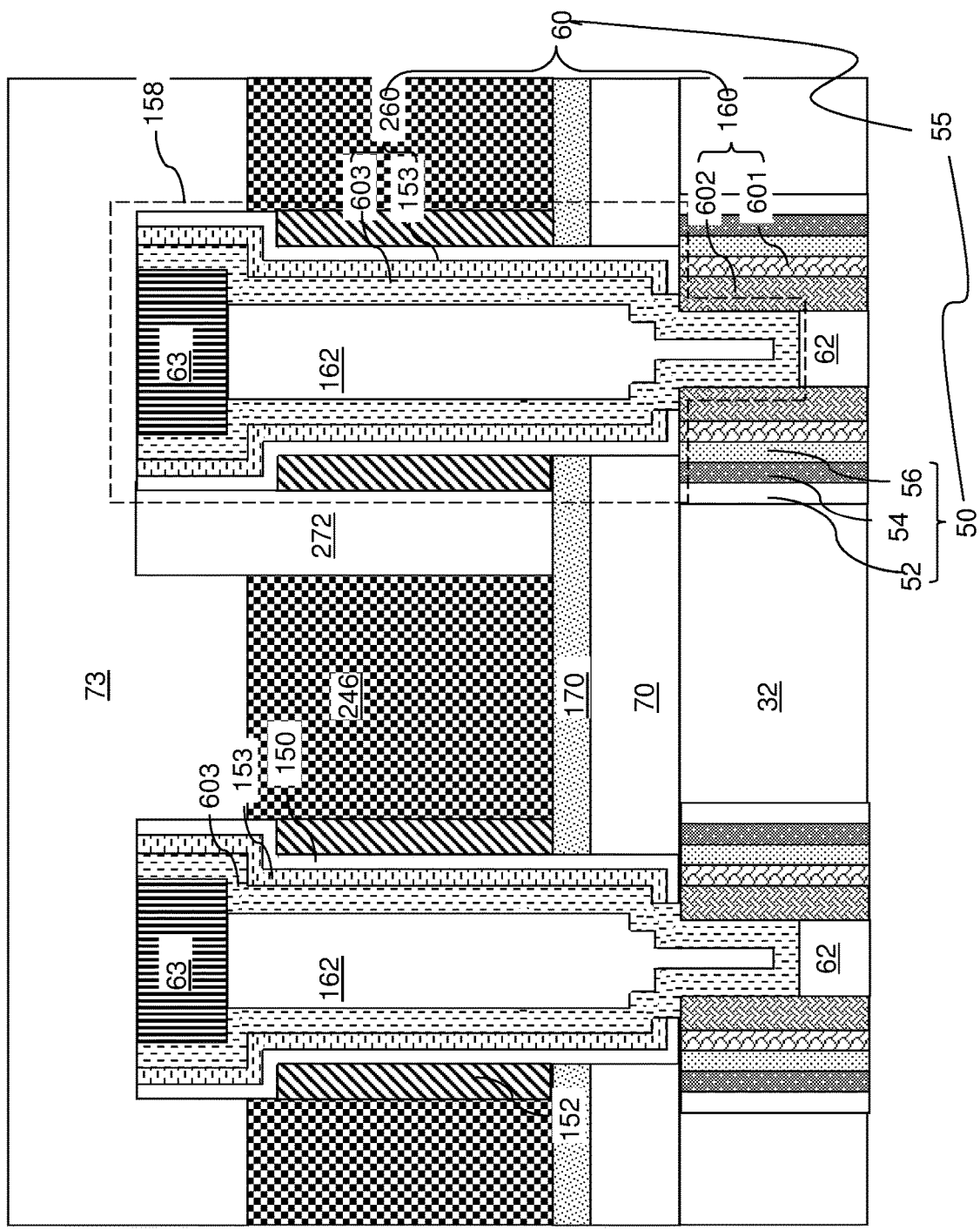
FIG. 24B is a magnified view of a region of the exemplary structure of FIG. 24A.

FIGS. 24A and 24B illustrate the general configuration of the exemplary structure after the processing steps of FIG. 18E, FIG. 19C, FIG. 20D, FIG. 21C, FIG. 22B, or FIG. 23C. The cylindrical gate electrodes 152 may, or may not, be present depending on the configuration for the drain-select-level electrically conductive layer 246.

Figure 25A:
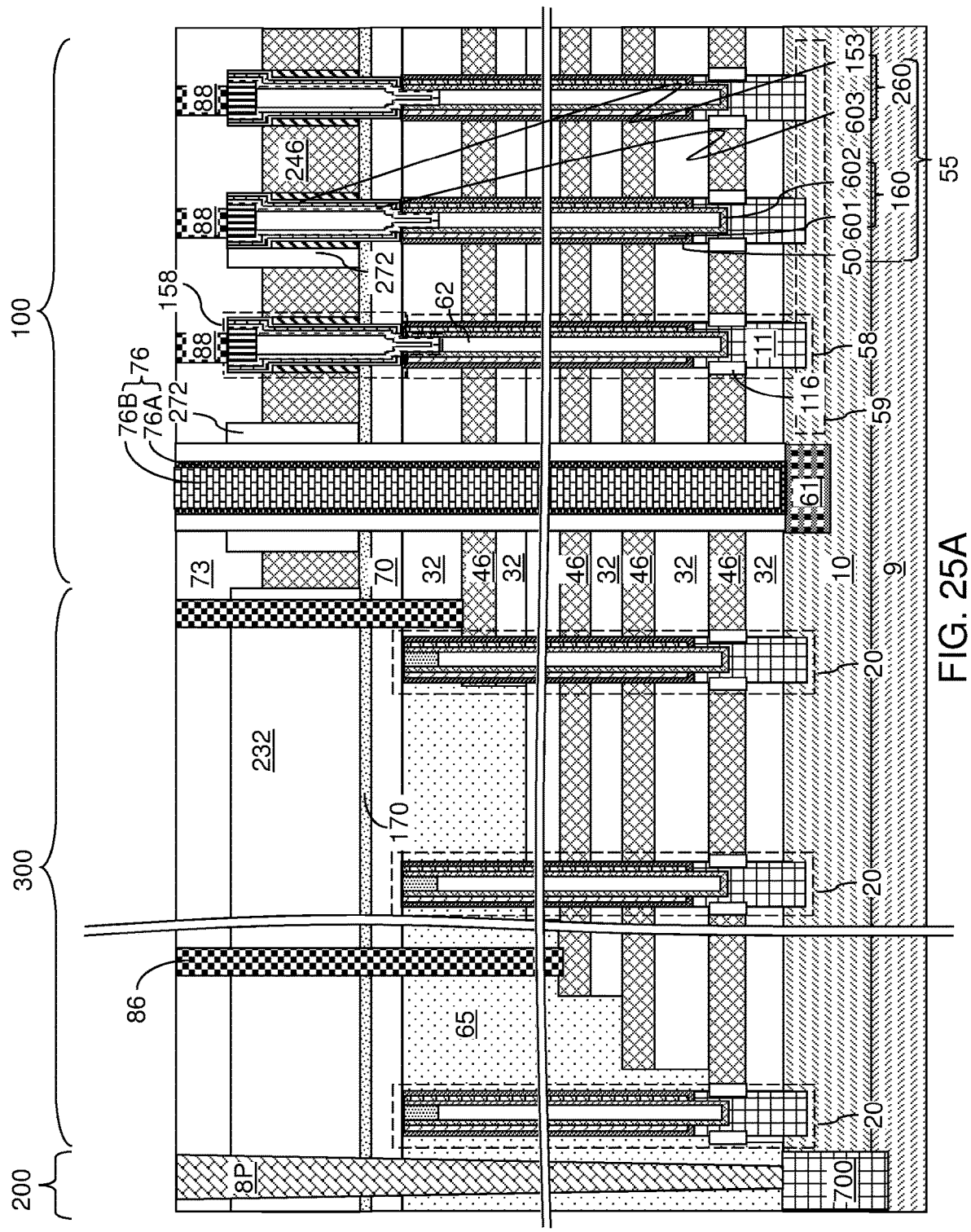
FIG. 25A is a schematic vertical cross-sectional view of the exemplary structure after formation of additional contact via structures according to an embodiment of the present disclosure.
Figure 25B:
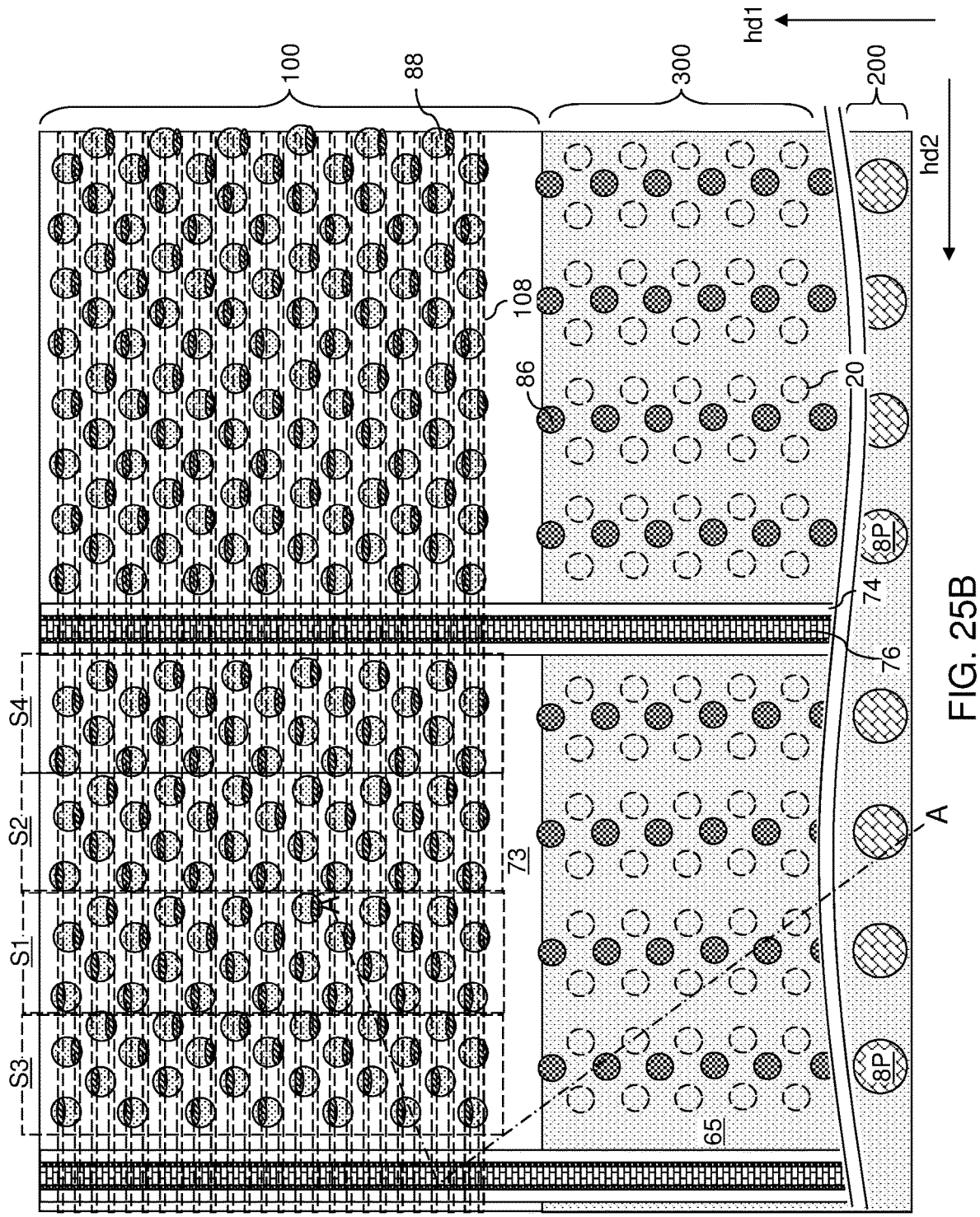
FIG. 25B is a top-down view of the exemplary structure of FIG. 25A. Interconnect via structures and bit lines that may be formed over the exemplary structure of FIG. 25A are schematically illustrated. The vertical plane A-A' is the plane of the schematic vertical cross-sectional view of FIG. 25A.

Referring to FIGS. 25A and 25B, additional contact via structures (88, 86, 8P) may be formed through the contact level dielectric layer 73, and optionally through the dielectric isolation layer 232, the etch stop dielectric layer 170, the insulating cap layer 70, and the retro-stepped dielectric material portion 65. For example, drain contact via structures 88 may be formed through the contact level dielectric layer 73 on each drain region 63. Word line contact via structures 86 may be formed on the word-line-level electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices. Each configuration for the drain-select-level electrically conductive layer 246 includes a metal layer (714, 716, 726, 736) formed by vertical growth or thermal migration of a metal, and as such, does not include any vertical seam or a void therein.

Multiple drain-select-level electrically conductive layers 246 may be provided between each neighboring pair of backside trenches 79 as strips (S1, S2, S3, S4) that laterally extend along the first horizontal direction hd1. Each drain-select-level electrically conductive layer 246 may be laterally bounded by the dielectric isolation layer 232 and the drain-select-level isolation structures 272. In other words, the dielectric isolation layer 232 and the drain-select-level isolation structures 272 may define the lateral extent of each drain-select-level electrically conductive layer 246. In contrast, the backside trenches 79 and the retro-stepped dielectric material portion 65 define the lateral extent of each word-line-level electrically conductive layer 46. Bit lines 108 laterally extending along the second horizontal direction hd2 may be formed over the drain contact via structures 88. Each bit line 108 may contact one drain contact via structure per each area occupied by a respective one of the drain-select-level electrically conductive layers 246. Thus, multiple vertical semiconductor channels 60 extending through different drain-select-level electrically conductive layers 246 may be connected to a same bit line 108. The drain-select-level electrically conductive layers 246 control which subset of memory pillar structures (58, 158) is activated for operation selected from the multiple groups memory pillar structures (58, 158) that pass through different drain-select-level electrically conductive layers 246.

Referring to all drawings and according to various embodiments of the present disclosure, a three-dimensional memory device is provided, which comprises: an alternating stack of insulating layers 32 and word-line-level electrically conductive layers 46 located over a substrate (9, 10); a drain-select-level electrically conductive layer 246 that overlies the alternating stack (32, 46); and memory pillar structures (58, 158) extending through the alternating stack (32, 46) and the drain-select-level electrically conductive layer 246 and comprising a vertical semiconductor channel 60 and a memory film 50 configured to store electrical charges at each level of the word-line-level electrically conductive layers 46, wherein the drain-select-level electrically conductive layer 246 comprises a metal layer (716, 714, 726, 736) that is free of void, is free of any vertically-extending seam, and consists a solid phase metal within an entire volume thereof.

In one embodiment, the drain-select-level electrically conductive layer 246 comprises: a metallic nitride liner (712, 724) including vertical portions that contact sidewalls of the memory pillar structures (58, 158) and a horizontal portion that is adjoined to bottom peripheries of the vertical portions, and a metal-nucleating material portion (which may comprise a planar metal-nucleating material layer 714 or as a planar metal-nucleating material layer 725) contacting a top surface of the horizontal portion of the metallic nitride liner (712, 724) and lower regions of the vertical portions of the metallic nitride liner (712, 724), wherein the metal layer (716, 726) contacts a top surface of the metal-nucleating material portion and upper regions of the vertical portions of the metallic nitride liner (712, 724). In one embodiment, the metal-nucleating material portion comprises cobalt, and the metal layer (716, 726) comprises a material selected from tungsten, molybdenum, and ruthenium.

In one embodiment, the three-dimensional memory device comprises an insulating cap layer 70 located between the alternating stack (32, 46) and the drain-select-level electrically conductive layer 246, wherein the metal-nucleating material portion (which may comprise a planar metal-nucleating material layer 714) is vertically spaced from the insulating cap layer 70 by a horizontal portion of the metallic nitride liner 712 that does not include any hole between the metal-nucleating material portion and the insulating cap layer 70.

In one embodiment, the three-dimensional memory device comprises a non-metallic liner 722 located between the alternating stack (32, 46) and the metal-nucleating material portion (which may comprise a planar metal-nucleating material layer 725), wherein the metallic nitride liner 724 includes a plurality of holes therethrough, and wherein the metal-nucleating material portion directly contacts a top surface of the non-metallic liner 722 through the plurality of holes.

In one embodiment, the three-dimensional memory device comprises a metal-nucleating material layer (which may comprise a metal-nucleating dielectric layer 771 or as a metal-semiconductor compound layer 774) located between the alternating stack (32, 46) and the metal layer 736, wherein the metal-nucleating material layer comprises a material selected from a semiconductor material and silicon nitride and directly contacts a bottom surface of the metal layer 736.

In one embodiment, the three-dimensional memory device comprises a metallic nitride liner (712, 724) including vertical portions that contact sidewalls of the memory pillar structures (58, 158) and a horizontal portion that is adjoined to bottom peripheries of the vertical portions, wherein the metal layer (714, 716, 726) contacts a top surface of the horizontal portion of the metallic nitride liner (712, 724) and sidewalls of the vertical portions of the metallic nitride liner (712, 724).

The various embodiments of the present disclosure provide drain-select-level electrically conductive layers 246 that are formed by vertical growth of a metal without lateral growth of the metal, or formed by thermal migration of the metal from a state that does not include any seam or any void therein. As a consequence, the metal layer (714, 716, 726, 736) of the present disclosure is free of any vertical seam or any void. The drain-select-level electrically conductive layers 246 of the present disclosure may provide lower resistance compared to prior art electrically conductive layers having a same composition and a same thickness due to absence of seams or voids therein, and may provide enhanced reliability through elimination of seams and voids.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming memory pillar structures extending through an alternating stack of insulating layers and word-line-level electrically conductive layers over a substrate, wherein each of the memory pillar structures comprises a vertical semiconductor channel and a memory film in contact with the vertical semiconductor channel, and wherein each of the memory pillar structures protrudes above an insulating cap layer located above the alternating stack to provide an inter-pillar gap region that laterally extends between laterally-neighboring pairs of the memory pillar structures;
    providing a metal-nucleating material having a physically exposed metal-nucleating surface at a bottom of the inter-pillar gap region without covering upper portions of sidewalls of the memory pillar structures with the metal-nucleating material; and
    selectively growing a metal upward from the physically exposed metal-nucleating surface while suppressing growth of the metal from physically exposed vertical surfaces around the memory pillar structures,
    wherein the metal-nucleating material having the physically exposed metal-nucleating surface is formed by:
    depositing a continuous layer of the metal-nucleating material at the bottom of the inter-pillar gap region, over sidewalls of the memory pillar structures, and over top surfaces of the memory pillar structures; and
    inducing thermal migration of the metal-nucleating material at an elevated temperature that is lower than a melting temperature of the metal-nucleating material, wherein the metal-nucleating material is removed from above the top surfaces of the memory pillar structures and a remaining portion of the metal-nucleating material forms a metal-nucleating material layer having a continuous top surface located below a horizontal plane including top surfaces of the memory pillar structures.

2. The method of claim 1, wherein the metal-nucleating material is not physically exposed over top surfaces of the memory pillar structures at a processing step of selectively growing the metal.

3. The method of claim 1, wherein:
    the metal-nucleating material comprises cobalt; and
    the metal comprises a material selected from tungsten, molybdenum or ruthenium.

4. The method of claim 1, further comprising:
    depositing a metallic nitride liner on a bottom surface of the inter-pillar gap region, on the sidewalls of the memory pillar structures, and on the top surfaces of the memory pillar structures, wherein the continuous layer of the metal-nucleating material is formed on the metallic nitride liner; and
    removing portions of the metallic nitride liner that protrude above a top surface of a metal layer formed by growth of the metal.

5. The method of claim 1, further comprising:
    forming a non-metallic liner on a bottom surface of the inter-pillar gap region without covering upper portions of sidewalls of the memory pillar structures;
    forming a metallic nitride liner on the non-metallic liner and on the sidewalls of the memory pillar structures, wherein the metallic nitride liner comprises a planar bottom portion having a first thickness and including holes therethrough and located over a bottom surface of the inter-pillar gap region; and selectively depositing the metal-nucleating material on physically exposed surfaces of the non-metallic liner without growth of the metal-nucleating material from surfaces of the metallic nitride liner.

6. The method of claim 5, wherein:
the metal-nucleating material comprises cobalt; and
the metal comprises a material selected from tungsten, molybdenum or ruthenium.

7. The method of claim 5, wherein:
the non-metallic liner is formed by an anisotropic deposition process of a non-metallic material and an isotropic etch back process of the non-metallic material, wherein non-metallic plates are formed over top surfaces of the memory pillar structures concurrently with formation of the non-metallic liner; and
the metallic nitride liner is formed by an anisotropic deposition process and comprises planar top portions without holes therethrough, having a second thickness greater than the first thickness, and overlying the non-metallic plates.

8. The method of claim 1, wherein:
the memory pillar structures are formed through the metal-nucleating material layer that overlies the alternating stack; and
the physically exposed metal-nucleating surface comprise a top surface of the metal-nucleating material layer that is physically exposed at a bottom of the inter-pillar gap region.

9. The method of claim 8, wherein:
the metal-nucleating material layer comprises a semiconductor material layer; and
the metal comprises a material selected from tungsten, cobalt, ruthenium, or molybdenum.

10. The method of claim 8, wherein:
the metal-nucleating material layer comprises a planar silicon nitride layer;
the method comprises providing semiconductor oxide surfaces on sidewalls and top surfaces of the memory pillar structures; and
the metal is grown from a top surface of the silicon nitride layer and does not grow from the semiconductor oxide surfaces.

11. A method of forming a three-dimensional memory device, comprising:
forming memory pillar structures extending through an alternating stack of insulating layers and word-line-level electrically conductive layers over a substrate, wherein each of the memory pillar structures comprises a vertical semiconductor channel and a memory film in contact with the vertical semiconductor channel, and wherein each of the memory pillar structures protrudes above an insulating cap layer located above the alternating stack to provide an inter-pillar gap region that laterally extends between laterally-neighboring pairs of the memory pillar structures;
conformally depositing a metal over a bottom surface and sidewalls of the inter-pillar gap region and above top surfaces of the memory pillar structures; and
forming a drain-select-level electrically conductive layer by inducing thermal migration of the metal at an elevated temperature that is lower than a melting temperature of the metal, wherein the metal is removed from above the top surfaces of the memory pillar structures, and thermally migrated portions of the metal fill a bottom portion of the inter-pillar gap region to provide a drain-select-level electrically conductive layer.

12. The method of claim 11, further comprising:
depositing a metallic nitride liner on the bottom surface of the inter-pillar gap region, on sidewalls of the memory pillar structures, and on the top surfaces of the memory pillar structures, wherein the metal is deposited as a continuous layer on the metallic nitride liner; and
removing portions of the metallic nitride liner that protrude above a top surface of a metal portion including the metal after the metal is thermally migrated, wherein the metal comprises cobalt.

13. A method of forming a three-dimensional memory device, comprising:
forming memory pillar structures extending through an alternating stack of insulating layers and word-line-level electrically conductive layers over a substrate, wherein each of the memory pillar structures comprises a vertical semiconductor channel and a memory film in contact with the vertical semiconductor channel, and wherein each of the memory pillar structures protrudes above an insulating cap layer located above the alternating stack to provide an inter-pillar gap region that laterally extends between laterally-neighboring pairs of the memory pillar structures;
providing a metal-nucleating material having a physically exposed metal-nucleating surface at a bottom of the inter-pillar gap region without covering upper portions of sidewalls of the memory pillar structures with the metal-nucleating material by forming a non-metallic liner on a bottom surface of the inter-pillar gap region without covering upper portions of sidewalls of the memory pillar structures, and by forming a metallic nitride liner on the non-metallic liner and on the sidewalls of the memory pillar structures, wherein the metallic nitride liner comprises a planar bottom portion having a first thickness and including holes therethrough and located over a bottom surface of the inter-pillar gap region; and
selectively growing a metal upward from the physically exposed metal-nucleating surface while suppressing growth of the metal from physically exposed vertical surfaces around the memory pillar structures by selectively depositing the metal-nucleating material on physically exposed surfaces of the non-metallic liner without growth of the metal-nucleating material from surfaces of the metallic nitride liner,
wherein the method further comprises at least one feature selected from:
a first feature that the metal-nucleating material comprises cobalt, and the metal comprises a material selected from tungsten, molybdenum or ruthenium; or
a second feature that:
the non-metallic liner is formed by an anisotropic deposition process of a non-metallic material and an isotropic etch back process of the non-metallic material, wherein non-metallic plates are formed over top surfaces of the memory pillar structures concurrently with formation of the non-metallic liner; and
the metallic nitride liner is formed by an anisotropic deposition process and comprises planar top portions without holes therethrough, having a second thickness greater than the first thickness, and overlying the non-metallic plates.

14. The method of claim 13, wherein the method comprises the first feature.

15. The method of claim 13, wherein the method comprises the second feature.

\* \* \* \* \*